US012772473B2

(12) United States Patent
Kubouchi et al.

(10) Patent No.: US 12,772,473 B2
(45) Date of Patent: Oct. 20, 2026

(54) SEMICONDUCTOR DEVICE AND METHOD OF MANUFACTURING THE SAME

(71) Applicant: FUJI ELECTRIC CO., LTD., Kawasaki (JP)

(72) Inventors: Motoyoshi Kubouchi, Matsumoto-city (JP); Makoto Shimosawa, Matsumoto-city (JP); Makoto Endou, Matsumoto-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 784 days.

(21) Appl. No.: 18/145,857

(22) Filed: Dec. 23, 2022

(65) Prior Publication Data

US 2023/0207674 A1 Jun. 29, 2023

(30) Foreign Application Priority Data

Dec. 27, 2021 (JP) ................................ 2021-212858

(51) Int. Cl.
*H10D 12/00* (2025.01)
*H10D 12/01* (2025.01)
(Continued)

(52) U.S. Cl.
CPC ......... *H10D 12/481* (2025.01); *H10D 12/032* (2025.01); *H10D 62/133* (2025.01); *H10D 62/393* (2025.01); *H10D 64/513* (2025.01)

(58) Field of Classification Search
CPC ............... H10D 12/481; H10D 12/032; H10D 12/038; H10D 64/117; H10D 64/2527; H10D 64/513; H10D 64/519; H10D 30/0297; H10D 30/668; H10D 30/0295; H10D 62/60; H10D 62/127; H10D 62/133;
(Continued)

(56) References Cited

U.S. PATENT DOCUMENTS

2008/0150018 A1 6/2008 Tanabe
2010/0013010 A1 1/2010 Akiyama
(Continued)

FOREIGN PATENT DOCUMENTS

JP 2008160039 A 7/2008
JP 2009135414 A 6/2009
(Continued)

*Primary Examiner* — Natalia A Gondarenko

(57) ABSTRACT

Provided is a semiconductor device including: a drift region of a first conductivity type provided in a semiconductor substrate; a base region of a second conductivity type provided above the drift region; an emitter region of a first conductivity type provided above the base region; a second conductivity type region provided above the drift region; a plurality of trench portions extending in a predetermined extending direction; and an interlayer dielectric film provided above the semiconductor substrate and includes a first contact hole portion and second contact hole portion, in which the second conductivity type region and the emitter region are provided alternately in the extending direction, the first contact hole portion is provided alternately with the second contact hole portion in the extending direction, and a lower end of the first contact hole portion is provided at a different depth from a lower end of the second contact hole portion.

24 Claims, 41 Drawing Sheets

(51) Int. Cl.

| | |
|---|---|
| ***H10D 62/13*** | (2025.01) |
| ***H10D 62/17*** | (2025.01) |
| ***H10D 64/27*** | (2025.01) |

(58) Field of Classification Search

CPC .. H10D 62/157; H10D 62/393; H10D 12/031; H10D 12/411; H10D 12/421; H10D 12/441; H10D 12/461; H10D 64/20; H10D 64/231; H10D 64/251; H10D 64/252; H10D 64/512; H10D 62/10; H10D 62/117; H10D 62/126; H10D 62/106; H10D 62/112; H10D 62/142; H10D 62/129; H10D 62/137; H10D 62/145; H10D 62/149; H10D 62/154; H10D 62/155; H10D 62/177; H10D 62/292; H10D 84/0123; H10D 84/0126; H10D 84/101; H10D 84/135; H10D 84/141; H10D 84/143; H10D 84/144; H10D 84/146; H10D 84/148; H10D 84/161; H10D 84/406; H10D 84/613; H10D 84/8312; H10D 89/601; H10D 89/611

USPC ........ 257/139, 140, 335, 337, 324, 343, 288

See application file for complete search history.

(56) References Cited

U.S. PATENT DOCUMENTS

| | | | | |
|---|---|---|---|---|
| 2011/0059586 | A1* | 3/2011 | Akiyama | H10D 30/0297 438/270 |
| 2012/0214281 | A1 | 8/2012 | Tomita | |
| 2013/0069146 | A1 | 3/2013 | Okumura | |
| 2013/0200451 | A1* | 8/2013 | Yilmaz | H10D 62/153 438/270 |
| 2014/0231828 | A1 | 8/2014 | Horikawa | |
| 2015/0372090 | A1 | 12/2015 | Oosawa | |
| 2016/0190123 | A1 | 6/2016 | Laven | |
| 2016/0204097 | A1 | 7/2016 | Laven | |
| 2017/0141216 | A1 | 5/2017 | Abe | |
| 2018/0366548 | A1 | 12/2018 | Naito | |
| 2019/0312105 | A1* | 10/2019 | Sakurai | H10D 12/481 |
| 2019/0348510 | A1* | 11/2019 | Yilmaz | H10D 62/393 |
| 2020/0287005 | A1* | 9/2020 | Imagawa | H10D 30/60 |
| 2021/0226041 | A1* | 7/2021 | Yilmaz | H10D 12/461 |
| 2021/0234027 | A1* | 7/2021 | Yoshida | H10D 64/232 |
| 2022/0020876 | A1 | 1/2022 | Mauder | |

FOREIGN PATENT DOCUMENTS

| | | | | |
|---|---|---|---|---|
| JP | 2010027719 | A | 2/2010 | |
| JP | 2010147380 | A | 7/2010 | |
| JP | 2010147381 | A | 7/2010 | |
| JP | 2012059873 | A | 3/2012 | |
| JP | 2012174989 | A | 9/2012 | |
| JP | 2013065724 | A | 4/2013 | |
| JP | 2014158013 | A | 8/2014 | |
| JP | 2014212358 | A | 11/2014 | |
| JP | 2016012581 | A | 1/2016 | |
| JP | 2016146470 | A | 8/2016 | |
| JP | 2016154218 | A | 8/2016 | |
| JP | 2021012995 | A | 2/2021 | |
| WO | 2014041808 | A1 | 3/2014 | |
| WO | 2016125490 | A1 | 8/2016 | |
| WO | 2018052099 | A1 | 3/2018 | |
| WO | WO-2020213254 | A1 * | 10/2020 | H10D 12/038 |

* cited by examiner

SEMICONDUCTOR DEVICE AND METHOD OF MANUFACTURING THE SAME

The contents of the following Japanese patent application(s) are incorporated herein by reference:

NO. 2021-212858 filed in JP on Dec. 27, 2021

BACKGROUND

1. Technical Field

The present invention relates to a semiconductor device and a method of manufacturing the same.

2. Related Art

In Patent Document 1, a semiconductor device including an N type emitter region and a P type contact region in a semiconductor substrate is described.

PRIOR ART DOCUMENTS

Patent Documents

Patent Document 1: WO 2018/052099

Patent Document 2: Japanese Patent Application Publication No. 2013-065724

Patent Document 3: Japanese Patent Application Publication No. 2021-012995

Patent Document 4: U.S. Patent Application Publication No. 2022/0020876

A semiconductor device in which generation of latch-up is suppressed is preferable.

DESCRIPTION OF EXEMPLARY EMBODIMENTS

Figure 1A:
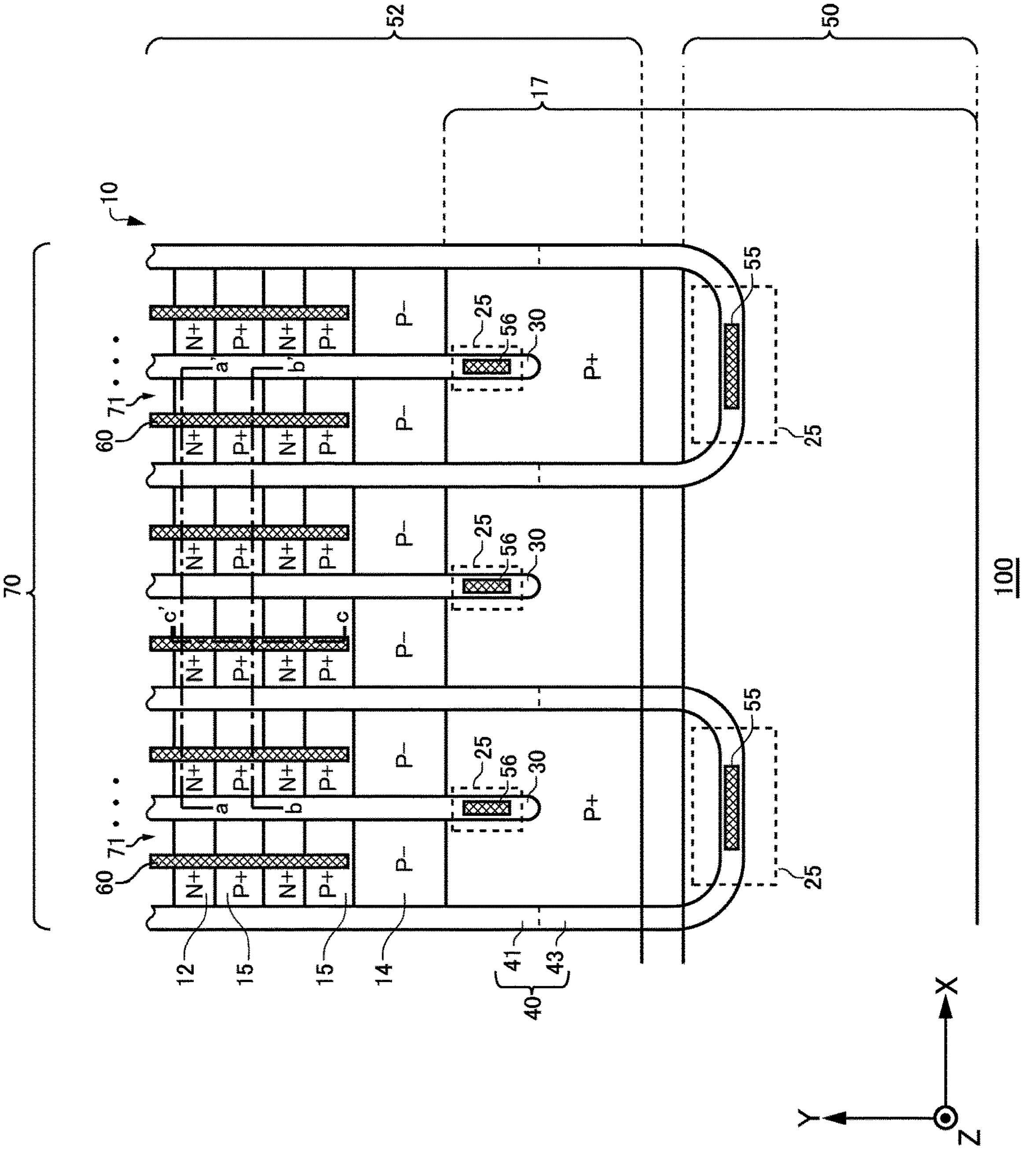
FIG. 1A shows an example of a top view of a semiconductor device 100.

Hereinafter, embodiments of the present invention will be described. The embodiments do not limit the invention according to the claims. In addition, not all of the combinations of features described in the embodiments are essential to the solution of the invention.

As used herein, one side in a direction parallel to a depth direction of a semiconductor substrate is referred to as “upper” and the other side is referred to as “lower”. One surface of two principal surfaces of a substrate, a layer, or other members is referred to as an upper surface, and the other surface is referred to as a lower surface. “Upper” and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. It is to be noted that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. In addition, the axis perpendicular to the upper surface and the lower surface of the semiconductor substrate is defined as the Z axis. In the present specification, the direction of the Z axis may be referred to as the depth direction. In addition, as used herein, a direction parallel to the upper surface and the lower surface of the semiconductor substrate, including the X axis and the Y axis, may be referred to as a horizontal direction.

In the present specification, a case where a term such as "same" or "equal" is mentioned may include a case where an error due to a variation in manufacturing or the like is included. The error is, for example, within 10%.

In the present specification, a conductivity type of a doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting a conductivity type of the P type.

In the present specification, a doping concentration means a concentration of the donor or a concentration of the acceptor in a thermal equilibrium state. In the present specification, a net doping concentration means a net concentration obtained by adding the donor concentration set to be a positive ion concentration to the acceptor concentration set to be a negative ion concentration, taking into account of polarities of charges. As an example, when the donor concentration is $N_D$ and the acceptor concentration is $N_A$, the net doping concentration at any position is given as $N_D$-$N_A$. In the present specification, the net doping concentration may be simply referred to as a doping concentration.

The donor has a function of supplying electrons to a semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons. In the present specification, the VOH defect may be referred to as a hydrogen donor.

In the present specification, a description of a P+ type or an N+ type means a higher doping concentration than that of the P type or the N type, and a description of a P− type or an N− type means a lower doping concentration than that of the P type or the N type. Further, in the present specification, a description of a P++ type or an N++ type means a higher doping concentration than that of the P+ type or the N+ type.

A chemical concentration in the present specification indicates an atomic density of an impurity measured regardless of an electrical activation state. The chemical concentration can be measured by, for example, secondary ion mass spectrometry (SIMS). The net doping concentration described above can be measured by voltage-capacitance profiling (CV profiling). In addition, a carrier concentration measured by spreading resistance profiling method (SRP method) may be set as the net doping concentration. The carrier concentration measured by the CV profiling or the SRP method may be a value in a thermal equilibrium state. In addition, in a region of the N type, the donor concentration is sufficiently higher than the acceptor concentration, and thus the carrier concentration of the region may be set as the donor concentration. Similarly, in a region of the P type, the carrier concentration of the region may be set to be the acceptor concentration. In the present specification, the doping concentration of the N type region may be referred to as the donor concentration, and the doping concentration of the P type region may be referred to as the acceptor concentration.

Further, when a concentration distribution of the donor, acceptor, or net doping has a peak in a region, the peak value may be set to be the concentration of the donor, acceptor, or net doping in the region. In a case where the concentration of the donor, acceptor, or net doping is substantially uniform in a region, or the like, an average value of the concentration of the donor, acceptor, or net doping in the region may be set to be the concentration of the donor, acceptor, or net doping.

The carrier concentration measured by the SRP method may be lower than the concentration of the donor or the acceptor. In a range where a current flows when a spreading resistance is measured, a carrier mobility of the semiconductor substrate may be lower than a value in a crystalline state. The reduction in the carrier mobility occurs when carriers are scattered due to disorder (disorder) of a crystal structure due to a lattice defect or the like.

The concentration of the donor or the acceptor calculated from the carrier concentration measured by the CV profiling or the SRP method may be lower than a chemical concentration of an element indicating the donor or the acceptor. As an example, in a silicon semiconductor, a donor concentration of phosphorus or arsenic serving as a donor, or an acceptor concentration of boron serving as an acceptor is approximately 99% of chemical concentrations of these. On the other hand, in the silicon semiconductor, a donor concentration of hydrogen serving as a donor is approximately 0.1% to 10% of a chemical concentration of hydrogen.

FIG. 1A shows an example of a top view of a semiconductor device 100. The semiconductor device 100 of the present example is a semiconductor chip that includes a transistor portion 70.

The transistor portion 70 is a region obtained by projecting a collector region 22 provided on a back surface side of a semiconductor substrate 10 onto an upper surface of the semiconductor substrate 10. The collector region 22 will be described later. The transistor portion 70 includes a transistor such as an IGBT. In the present example, the transistor portion 70 is an IGBT. It is to be noted that the transistor portion 70 may be other transistors such as a MOSFET.

FIG. 1A shows a surrounding region of a chip end portion on an edge side of the semiconductor device 100, and other regions are omitted. For example, an edge termination structure portion may be provided in a region on a negative side of the Y axis direction in the semiconductor device 100 of the present example. The edge termination structure portion relaxes an electric field strength on the upper surface side of the semiconductor substrate 10. The edge termination structure portion includes, for example, a guard ring, a field plate, or a RESURF, and a combined structure thereof. It is to be noted that although the present example describes the edge on the negative side of the Y axis direction for convenience, the same applies to other edges of the semiconductor device 100.

The semiconductor substrate 10 is a substrate that is formed of a semiconductor material. The semiconductor substrate 10 may be a silicon substrate, a silicon carbide substrate, a nitride semiconductor substrate such as a gallium nitride semiconductor substrate, or the like. The semiconductor substrate 10 of the present example is a silicon substrate. It is to be noted that when referred to as a top view in the present specification, it means that the upper surface side of the semiconductor substrate 10 is viewed from above.

The semiconductor device 100 of the present example includes, on the front surface 21 of the semiconductor substrate 10, a gate trench portion 40, a dummy trench portion 30, an emitter region 12, a base region 14, a contact region 15, and a well region 17. The front surface 21 will be described later. The semiconductor device 100 may include a second conductivity type region, and the second conductivity type region may be the base region 14 or the contact region 15. In the semiconductor device 100 of the present example, the second conductivity type region is the contact region. In addition, the semiconductor device 100 of the present example includes an emitter electrode 52 and a gate metal layer 50 provided above the front surface 21 of the semiconductor substrate 10.

The emitter electrode 52 is provided above the gate trench portion 40, the dummy trench portion 30, the emitter region 12, the base region 14, the contact region 15, and the well region 17. In addition, the gate metal layer 50 is provided above the gate trench portion 40 and the well region 17.

The emitter electrode 52 and the gate metal layer 50 are formed of a material including metal. At least a partial region of the emitter electrode 52 may be formed of metal such as aluminum (Al) or a metal alloy such as an aluminum-silicon alloy (AlSi) and an aluminum-silicon-copper alloy (AlSiCu). At least a partial region of the gate metal layer 50 may be formed of metal such as aluminum (Al) or a metal alloy such as an aluminum-silicon alloy (AlSi) and an aluminum-silicon-copper alloy (AlSiCu). The emitter electrode 52 and the gate metal layer 50 may include a barrier metal formed of titanium, a titanium compound, and the like under the region formed of aluminum and the like. The emitter electrode 52 and the gate metal layer 50 are provided separately from each other.

The emitter electrode 52 and the gate metal layer 50 are provided above the semiconductor substrate 10 with an interlayer dielectric film 38 interposed therebetween. The interlayer dielectric film 38 is omitted in FIG. 1A. The interlayer dielectric film 38 is provided with contact holes 55, contact holes 56, and contact holes 60 penetrating therethrough.

The contact hole 55 connects the gate metal layer 50 and the gate conductive portion in the transistor portion 70. A plug metal layer formed of tungsten or the like may be formed inside the contact hole 55.

The contact hole 56 connects the emitter electrode 52 and a dummy conductive portion in the dummy trench portion 30. A plug metal layer formed of tungsten or the like may be formed inside the contact hole 56.

A connection portion 25 electrically connects a front surface side electrode such as the emitter electrode 52 or the gate metal layer 50 to the semiconductor substrate 10. In one example, the connection portion 25 is provided between the gate metal layer 50 and the gate conductive portion. The connection portion 25 is also provided between the emitter electrode 52 and the dummy conductive portion. The connection portion 25 is formed of a conductive material such as polysilicon doped with impurities. The connection portion 25 of the present example is polysilicon doped with an N type impurity (N+). The connection portion 25 is provided above the front surface 21 of the semiconductor substrate 10 via a dielectric film such as an oxide film, or the like.

The gate trench portions 40 are an example of a plurality of trench portions extending in a predetermined extending direction on the front surface 21 side of the semiconductor substrate 10. The gate trench portions 40 are arrayed at predetermined intervals along a predetermined array direction (the X axis direction in the present example). The gate trench portion 40 of the present example may include: two extending portions 41 extending along an extending direction (the Y axis direction in the present example) which is parallel to the front surface 21 of the semiconductor substrate 10 and is perpendicular to the array direction; and a connecting portion 43 which connects the two extending portions 41.

Preferably, at least a part of the connecting portion 43 is formed in a curved shape. By connecting end portions of the two extending portions 41 of the gate trench portion 40, an electric field strength at the end portions of the extending portions 41 can be relaxed. At the connecting portion 43 of the gate trench portion 40, the gate metal layer 50 may be connected to the gate conductive portion.

The dummy trench portions 30 are an example of the plurality of trench portions extending in the predetermined extending direction on the front surface 21 side of the semiconductor substrate 10. The dummy trench portion 30 is a trench portion that is electrically connected to the emitter electrode 52. Similar to the gate trench portions 40, the dummy trench portions 30 are arrayed at predetermined intervals along a predetermined array direction (the X axis direction in the present example). Although the dummy trench portion 30 of the present example has an I shape on the front surface 21 of the semiconductor substrate 10, it may have a U shape on the front surface 21 of the semiconductor substrate 10 similar to the gate trench portion 40. That is, the dummy trench portion 30 may include two extending portions extending along the extending direction and a connecting portion which connects the two extending portions.

The transistor portion 70 of the present example has a structure in which two gate trench portions 40 and two dummy trench portions 30 are arrayed repetitively. That is, the transistor portion 70 of the present example includes the gate trench portions 40 and the dummy trench portions 30 at a ratio of 1:1. For example, the transistor portion 70 includes one dummy trench portion 30 between two extending portions 41.

It is to be noted that the ratio between the gate trench portions 40 and the dummy trench portions 30 is not limited to the present example. The ratio between the gate trench portions 40 and the dummy trench portions 30 may be 2:3 or may be 2:4. Alternatively, with all trench portions being the gate trench portions 40, the transistor portion 70 does not need to include the dummy trench portion 30.

The well region 17 is a region of a second conductivity type, which is provided closer to the front surface 21 of the semiconductor substrate 10 than the drift region 18 to be described later. The well region 17 is an example of a well region provided on the edge side of the semiconductor device 100. As an example, the well region 17 is of the P+ type. The well region 17 is formed within a predetermined range from an end portion of an active region on a side on which the gate metal layer 50 is provided. The well region 17 may have a diffusion depth larger than the depths of the gate trench portion 40 and the dummy trench portion 30. Partial regions of the gate trench portion 40 and the dummy trench portion 30 on the gate metal layer 50 side are formed in the well region 17. Bottoms of ends of the gate trench portion 40 and the dummy trench portion 30 in the extending direction may be covered by the well region 17.

The contact hole 60 is formed above each region of the emitter region 12 and the contact region 15 in the transistor portion 70. The contact hole 60 is not provided above the well regions 17 provided at both ends in the Y axis direction. In this manner, one or more contact holes 60 are formed in the interlayer dielectric film. The one or more contact holes 60 may be provided so as to extend in the extending direction.

A mesa portion 71 is a mesa portion provided in direct contact with the trench portion in a plane parallel to the front surface 21 of the semiconductor substrate 10. The mesa portion is a portion of the semiconductor substrate 10 sandwiched between two trench portions adjacent to each other, and may be a portion ranging from the front surface 21 of the semiconductor substrate 10 to a depth of a lowermost bottom portion of each trench portion. The extending portions of each trench portion may be set to be one trench portion. That is, the region sandwiched between two extending portions may be set to be a mesa portion.

The mesa portion 71 is provided in direct contact with at least one of the dummy trench portion 30 or the gate trench portion 40 in the transistor portion 70. The mesa portion 71 includes the well region 17, the emitter region 12, the base region 14, and the contact region 15 on the front surface 21 of the semiconductor substrate 10. In the mesa portion 71, the emitter region 12 and the contact region 15 are provided alternately in the extending direction.

The base region 14 is a region of a second conductivity type, which is provided on the front surface 21 side of the semiconductor substrate 10. As an example, the base region 14 is of the P− type. The base region 14 may be provided at both end portions of the mesa portion 71 in the Y axis direction on the front surface 21 of the semiconductor substrate 10. It is to be noted that FIG. 1A shows only one end portion of the base region 14 in the Y axis direction.

The emitter region 12 is a region of a first conductivity type, which has a higher doping concentration than the drift region 18. As an example, the emitter region 12 of the present example is of the N+ type. An example of a dopant of the emitter region 12 is arsenic (As). The emitter region 12 is provided in contact with the gate trench portion 40 on the front surface 21 of the mesa portion 71. The emitter region 12 may be provided so as to extend from one of the two trench portions sandwiching the mesa portion 71 to the other one of the trench portions in the X axis direction. The emitter region 12 is also provided below the contact hole 60.

In addition, the emitter region 12 may or may not be in contact with the dummy trench portion 30. The emitter region 12 of the present example is in contact with the dummy trench portion 30.

The contact region 15 is a region of a second conductivity type, which is provided above the base region 14 and has a higher doping concentration than the base region 14. As an example, the contact region 15 of the present example is of the P+ type. The contact region 15 of the present example is provided on the front surface 21 of the mesa portion 71. The contact region 15 may be provided from one of the two trench portions sandwiching the mesa portion 71 to the other one of the trench portions in the X axis direction. The contact region 15 may or may not be in contact with the gate trench portion 40 or the dummy trench portion 30. The contact region 15 of the present example is in contact with the dummy trench portion 30 and the gate trench portion 40. The contact region 15 is also provided below the contact hole 60.

Figure 1B:
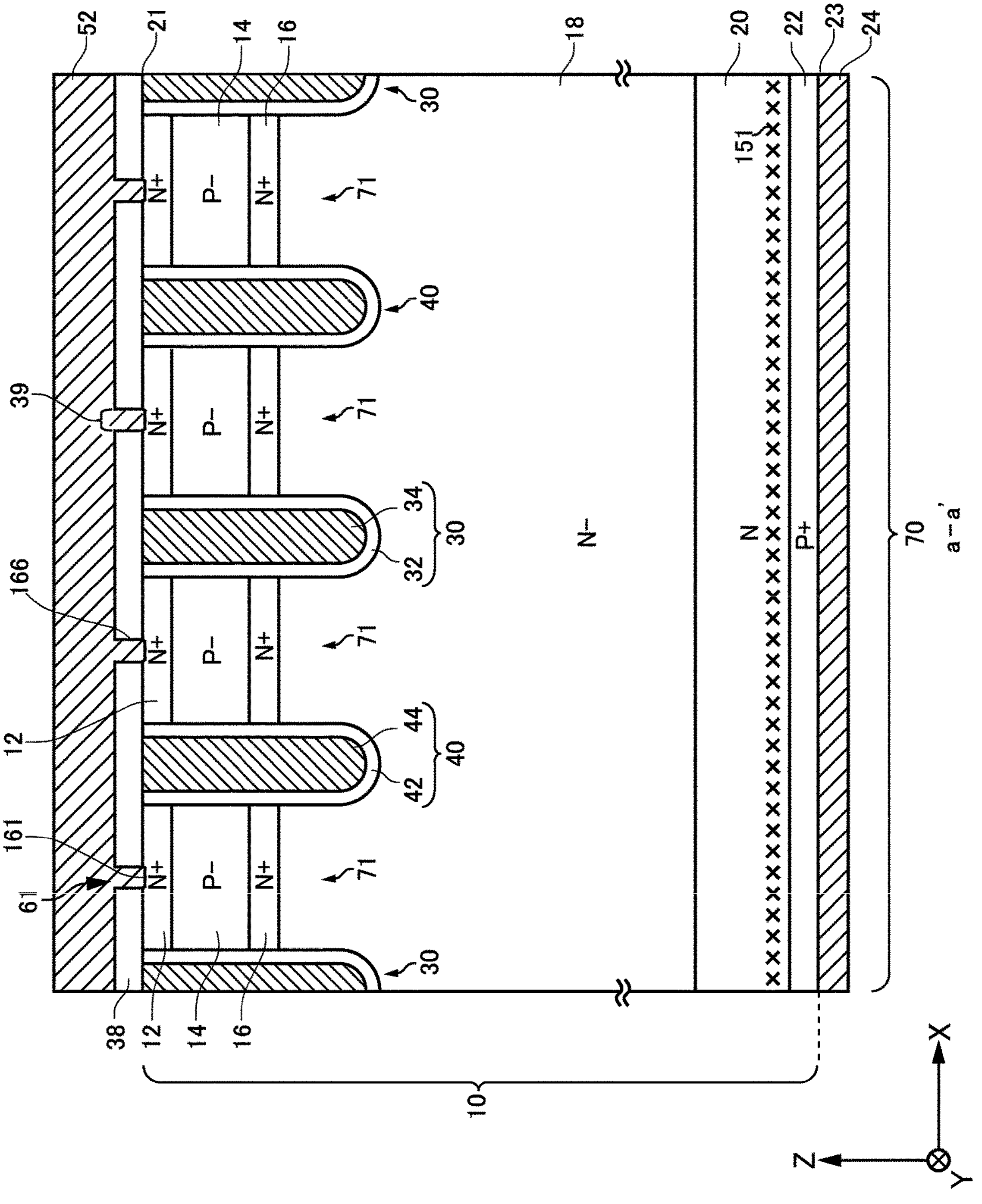
FIG. 1B shows an example of a cross section a-a' in FIG. 1A.

FIG. 1B shows an example of a cross section a-a' in FIG. 1A. The cross section a-a' is an XZ plane that passes through the emitter regions 12 in the transistor portion 70. In the cross section a-a', the semiconductor device 100 of the present example includes the semiconductor substrate 10, the interlayer dielectric film 38, the emitter electrode 52, and the collector electrode 24. The emitter electrode 52 is formed above the semiconductor substrate 10 and the interlayer dielectric film 38.

The drift region 18 is a region of the first conductivity type, which is provided in the semiconductor substrate 10. As an example, the drift region 18 of the present example is of the N-type. The drift region 18 may be a region that has remained without other doping regions being formed in the semiconductor substrate 10. That is, the doping concentration of the drift region 18 may be a doping concentration of the semiconductor substrate 10.

The buffer region 20 is a region of the first conductivity type, which is provided closer to the back surface 23 of the semiconductor substrate 10 than the drift region 18. As an example, the buffer region 20 of the present example is of the N type. The doping concentration of the buffer region 20 is higher than the doping concentration of the drift region 18. The buffer region 20 may function as a field stop layer which prevents a depletion layer extending from the lower surface side of the base regions 14 from reaching the collector region 22 of the second conductivity type.

The collector region 22 is provided below the buffer region 20 in the transistor portion 70. The collector region 22 is of the second conductivity type. As an example, the collector region 22 of the present example is of the P+ type.

The collector electrode 24 is formed on the back surface 23 of the semiconductor substrate 10. The collector electrode 24 is formed of a conductive material such as metal.

The base region 14 is a region of the second conductivity type, which is provided above the drift region 18. The base region 14 is provided in contact with gate trench portion 40. The base region 14 may be provided in contact with the dummy trench portion 30.

The emitter region 12 is provided above the base region 14. The emitter region 12 is provided between the base region 14 and the front surface 21. The emitter region 12 is provided in contact with the gate trench portion 40. The emitter region 12 may or may not be in contact with the dummy trench portion 30.

An accumulation region 16 is a region of the first conductivity type, which is provided closer to the front surface 21 of the semiconductor substrate 10 than the drift region 18. As an example, the accumulation region 16 of the present example is of the N+ type. It is to be noted that the accumulation region 16 does not need to be provided.

In addition, the accumulation region 16 is provided in contact with the gate trench portion 40. The accumulation region 16 may or may not be in contact with the dummy trench portion 30. The doping concentration of the accumulation region 16 is higher than the doping concentration of the drift region 18. An ion implantation dosage amount of the accumulation region 16 may be 1.0 E12 $cm^{-2}$ or more and 1.0 E13 $cm^{-2}$ or less. Alternatively, the ion implantation dosage amount of the accumulation region 16 may be 3.0 E12 $cm^{-2}$ or more and 6.0 E12 $cm^{-2}$ or less. By providing the accumulation region 16, a carrier injection enhancement effect (IE effect) can be enhanced to reduce an ON voltage of the transistor portion 70. It is to be noted that E means a power of 10, and 1.0 E12 $cm^{-2}$ means, for example, $1.0\times 10^{12}$ $cm^{-2}$.

One or more gate trench portions 40 and one or more dummy trench portions 30 are provided on the front surface 21. Each trench portion is provided from the front surface 21 to the drift region 18. In the region where at least any of the emitter region 12, the base region 14, the contact region 15, or the accumulation region 16 is provided, each trench portion also penetrates through these regions to reach the drift region 18. The configuration of the trench portion penetrating through the doping region is not limited to the one manufactured in the order of forming the doping region and then forming the trench portion. The configuration of the trench portion penetrating through the doping region also includes a configuration of the doping region being formed between the trench portions after forming the trench portions.

The gate trench portion 40 includes a gate trench, a gate dielectric film 42, and a gate conductive portion 44 formed on the front surface 21. The gate dielectric film 42 is formed to cover an inner wall of the gate trench. The gate dielectric film 42 may be formed by oxidizing or nitriding the semiconductor in the inner wall of the gate trench. The gate conductive portion 44 is formed on an inner side of the gate dielectric film 42 inside the gate trench. The gate dielectric film 42 insulates the gate conductive portion 44 from the semiconductor substrate 10. The gate conductive portion 44 is formed of a conductive material such as polysilicon. The gate trench portion 40 is covered by the interlayer dielectric film 38 on the front surface 21.

The gate conductive portion 44 includes a region opposing the adjacent base region 14 on the mesa portion 71 side with the gate dielectric film 42 being interposed therebetween, in the depth direction of the semiconductor substrate 10. When a predetermined voltage is applied to the gate conductive portion 44, a channel is formed by an electron inversion layer on a surface layer of the base region 14 at a boundary in contact with the gate trench.

The dummy trench portion 30 may have the same structure as the gate trench portion 40. The dummy trench portion 30 includes a dummy trench, a dummy dielectric film 32, and a dummy conductive portion 34 formed on the front surface 21 side. The dummy dielectric film 32 is formed to cover an inner wall of the dummy trench. The dummy conductive portion 34 is formed inside the dummy trench and formed on an inner side of the dummy dielectric film 32. The dummy dielectric film 32 insulates the dummy conductive portion 34 from the semiconductor substrate 10. The dummy trench portion 30 is covered by the interlayer dielectric film 38 on the front surface 21.

The interlayer dielectric film 38 is provided above the semiconductor substrate 10. The interlayer dielectric film 38 of the present example is provided in contact with the front surface 21. The emitter electrode 52 is provided above the interlayer dielectric film 38. In the interlayer dielectric film 38, one or more contact holes 60 for electrically connecting the emitter electrode 52 and the semiconductor substrate 10 are provided. That is, the interlayer dielectric film 38 includes opening portions 39. The contact hole 55 and the contact hole 56 may similarly be provided so as to penetrate through the interlayer dielectric film 38. The interlayer dielectric film 38 may be a BPSG (Boro-phospho Silicate Glass) film, may be a BSG (borosilicate glass) film, may be a PSG (Phosphosilicate glass) film, may be an HTO film, or may be a film obtained by stacking these materials. A thickness of the interlayer dielectric film 38 is, for example, 1.0 μm, but is not limited to this.

A first contact hole portion 61 is an example of the contact hole 60 provided in the interlayer dielectric film 38. The first contact hole portion 61 is provided above the emitter region 12. The emitter region 12 below the first contact hole portion 61 may have a dip 161 on a front surface thereof. The first contact hole portion 61 will be described later.

A first lifetime control region 151 may be formed in the transistor portion 70. The first lifetime control region 151 is a region where a lifetime killer has intentionally been formed by implanting an impurity inside the semiconductor substrate 10, or the like. As an example, the first lifetime control region 151 is formed by implanting helium into the semiconductor substrate 10. By providing the first lifetime control region 151, a turn-off time can be reduced, and by suppressing a tail current, losses during switching can be reduced.

The lifetime killer is a recombination center of carriers. The lifetime killer may be a lattice defect. For example, the lifetime killer may be a vacancy, a divacancy, a complex defect of these with elements configuring the semiconductor substrate 10, or dislocation. Further, the lifetime killer may be a noble gas element such as helium and neon, a metal element such as platinum, or the like. An electron beam may be used for forming the lattice defect.

A lifetime killer concentration is a concentration at the recombination center of carriers. The lifetime killer concentration may be a concentration of the lattice defect. For example, the lifetime killer concentration may be a vacancy concentration of a vacancy, a divacancy, or the like, may be a complex defect concentration of these vacancies with elements configuring the semiconductor substrate 10, or may be a dislocation concentration. Alternatively, the lifetime killer concentration may be a chemical concentration of the noble gas element such as helium and neon, or may be a chemical concentration of the metal element such as platinum.

The first lifetime control region 151 is provided closer to the back surface 23 than a center of the semiconductor substrate 10 in the depth direction of the semiconductor substrate 10. The first lifetime control region 151 of the present example is provided in the buffer region 20. The first lifetime control region 151 of the present example is provided on an entire surface of the semiconductor substrate 10 in the XY plane, and can be formed without using a mask. The first lifetime control region 151 may be provided in a part of the semiconductor substrate 10 in the XY plane. An impurity dosage amount for forming the first lifetime control region 151 may be 0.5 E10 $cm^{-2}$ or more and 1.0 E13 $cm^{-2}$ or less, or may be 5.0 E10 $cm^{-2}$ or more and 5.0 E11 $cm^{-2}$ or less.

In addition, the first lifetime control region 151 of the present example is formed by the implantation from the back surface 23 side. Accordingly, an effect on the front surface 21 side of the semiconductor device 100 can be avoided. For example, the first lifetime control region 151 is formed by irradiating helium from the back surface 23 side. Herein, which of the front surface 21 side and the back surface 23 side the implantation is performed from for forming the first lifetime control region 151 can be determined by acquiring a state of the front surface 21 side by an SRP method or a measurement of a leakage current.

Figure 1C:
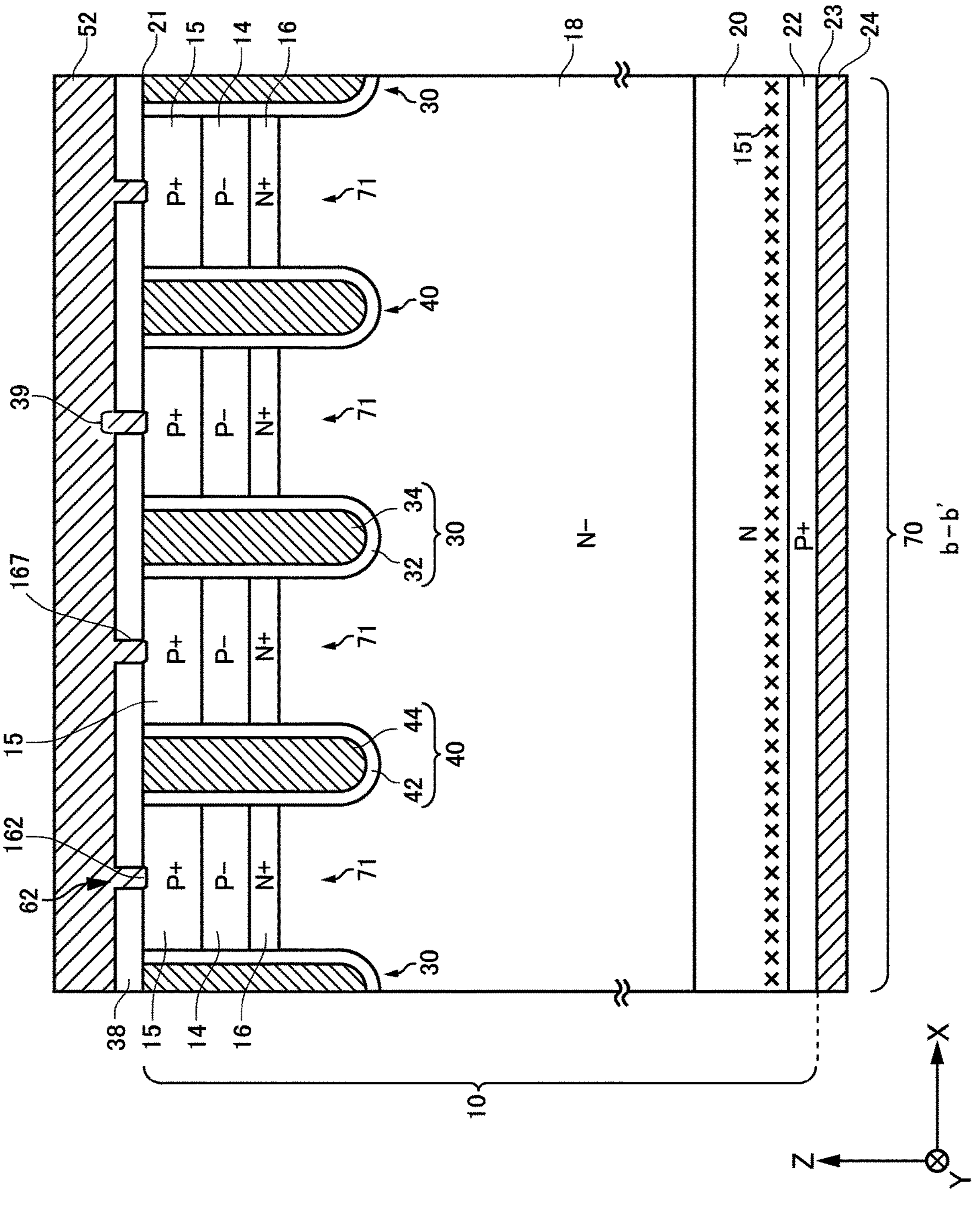
FIG. 1C shows an example of a cross section b-b' in FIG. 1A.

FIG. 1C shows an example of a cross section b-b' in FIG. 1A. The cross section b-b' is the XZ plane that passes through the contact regions 15 in the transistor portion 70.

A second contact hole portion 62 is an example of the contact hole 60 provided in the interlayer dielectric film 38. The second contact hole portion 62 is provided above the contact region 15. The contact region 15 below the second contact hole portion 62 may have a dip 162 on a front surface thereof. A depth position of a bottom surface of the dip 162 may be deeper than a depth position of a bottom surface of the dip 161. The second contact hole portion 62 will be described later.

Figure 1D:
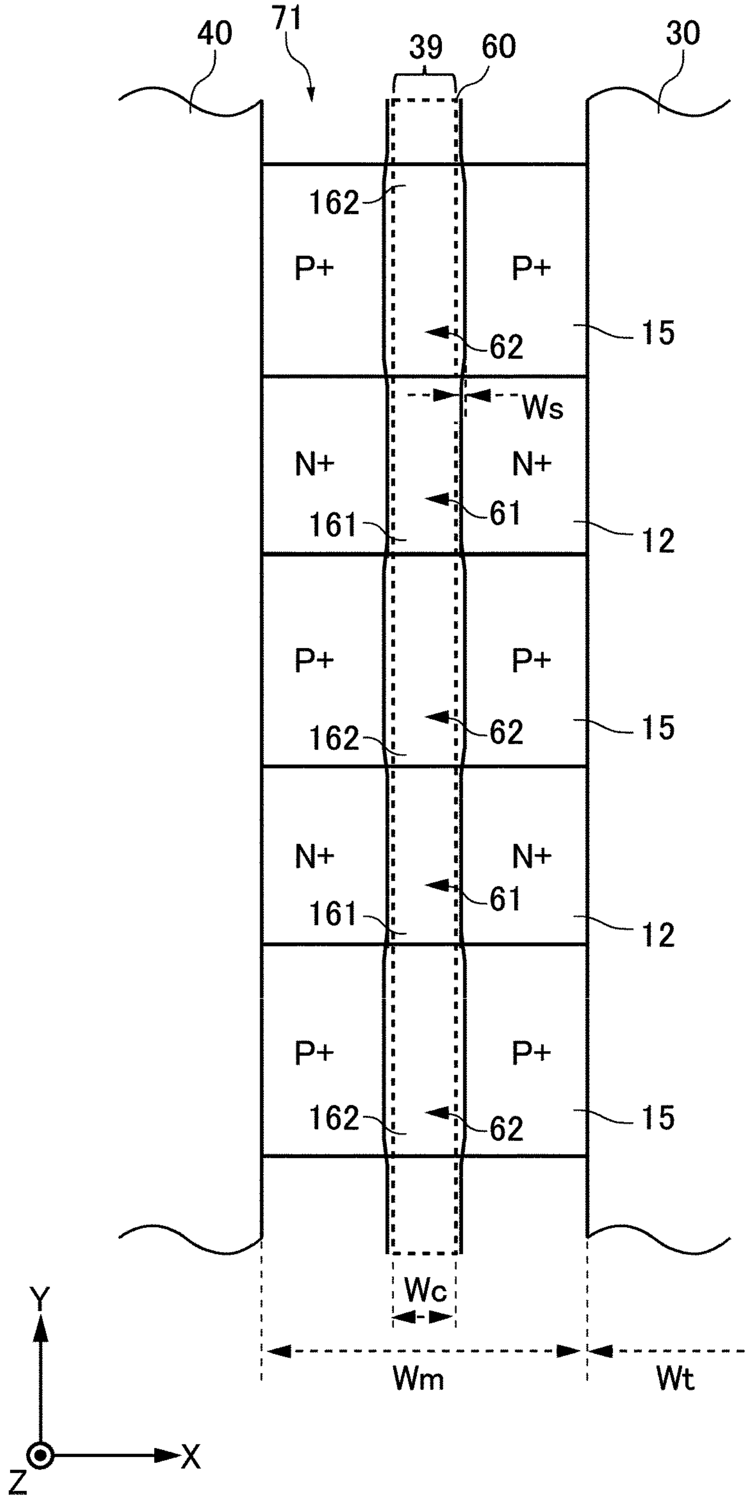
FIG. 1D shows an enlarged diagram of a front surface 21 of the semiconductor device 100 shown in FIG. 1A.

FIG. 1D shows an enlarged diagram of the front surface 21 of the semiconductor device 100 shown in FIG. 1A. The present figure shows the front surface 21 of the mesa portion 71 between the dummy trench portion 30 and the gate trench portion 40. The contact hole 60 includes the first contact hole portions 61 and the second contact hole portions 62. The broken lines of the contact hole 60 indicate side walls of the interlayer dielectric film 38 in the contact hole 60 at a portion higher than the front surface 21. That is, the broken lines of the contact hole 60 indicate the opening portion 39 of the interlayer dielectric film 38. The opening portion 39 of the interlayer dielectric film 38 may have a constant width irrespective of the emitter regions 12 and the contact regions 15 formed on a base (the front surface of the semiconductor substrate 10). The solid lines of the contact hole 60 indicate side walls of the semiconductor substrate 10 formed with the dip 161 or the dip 162, the dip 161 or the dip 162 having been formed on the front surface of the semiconductor substrate 10 at a portion lower than the front surface 21. That is, the dip 161 or the dip 162 dented downwardly from the front surface of the semiconductor substrate 10 exposed in the opening portion 39 of the interlayer dielectric film 38 may also be included in the contact hole 60.

The first contact hole portion 61 and the second contact hole portion 62 are an example of the contact hole 60 provided in the interlayer dielectric film 38. The first contact hole portion 61 and the second contact hole portion 62 of the present example are provided in the same contact hole 60. That is, the first contact hole portion 61 and the second contact hole portion 62 may be coupled to each other to configure one contact hole 60.

The first contact hole portion 61 may be provided alternately with the second contact hole portion 62 in the extending direction. The first contact hole portion 61 and the second contact hole portion 62 may be provided such that, in the extending direction, the first contact hole portion 61 is provided at a position corresponding to the emitter region 12 and the second contact hole portion 62 is provided at a position corresponding to the contact region 15.

The first contact hole portion 61 being provided at a position corresponding to the emitter region 12 means that, for example, the emitter region 12 and the first contact hole portion 61 in the mesa portion 71 are provided at equal positions in the extending direction. Alternatively, the first contact hole portion 61 being provided at a position corresponding to the emitter region 12 may mean that the first contact hole portion 61 is provided above the emitter region 12. Alternatively, the first contact hole portion 61 being provided at a position corresponding to the emitter region 12 may mean that the emitter region 12 is provided below the first contact hole portion 61. Further, the first contact hole portion 61 being provided at a position corresponding to the emitter region 12 may mean that a portion of the interlayer dielectric film 38 in contact with the first contact hole portion 61, that is, an edge portion 166 between the interlayer dielectric film 38 and the first contact hole portion 61, is provided above the emitter region 12 or is in contact with the emitter region 12.

The second contact hole portion 62 being provided at a position corresponding to the contact region 15 means that, for example, the contact region 15 and the second contact hole portion 62 in the mesa portion 71 are provided at equal positions in the extending direction. Alternatively, the second contact hole portion 62 being provided at a position corresponding to the contact region 15 may mean that the second contact hole portion 62 is provided above the contact region 15. Alternatively, the second contact hole portion 62 being provided at a position corresponding to the contact region 15 may mean that the contact region 15 is provided below the second contact hole portion 62. Further, the second contact hole portion 62 being provided at a position corresponding to the contact region 15 may mean that a portion of the interlayer dielectric film 38 in contact with the second contact hole portion 62, that is, an edge portion 167 between the interlayer dielectric film 38 and the second contact hole portion 62, is provided above the contact region 15 or is in contact with the contact region 15.

The first contact hole portion 61 has the dip 161 at least a part of which is formed by etching of the emitter region 12. For example, a lower end of the first contact hole portion 61 is formed by the etching of the emitter region 12. The first contact hole portion 61 of the present example is provided in contact with the emitter region 12. The first contact hole portion 61 of the present example is provided so as to be sandwiched between the emitter regions 12 in the array direction in a top view.

The second contact hole portion 62 has the dip 162 at least a part of which is formed by etching of the contact region 15. For example, a lower end of the second contact hole portion 62 is formed by the etching of the contact region 15. The second contact hole portion 62 of the present example is provided in contact with the contact region 15. The second contact hole portion 62 of the present example is provided between the contact regions 15 in the array direction in a top view.

Herein, a difference between an etching rate of the emitter region 12 and an etching rate of the contact region 15 may cause a difference in the shapes of the first contact hole portion 61 and the second contact hole portion 62. For example, when the etching rate of the contact region 15 is higher than the etching rate of the emitter region 12, the width of the first contact hole portion 61 in the array direction becomes smaller than the width of the second contact hole portion 62 in the array direction. In addition, when the etching rate of the contact region 15 is higher than the etching rate of the emitter region 12, a depth position of a lower end of the dip 161 of the first contact hole portion 61 becomes shallower than a depth position of a lower end of the dip 162 of the second contact hole portion 62. Accordingly, in the contact hole 60, bumps and dips corresponding to the first contact hole portion 61 and the second contact hole portion 62 are provided on the side walls at portions lower than the front surface 21.

It is to be noted that at a portion higher than the front surface 21, no difference in the etching rate of the interlayer dielectric film 38 is caused between the first contact hole portion 61 and the second contact hole portion 62. Therefore, at a portion higher than the front surface 21, bumps and dips are not provided on the side walls of the contact hole 60, and a shape that is flat along the extending direction (for example, in a top view, linear side walls connecting the broken lines of the first contact hole portions 61 and the broken lines of the second contact hole portions 62) is formed.

A width Wm is a width of the mesa portion 71 in the array direction. The width Wm may be 0.5 μm or more and 1.5 μm or less. For example, the width Wm is 0.8 μm.

A width Wt is a width of the trench portion in the array direction. The width Wt may be the same for the dummy trench portion 30 and the gate trench portion 40, or may be different. The width Wt may be 0.6 μm or more and 2.0 μm or less. For example, the width Wt is 1.1 μm.

The width We is a width of the contact hole 60 in the array direction. The width We is a width of the opening portion 39 provided in the interlayer dielectric film 38 above the front surface 21. The width Wc may be 0.1 μm or more and 0.6 μm or less. For example, the width We is 0.35 μm. The width Wc may be 20% or more or 30% or more of the width Wm. The width We may be 70% or less or 60% or less of the width Wm.

A width Ws indicates a size of a step between the side walls of the first contact hole portion 61 and the second contact hole portion 62. That is, the width Ws indicates a difference between the side wall of the first contact hole portion 61 and the side wall of the second contact hole portion 62 on the front surface 21 in the array direction. The width Ws may be 0.01 μm or more and 0.04 μm or less. The width Ws of the present example is 0.02 μm. The width Ws may be 0.1% or more and 10% or less of the width Wc, or may be 1% or more and 5% or less.

Figure 1E:
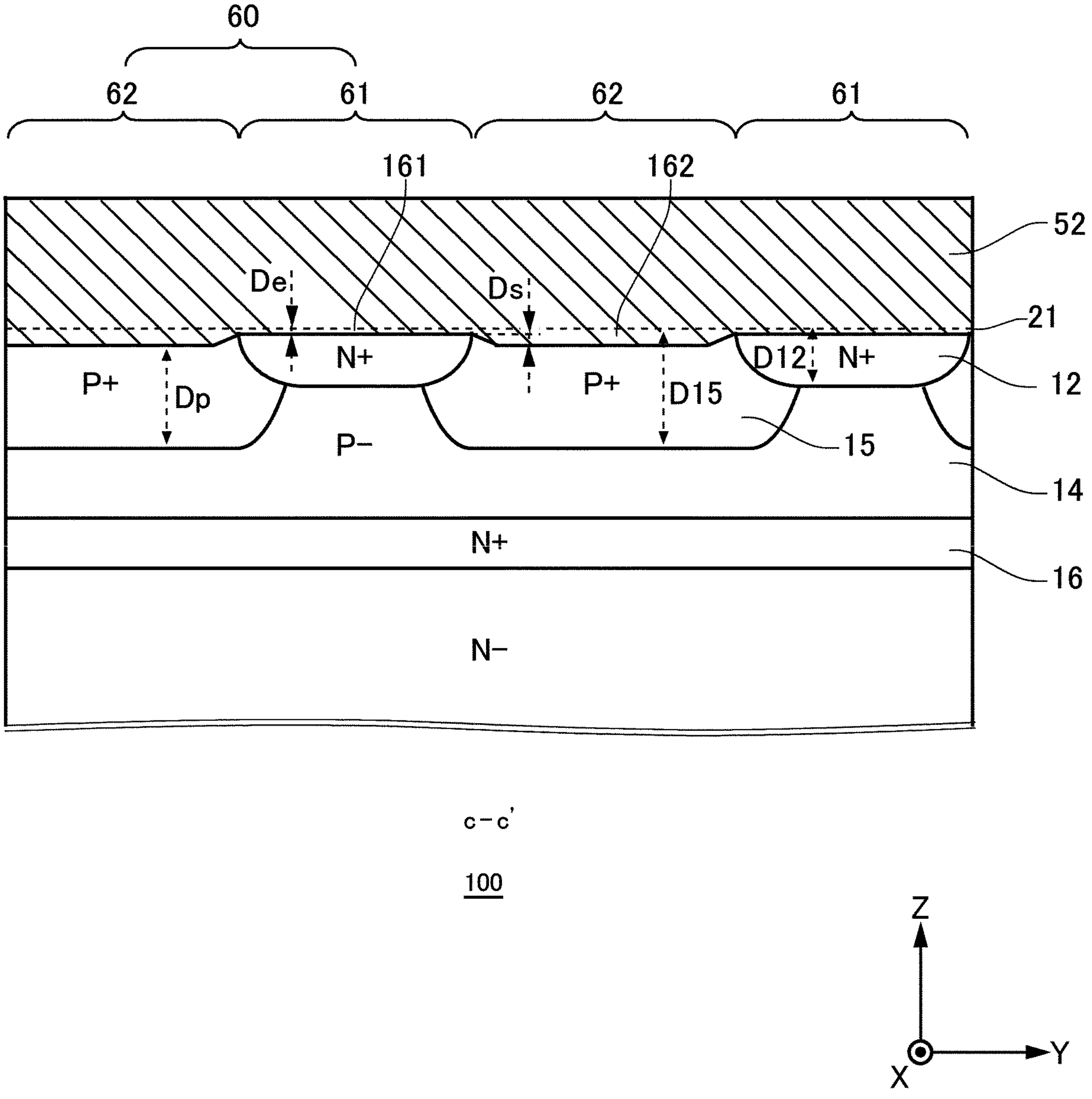
FIG. 1E shows an example of a cross section c-c' in FIG. 1A.

FIG. 1E shows an example of a cross section c-c' in FIG. 1A. The cross section c-c' is the YZ plane that passes through the contact hole 60 in the transistor portion 70.

The lower end of the first contact hole portion 61 is provided at a different depth from the lower end of the second contact hole portion 62. That is, a lower end of a metal layer filled in the first contact hole portion 61 is provided at a different depth from a lower end of a metal layer filled in the second contact hole portion 62. The lower end of the first contact hole portion 61 is shallower than the lower end of the second contact hole portion 62. The metal layers filled in the first contact hole portion 61 and the second contact hole portion 62 may be formed of a metal material forming the emitter electrode 52 described above, or may be a plug metal layer formed of tungsten, titanium, a titanium alloy, titanium silicide, or the like.

In this manner, the lower end of the second contact hole portion 62 may be formed to be deeper than the lower end of the first contact hole portion 61 by over-etching when opening the interlayer dielectric film 38. Further, the emitter region 12 at the lower end of the first contact hole portion 61 may be etched by the over-etching when opening the interlayer dielectric film 38. An upper end of the emitter region 12 after the etching may be the same as the front surface 21, or the upper end of the emitter region 12 may be deeper than the front surface 21. In the present example, the upper end of the emitter region 12 is deeper than the front surface 21, and the dip 162 is formed.

A thickness Ds in the depth direction indicates a difference between the lower end of the first contact hole portion 61 and the lower end of the second contact hole portion 62. The thickness Ds in the depth direction indicates a size of a step caused by the difference in the etching rates between the emitter region 12 and the contact region 15. The thickness Ds in the depth direction may vary depending on the depth of the contact hole 60. The thickness Ds in the depth direction may be larger than the width Ws as a step in the array direction.

The thickness Ds in the depth direction may be 0.01 μm or more or 0.03 μm or more. The thickness Ds in the depth direction may be 0.08 μm or less or 0.06 μm or less. For example, the thickness Ds in the depth direction is 0.03 μm.

A thickness De in the depth direction indicates a thickness from the front surface 21 to the upper end of the emitter region 12 in the depth direction. The thickness De in the depth direction is a depth of the dip 161 from the front surface 21. The thickness De in the depth direction may be 0.005 μm or more or 0.01 μm or more. The thickness De in the depth direction may be 0.05 μm or less or 0.03 μm or less. For example, the thickness De in the depth direction is 0.01 μm.

A thickness D12 in the depth direction indicates a thickness from the front surface 21 to the lower end of the emitter region 12 in the depth direction. The thickness D12 in the depth direction may be 0.1 μm or more and 1.0 μm or less, or may be 0.2 μm or more and 0.6 μm or less. For example, the thickness D12 in the depth direction is 0.3 μm.

A thickness D15 in the depth direction indicates a thickness from the front surface 21 to the lower end of the contact region 15 in the depth direction. The thickness D15 in the depth direction may be 0.5 μm or more and 1.5 μm or less. For example, the thickness D15 in the depth direction is 1.0 μm.

A thickness Dp in the depth direction indicates a thickness from the lower end of the second contact hole portion 62 to the lower end of the contact region 15 in the depth direction. The thickness Dp in the depth direction according to the present example indicates a thickness of the contact region 15 below the second contact hole portion 62. By setting the thickness Dp in the depth direction small, extraction of holes becomes easy. The thickness Dp in the depth direction may be 0.1 μm or more and 1.2 μm or less, or may be 0.3 μm or more and 1.0 μm or less. For example, the thickness Dp in the depth direction is 0.6 μm.

Since there is a step between the first contact hole portion 61 and the second contact hole portion 62 in the semiconductor device 100 of the present example, a distance for holes to be extracted to the emitter electrode 52 through the contact region 15 can be shortened. Accordingly, extraction of holes to the emitter electrode 52 is improved, and latch-up is likely to be suppressed.

Figure 2A:
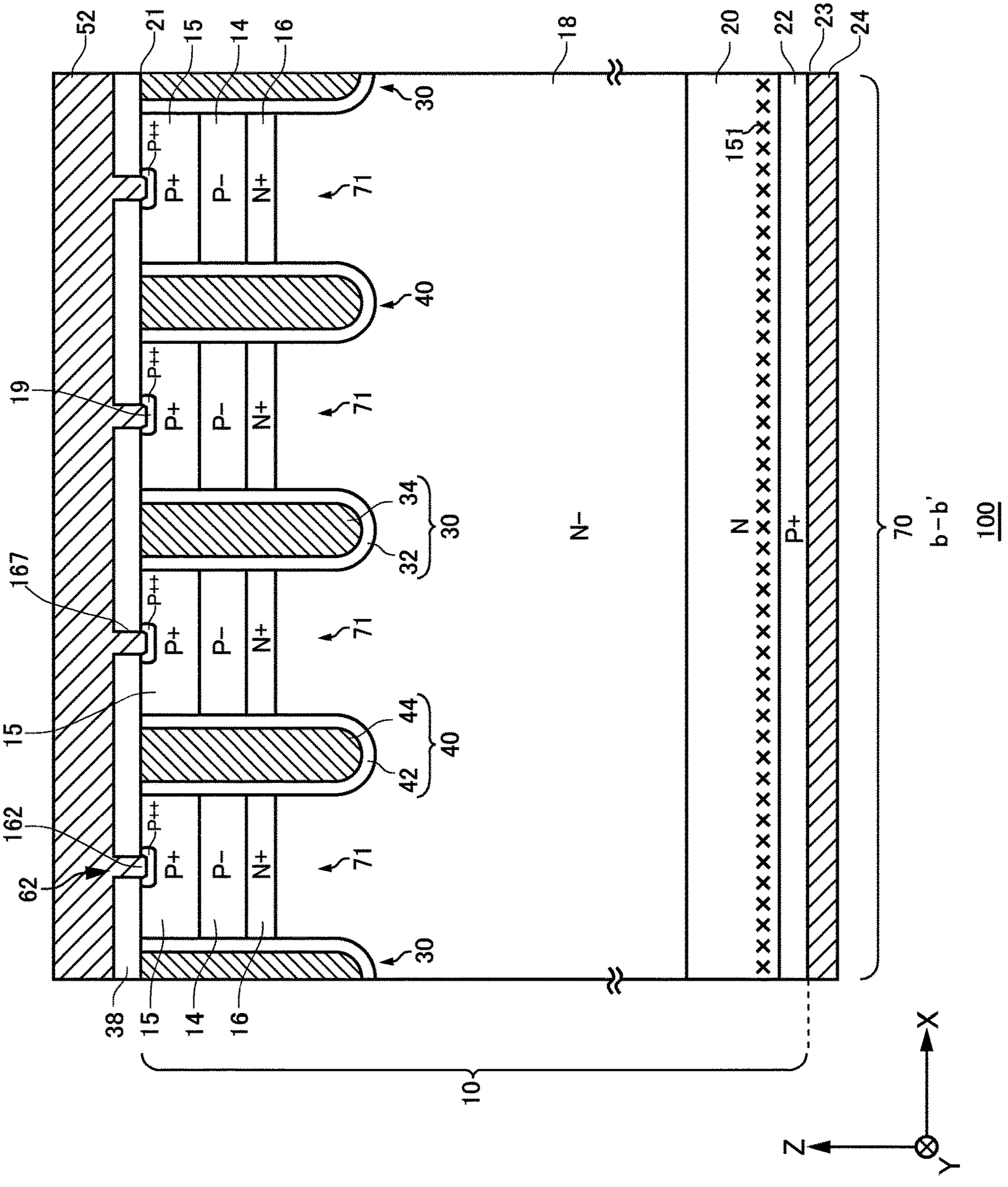
FIG. 2A shows a modified example of the cross section b-b' in FIG. 1A.

FIG. 2A shows a modified example of the cross section b-b' in FIG. 1A. FIG. 2A differs from FIG. 1C in that a plug contact region 19 is formed so as to cover the dip 162. The plug contact region 19 is a region of the second conductivity type, which has a higher doping concentration than the base region 14 and the contact region 15.

Figure 2B:
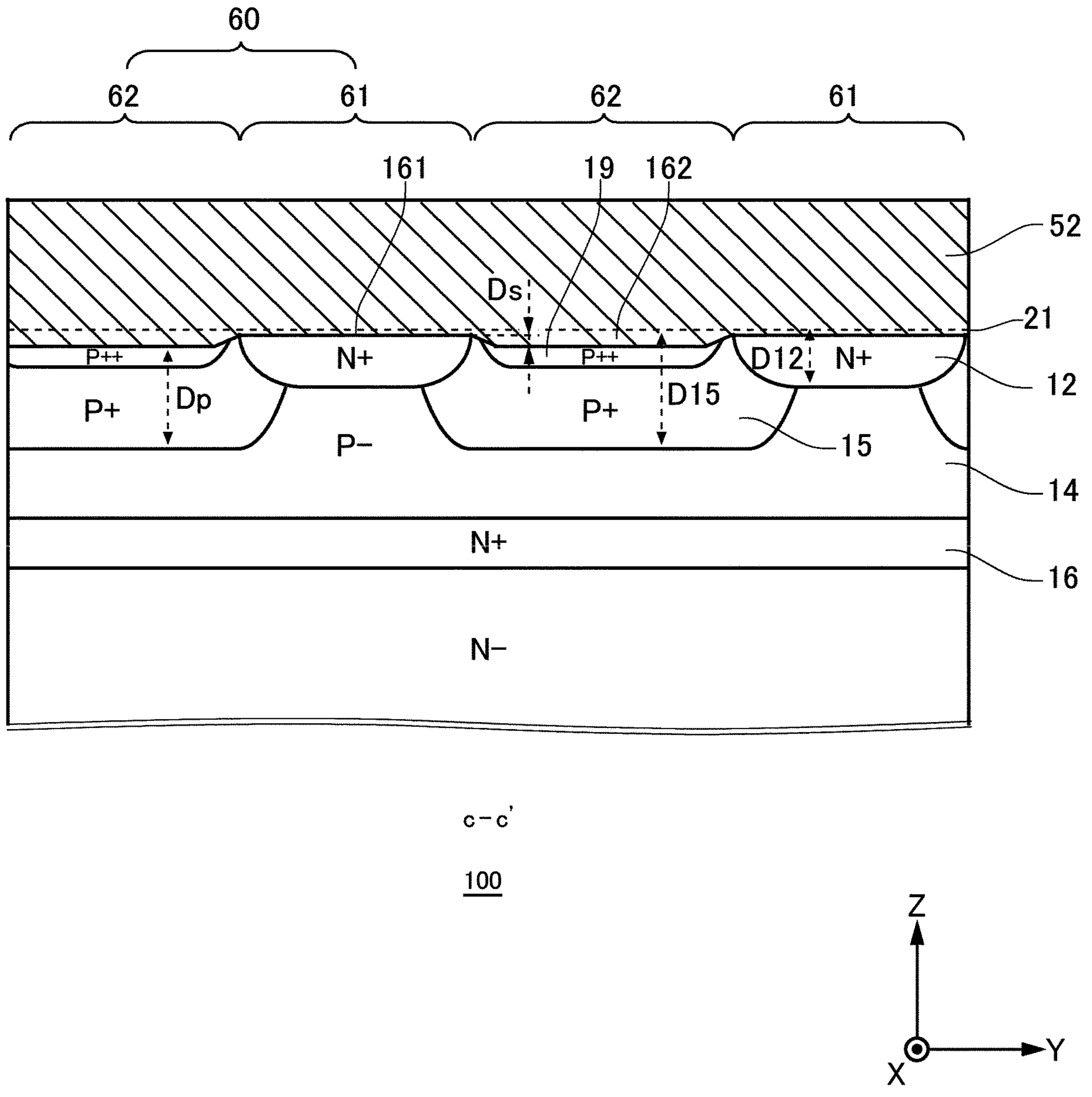
FIG. 2B shows a modified example of the cross section c-c' in FIG. 1A.

FIG. 2B shows a modified example of the cross section c-c' in FIG. 1A. FIG. 2B differs from FIG. 1E in that the plug contact region 19 is provided on a front surface of the contact region 15. The plug contact region 19 is a region of the second conductivity type, which has a higher doping concentration than the base region 14 and the contact region 15. The plug contact region 19 of the present example is provided below the second contact hole portion 62. The plug contact region 19 does not need to be provided below the first contact hole portion 61.

Figure 3A:
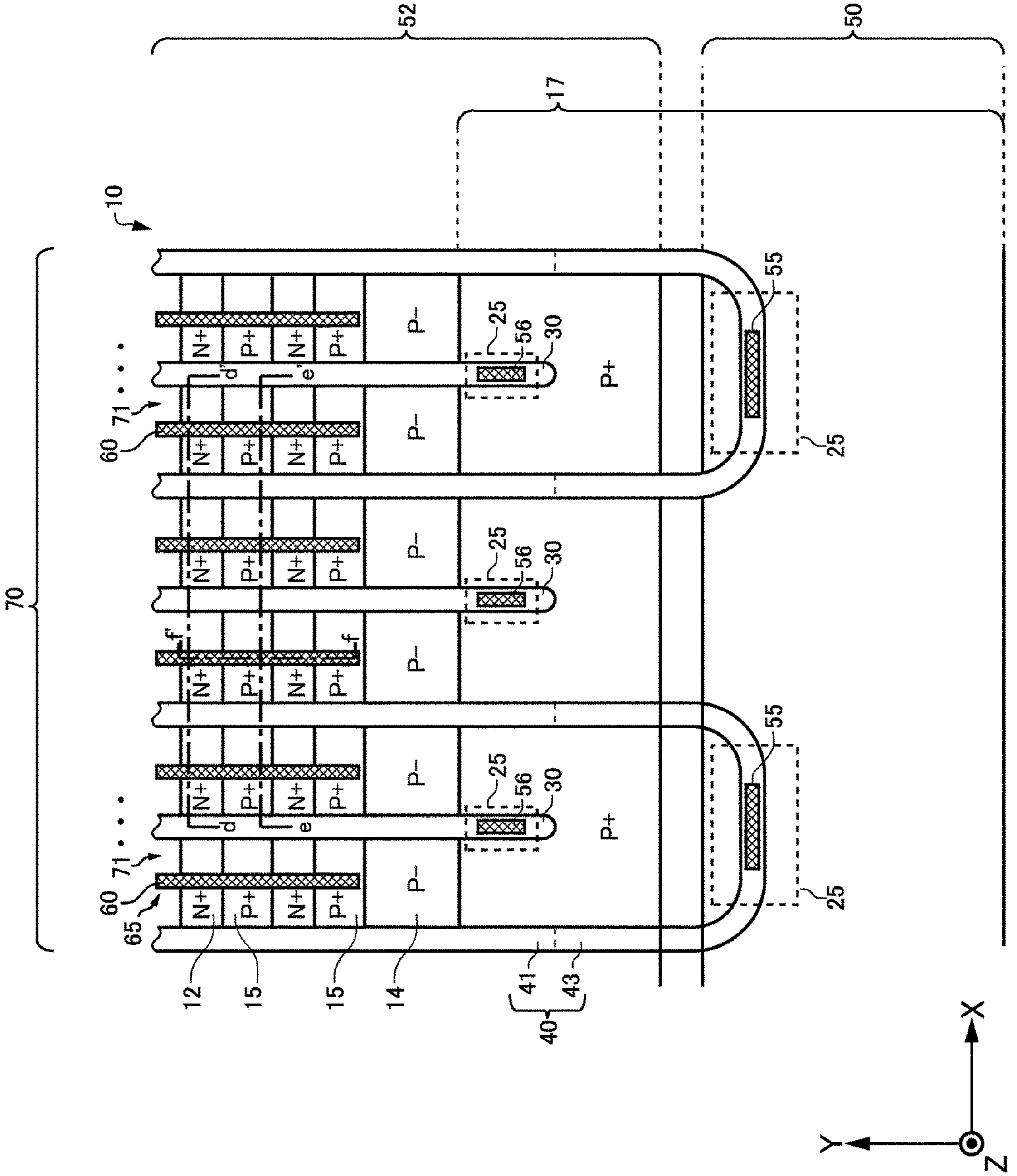
FIG. 3A shows a top view of a modified example of the semiconductor device 100.

FIG. 3A shows a top view of a modified example of the semiconductor device 100. The semiconductor device 100 of the present example differs from that of the example shown in FIG. 1A in the point of including a trench contact portion 65.

The trench contact portion 65 is provided between two adjacent trench portions out of the plurality of trench portions on the front surface 21 side of the semiconductor substrate 10. The trench contact portion 65 of the present example is provided so as to extend in the extending direction. The trench contact portion 65 includes the contact hole 60 and the metal layer filled inside the contact hole 60. The same material as the emitter electrode 52 may be filled inside the contact hole 60, or a different material from the emitter electrode 52 may be filled therein.

Figure 3B:
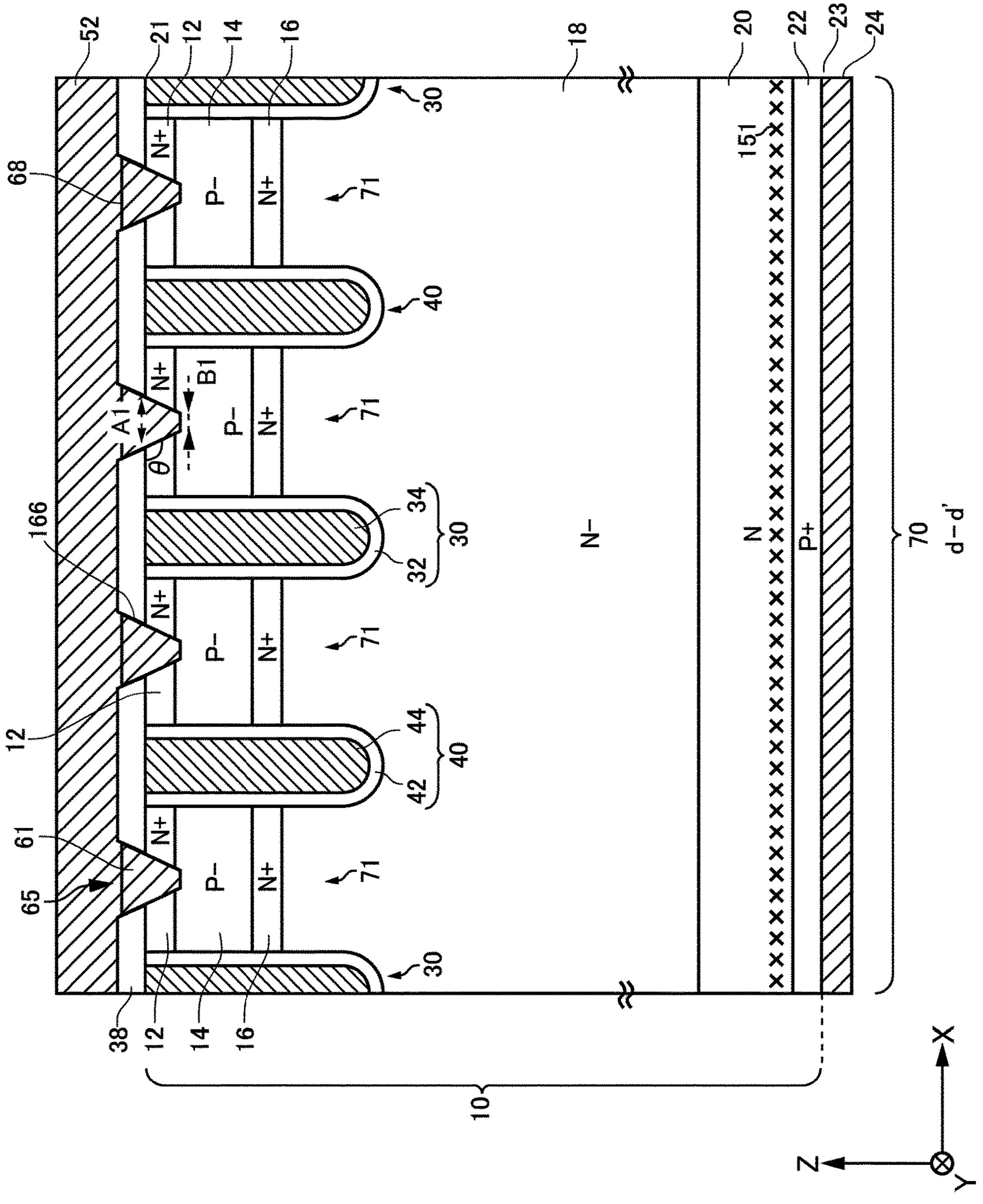
FIG. 3B shows an example of a cross section d-d' in FIG. 3A.

FIG. 3B shows an example of a cross section d-d' in FIG. 3A. The cross section d-d' is the XZ plane that passes through the emitter regions 12 in the transistor portion 70. The trench contact portion 65 of the present example is a groove provided in the semiconductor substrate 10 exposed in the contact hole 60, and is a groove that is deeper than the dips described with reference to FIGS. 1A to 1E. Specifically, a depth of a bottom surface of the trench contact portion 65 may be 0.05 μm or more or 0.2 μm or more from the front surface 21 of the semiconductor substrate 10. The groove of the trench contact portion 65 may have side walls perpendicular to the front surface 21 in the depth direction, or may have side walls having a predetermined angle θ with respect to the front surface 21. In the example shown in FIG. 3B, the angle θ is a value of 90° or more. A groove provided in the semiconductor substrate 10 exposed in the contact hole 60, that is, a groove whose bottom surface is 0.2 μm or more from the front surface 21 of the semiconductor substrate 10 and which has side walls having a predetermined angle θ with respect to the front surface 21, may also be set as the trench contact portion 65. The edge portion 166 on the side wall of the interlayer dielectric film 38 may also be formed at the angle θ with respect to the front surface of the interlayer dielectric film 38.

Although the trench contact portion 65 of the present example is provided so as to penetrate through the emitter region 12 in the depth direction, it does not need to penetrate through the emitter region 12. Although the semiconductor device 100 of the present example includes the accumulation region 16 below the trench contact portion 65, the accumulation region 16 does not need to be provided. A plug metal layer 68 is formed in the trench contact portion 65 of the present example. As described above, tungsten, titanium, a titanium alloy, titanium silicide, or the like may be filled as the plug metal layer 68.

A width A1 is a width of the trench contact portion 65 on the front surface 21 in the array direction. A width B1 is a width of a lower end of the trench contact portion 65 in the array direction. The trench contact portion 65 of the present example has a tapered XZ cross section. The width A1 is larger than the width B1. The width A1 may be 0.25 μm or more and 0.5 μm or less. The width B1 may be 0.15 μm or more and 0.4 μm or less. For example, the width A1 is 0.35 μm, and the width B1 is 0.2 μm, though the widths are not limited to this.

Figure 3C:
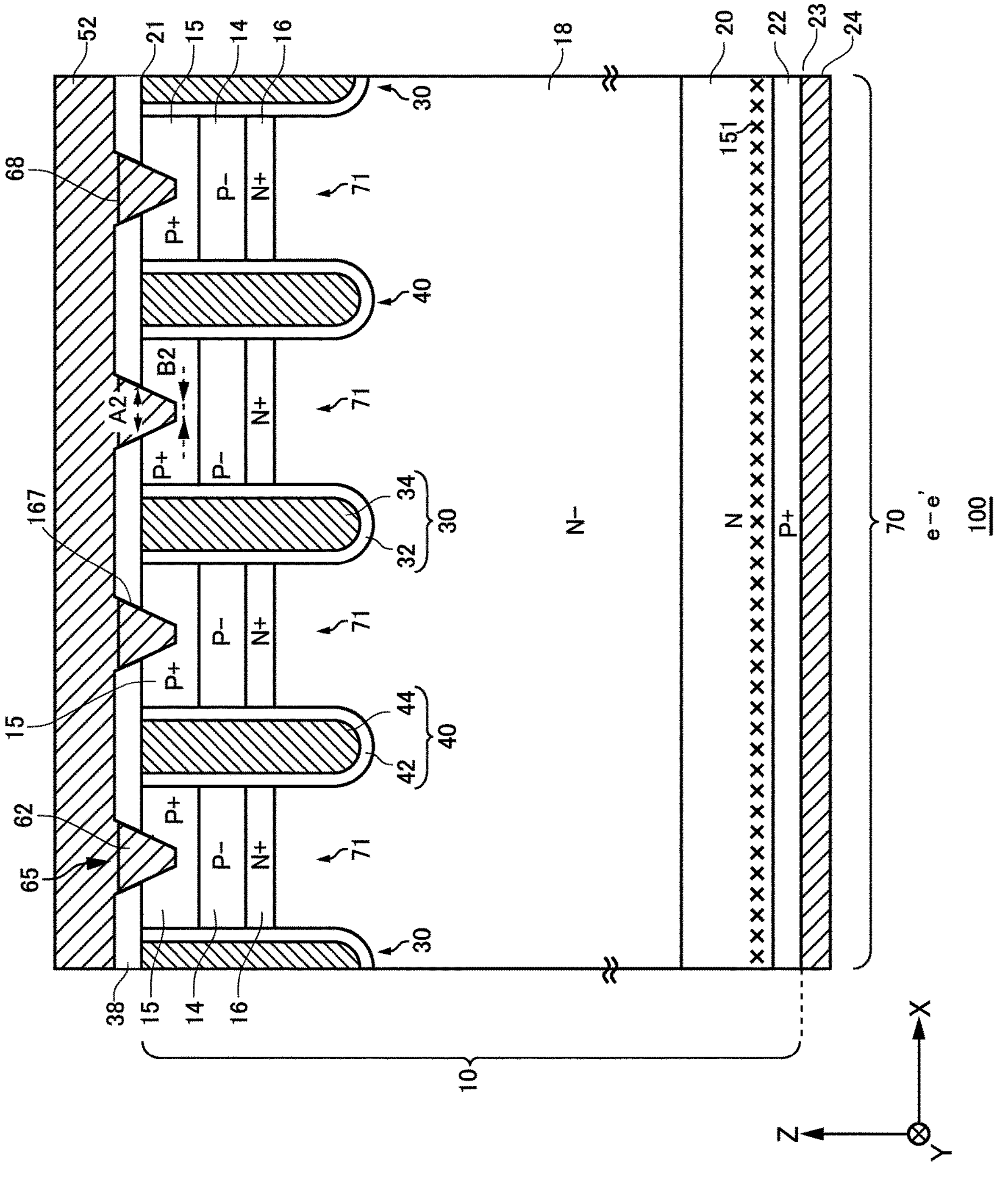
FIG. 3C shows an example of a cross section e-e' in FIG. 3A.

FIG. 3C shows an example of a cross section e-e' in FIG. 3A. The cross section e-e' is the XZ plane that passes through the contact regions 15 in the transistor portion 70. The trench contact portion 65 of the present example is provided without penetrating through the contact region 15 in the depth direction.

A width A2 is a width of the trench contact portion 65 on the front surface 21 in the array direction. A width B2 is a width of the lower end of the trench contact portion 65 in the array direction. The trench contact portion 65 of the present example has a tapered XZ cross section. The width A2 is larger than the width B2. The width A2 of the second contact hole portion 62 may be larger than the width A1 of the first contact hole portion 61. The width B2 of the second contact hole portion 62 may be larger than the width B1 of the first contact hole portion 61. For example, the width A2 is 0.37 μm, and the width B2 is 0.22 μm, though the widths are not limited to this.

Figure 3D:
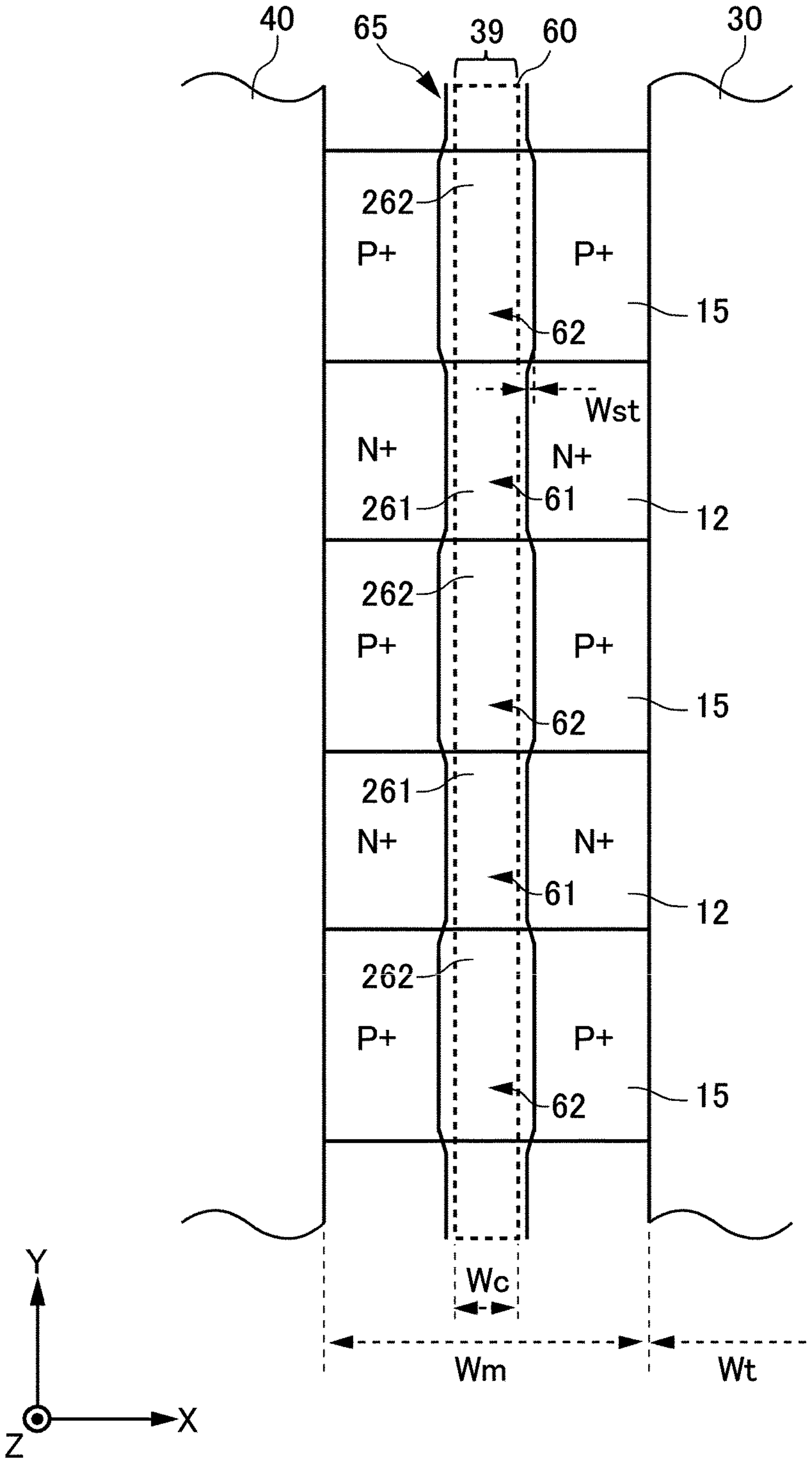
FIG. 3D shows an enlarged diagram of the front surface 21 of the semiconductor device 100 shown in FIG. 3A.

FIG. 3D shows an enlarged diagram of the front surface 21 of the semiconductor device 100 shown in FIG. 3A. The present figure shows the front surface 21 of the mesa portion 71 between the dummy trench portion 30 and the gate trench portion 40. The trench contact portion 65 includes the first contact hole portions 61 and the second contact hole portions 62 as the contact hole 60. The broken lines of the contact hole 60 indicate the side walls of the interlayer dielectric film 38 in the contact hole 60 at a portion higher than the front surface 21. That is, the broken lines of the contact hole 60 indicate the opening portion 39 of the interlayer dielectric film 38. The opening portion 39 of the interlayer dielectric film 38 may have a constant width irrespective of the trench contact portion 65, the emitter region 12, and the contact region 15 formed on the base (the front surface of the semiconductor substrate 10). The solid lines of the contact hole 60 indicate side walls of the semiconductor substrate 10 formed with a dip 261 or a dip 262, the dip 261 or the dip 262 having been formed on the bottom surface of the trench contact portion 65 at a portion lower than the front surface 21. That is, the dip 261 or the dip 262 dented downwardly from the bottom surface of the trench contact portion 65 exposed in the opening portion 39 of the interlayer dielectric film 38 may also be included in the contact hole 60.

A width Wst indicates a size of a step between side walls of the first contact hole portion 61 and the second contact hole portion 62 provided in the trench contact portion 65. That is, the width Wst indicates a difference between the side wall of the first contact hole portion 61 and the side wall of the second contact hole portion 62 provided in the trench contact portion 65 on the front surface 21 in the array direction. The width Wst may be 0.01 μm or more and 0.06 μm or less. The width Wst of the present example is 0.03 μm. The width Wst may be 0.1% or more and 10% or less of the width Wc, or may be 1% or more and 5% or less.

The trench contact portion 65 is formed by etching the front surface 21 of the emitter region 12, the contact region 15, and the like. Therefore, in the trench contact portion 65, etching amounts of the emitter region 12 and the contact region 15 are larger than those in a case where the trench contact portion 65 is not provided as in FIG. 1D, and thus the trench contact portion 65 is easily affected by the difference in the etching rates. Therefore, a step between the first contact hole portion 61 and the second contact hole portion 62 becomes large on the side walls of the trench contact portion 65. That is, the width Wst may be larger than the width Ws with no trench contact portion 65.

Figure 3E:
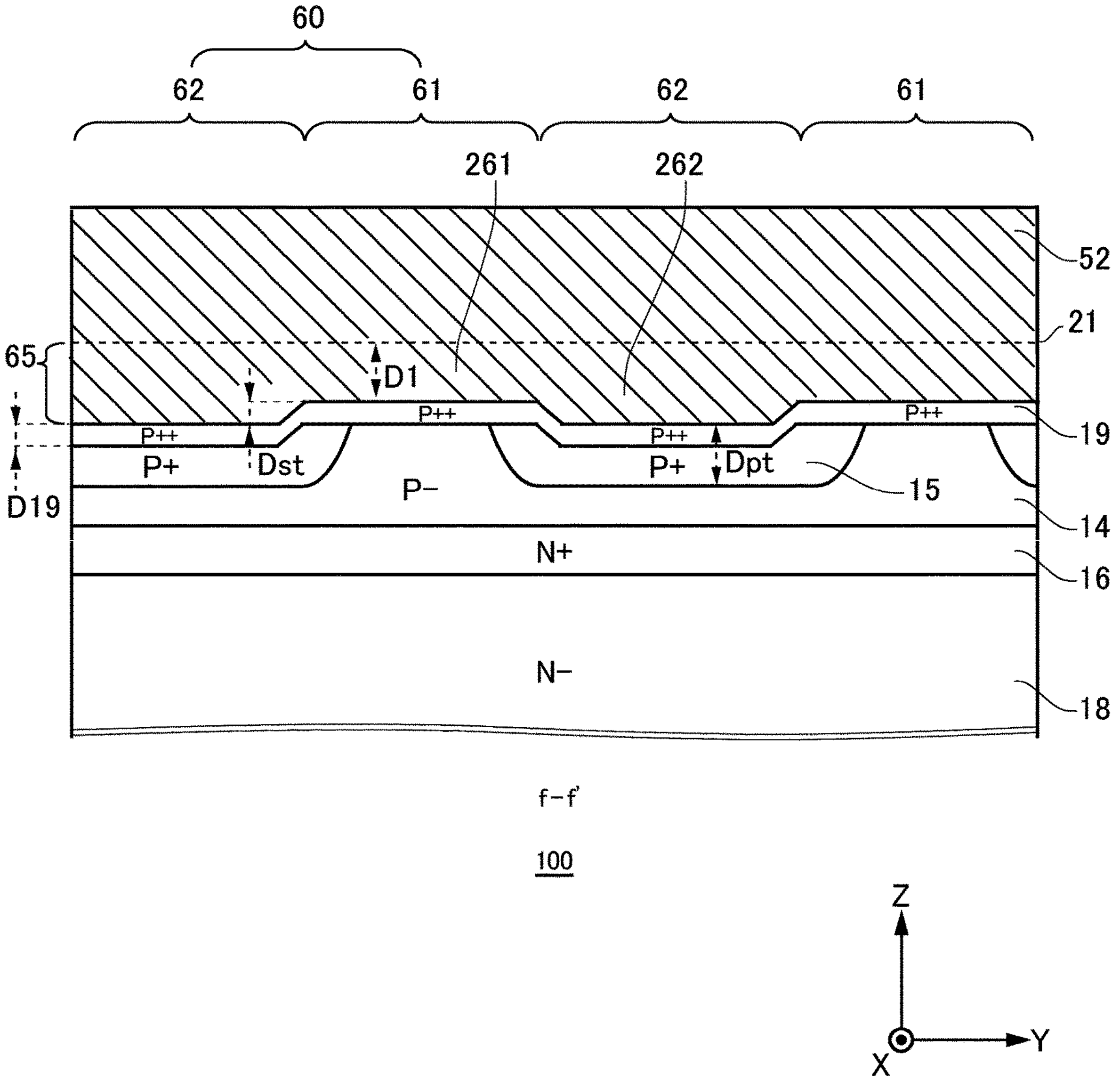
FIG. 3E shows an example of a cross section f-f' in FIG. 3A.

FIG. 3E shows an example of a cross section f-f in FIG. 3A. The cross section f-f is the YZ plane that passes through the trench contact portion 65 in the transistor portion 70. The semiconductor device 100 of the present example includes the plug contact region 19 below the trench contact portion 65.

The first contact hole portion 61 of the present example is provided so as to penetrate through the emitter region 12. Therefore, in the cross section f-f, the emitter region 12 is not provided below the first contact hole portion 61.

The second contact hole portion 62 of the present example is provided without penetrating through the contact region 15. That is, the lower end of the second contact hole portion 62 is shallower than the lower end of the contact region 15. The contact region 15 is provided below the second contact hole portion 62. The contact region 15 of the present example is provided apart from the lower end of the metal layer filled in the second contact hole portion 62 by the plug contact region 19. The contact region 15 is provided to be lower than the plug contact region 19 in contact with the lower end of the metal layer filled in the second contact hole portion 62.

The plug contact region 19 is a region of the second conductivity type, which has a higher doping concentration than the base region 14. The plug contact region 19 of the present example is provided on an entire surface below the trench contact portion 65. That is, the plug contact region 19 is provided below both of the first contact hole portion 61 and the second contact hole portion 62. The plug contact region 19 of the present example is provided in contact with the lower end of the metal layer filled in the trench contact portion 65. The lower end of the plug contact region 19 may be in contact with the emitter region 12 below the first contact hole portion 61. The lower end of the plug contact region 19 may be in contact with the contact region 15 below the second contact hole portion 62. A depth position of the upper end of the plug contact region 19 may be positioned closer to the front surface 21 than the bottom surface of the trench contact portion 65. That is, the plug contact region 19 may be provided so as to cover the bottom surface of the trench contact portion 65.

Herein, the plug contact region 19 is formed by performing ion implantation on the bottom surface of the trench contact portion 65 after forming the trench contact portion 65. The depth at which the plug contact region 19 is formed is affected by the step between the first contact hole portion 61 and the second contact hole portion 62. Therefore, the plug contact region 19 below the first contact hole portion 61 is provided to be shallower than the plug contact region 19 below the second contact hole portion 62. The bottom surface of the plug contact region 19 may be provided in a wave-like form along the depths of the bottom surface of the trench contact portion 65. The bottom surface of the plug contact region 19 may be provided in a wave-like form according to the depths of the bottom surface of the trench contact portion 65.

A thickness D1 in the depth direction indicates a thickness from the front surface 21 to the lower end of the first contact hole portion 61 in the depth direction. The thickness D1 in the depth direction is equivalent to a depth of a shallowest portion out of the depths from the front surface 21 to the bottom surface of the trench contact portion 65. The thickness D1 in the depth direction may be 0.05 μm or more, 0.2 μm or more and 1.0 μm or less, or 0.3 μm or more and 0.6 μm or less. For example, the thickness D1 in the depth direction is 0.35 μm.

A thickness Dst in the depth direction indicates a size of the step between the first contact hole portion 61 and the second contact hole portion 62 in the depth direction. That is, the thickness Dst in the depth direction indicates a difference between the lower end of the first contact hole portion 61 and the lower end of the second contact hole portion 62 in the depth direction of the semiconductor substrate 10. The thickness Dst in the depth direction may be 0.01 μm or more and 0.1 μm or less. For example, the thickness Dst in the depth direction is 0.03 μm.

A ratio $\alpha$ of the thickness Dst in the depth direction to the thickness D1 in the depth direction may be 0.01 or more and 1.0 or less, may be 0.05 or more and 0.5 or less, or may be 0.07 or more and 0.2 or less.

A thickness D19 in the depth direction indicates a thickness of the plug contact region 19 in the depth direction. The thickness D19 in the depth direction may be 0.005 μm or more and 0.2 μm or less. For example, the thickness D19 of the plug contact region 19 in the depth direction is 0.01 μm.

A thickness Dpt in the depth direction indicates a thickness from the lower end of the second contact hole portion 62 to the lower end of the contact region 15 in the depth direction. The thickness Dpt in the depth direction according to the present example corresponds to a sum of the thicknesses of the plug contact region 19 and the contact region 15 provided below the second contact hole portion 62 in the depth direction. By setting the thickness Dpt in the depth direction small, extraction of holes becomes easy. The thickness Dpt in the depth direction may be 0.1 μm or more and 1.2 μm or less, or may be 0.3 μm or more and 1.0 μm or less. For example, the thickness Dpt in the depth direction is 0.6 μm.

By providing the plug contact region 19 so as to cover the bottom surface of the trench contact portion 65, an effect of enhancing suppression of latch-up is obtained. By providing the dip 261 and the dip 262 on the bottom surface of the trench contact portion 65 as in the present example and setting the dip 262 to be deeper than the dip 261, a situation where holes that flow toward the front surface 21 from the back surface 23 are concentrated toward the emitter region 12 can be avoided. Accordingly, occurrence of latch-up when the transistor portion is turned off can be suppressed.

Figure 4A:
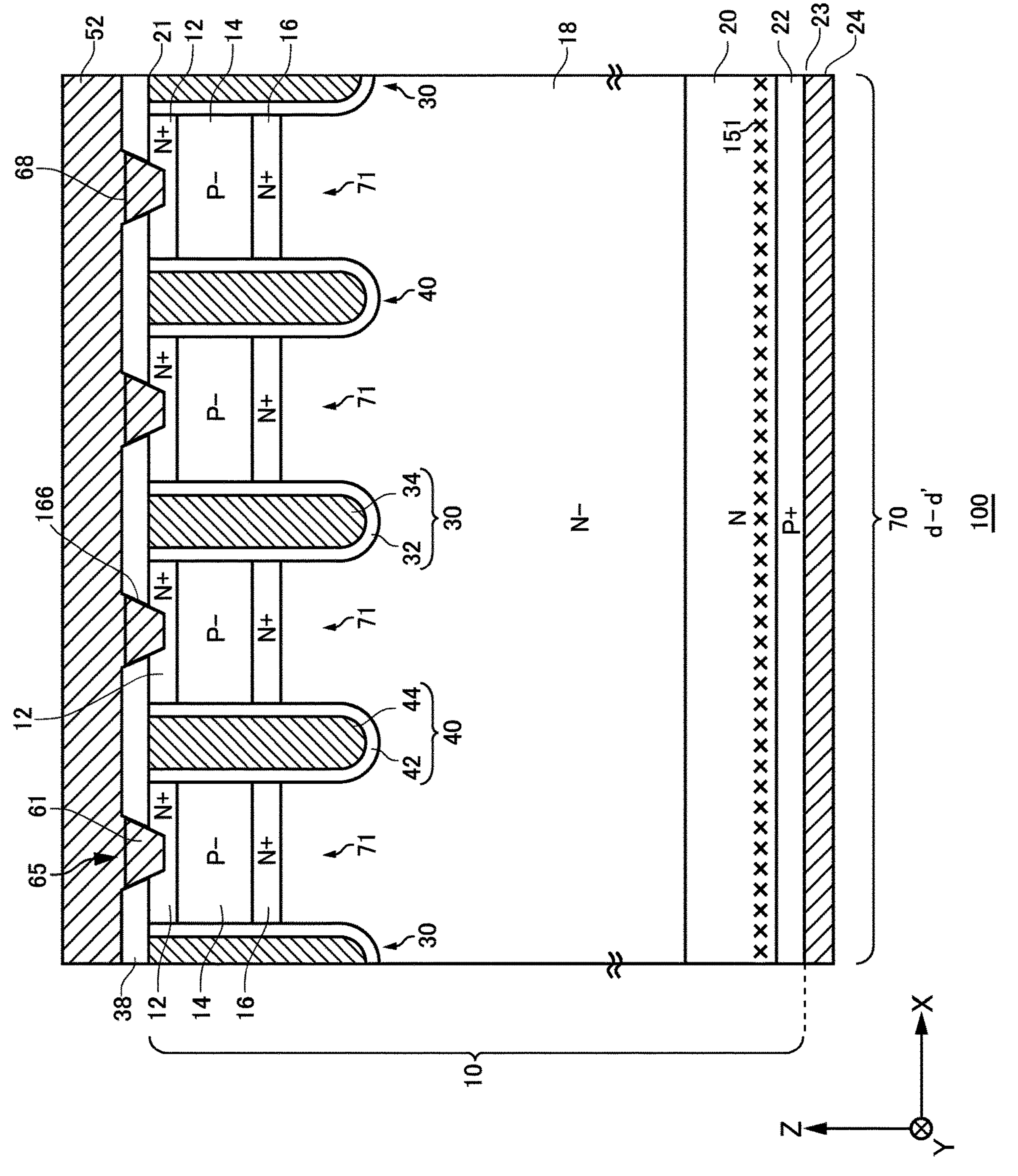
FIG. 4A shows a modified example of the cross section d-d' in FIG. 3A.

FIG. 4A shows a modified example of the cross section d-d' in FIG. 3A. The trench contact portion 65 of the present example differs from that of FIG. 3B in the point of not penetrating through the emitter region 12 in the depth direction.

Figure 4B:
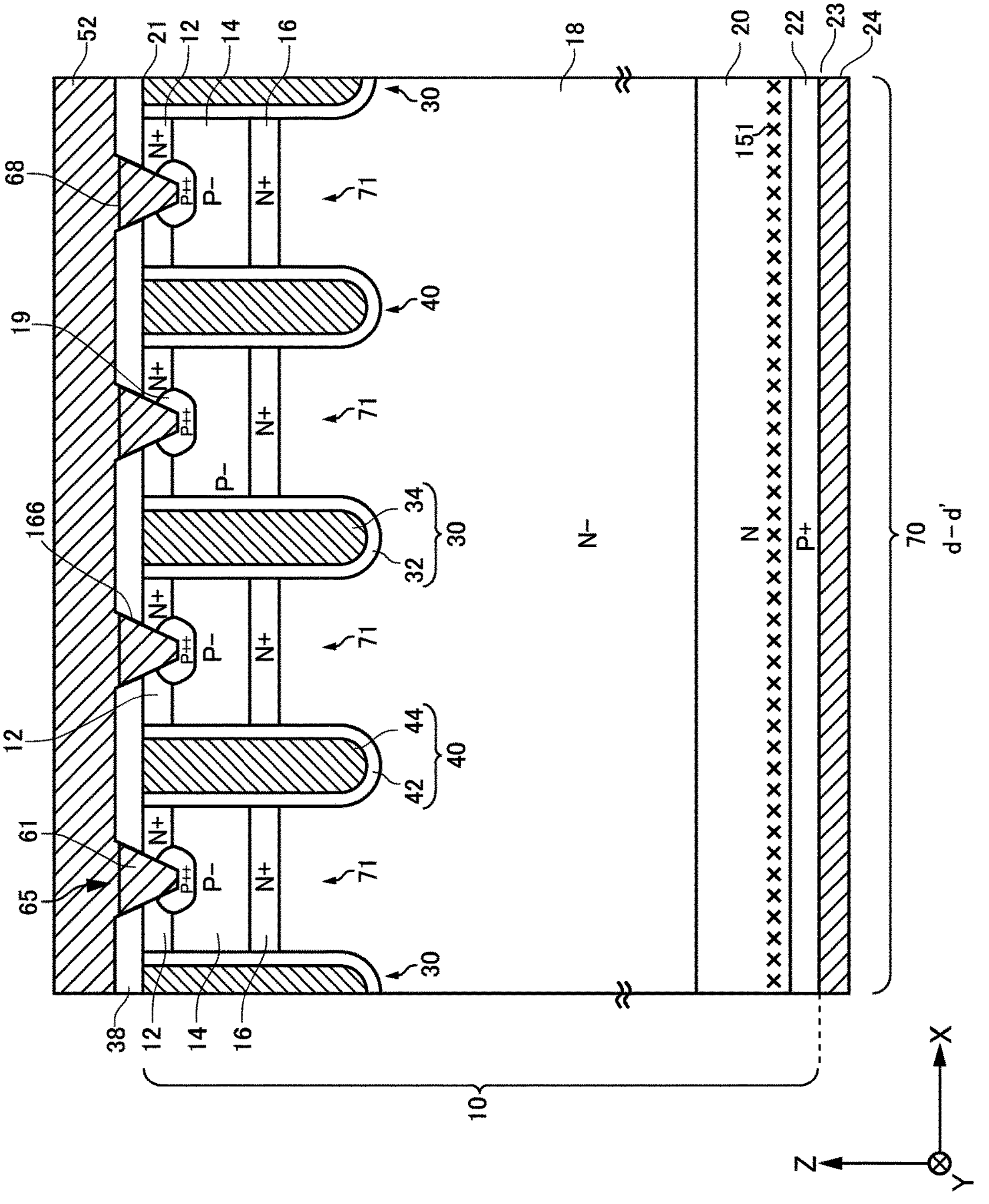
FIG. 4B shows a modified example of the cross section d-d' in FIG. 3A.

FIG. 4B shows a modified example of the cross section d-d' in FIG. 3A. The trench contact portion 65 of the present example differs from that of FIG. 3B in that, although the trench contact portion 65 penetrates through the emitter region 12 in the depth direction similar to FIG. 3B, the plug contact region 19 is provided so as to cover the bottom surface of the trench contact portion 65. The plug contact region 19 is a region of the second conductivity type, which has a higher doping concentration than the base region 14 and the contact region 15. The plug contact region 19 will be described later. The width of the plug contact region 19 in the array direction may be larger than the width of the bottom surface of the trench contact portion 65. The present figure corresponds to an XZ cross-sectional view of a position at which the second contact hole portion 62 is provided in FIG. 3E.

Figure 4C:
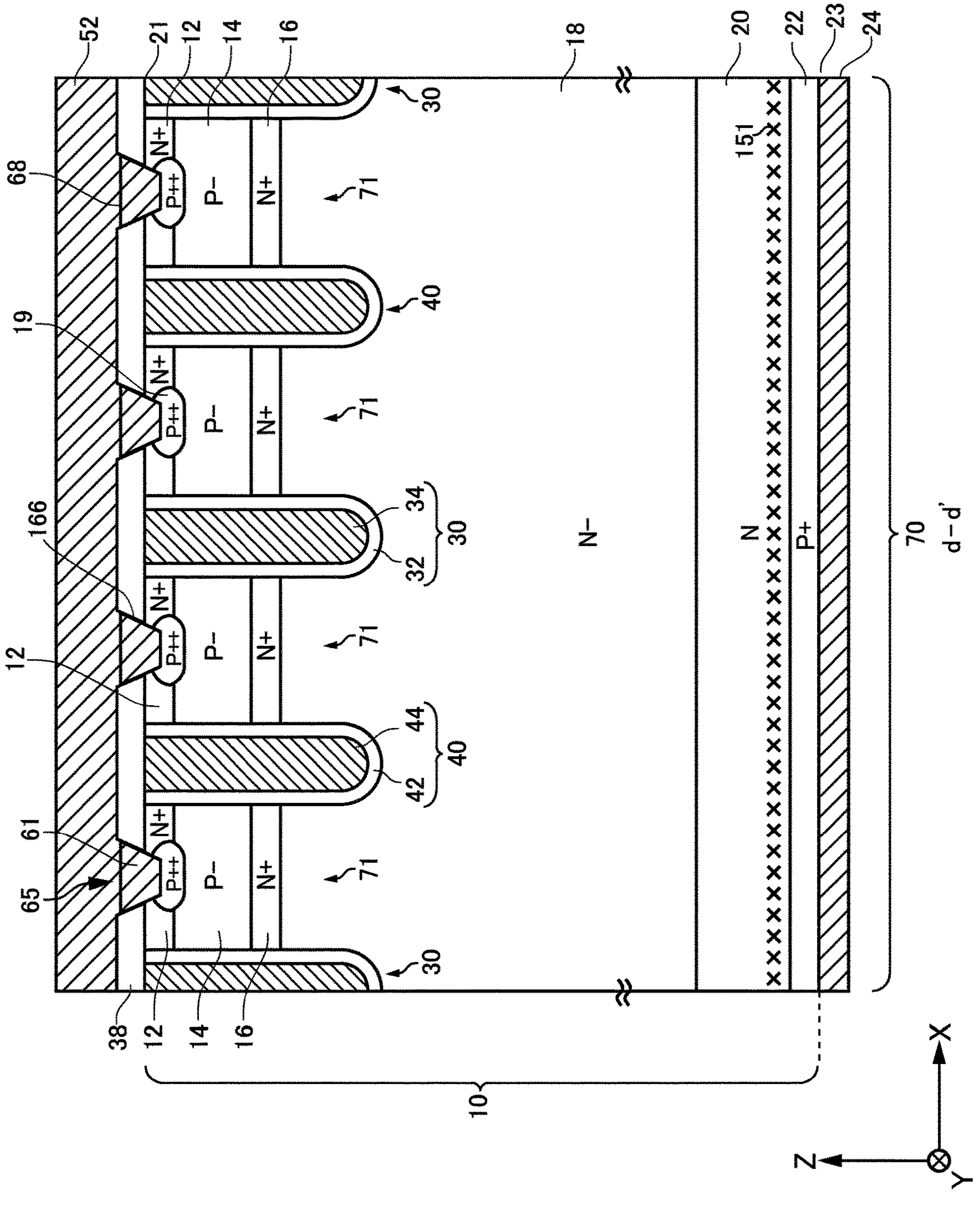
FIG. 4C shows a modified example of the cross section d-d' in FIG. 3A.

FIG. 4C shows a modified example of the cross section d-d' in FIG. 3A. The trench contact portion 65 of the present example differs from that of FIG. 4A in the point of including the plug contact region 19 so as to cover the bottom surface of the trench contact portion 65. The lower end of the plug contact region 19 of the present example is deeper than the lower end of the emitter region 12.

Figure 4D:
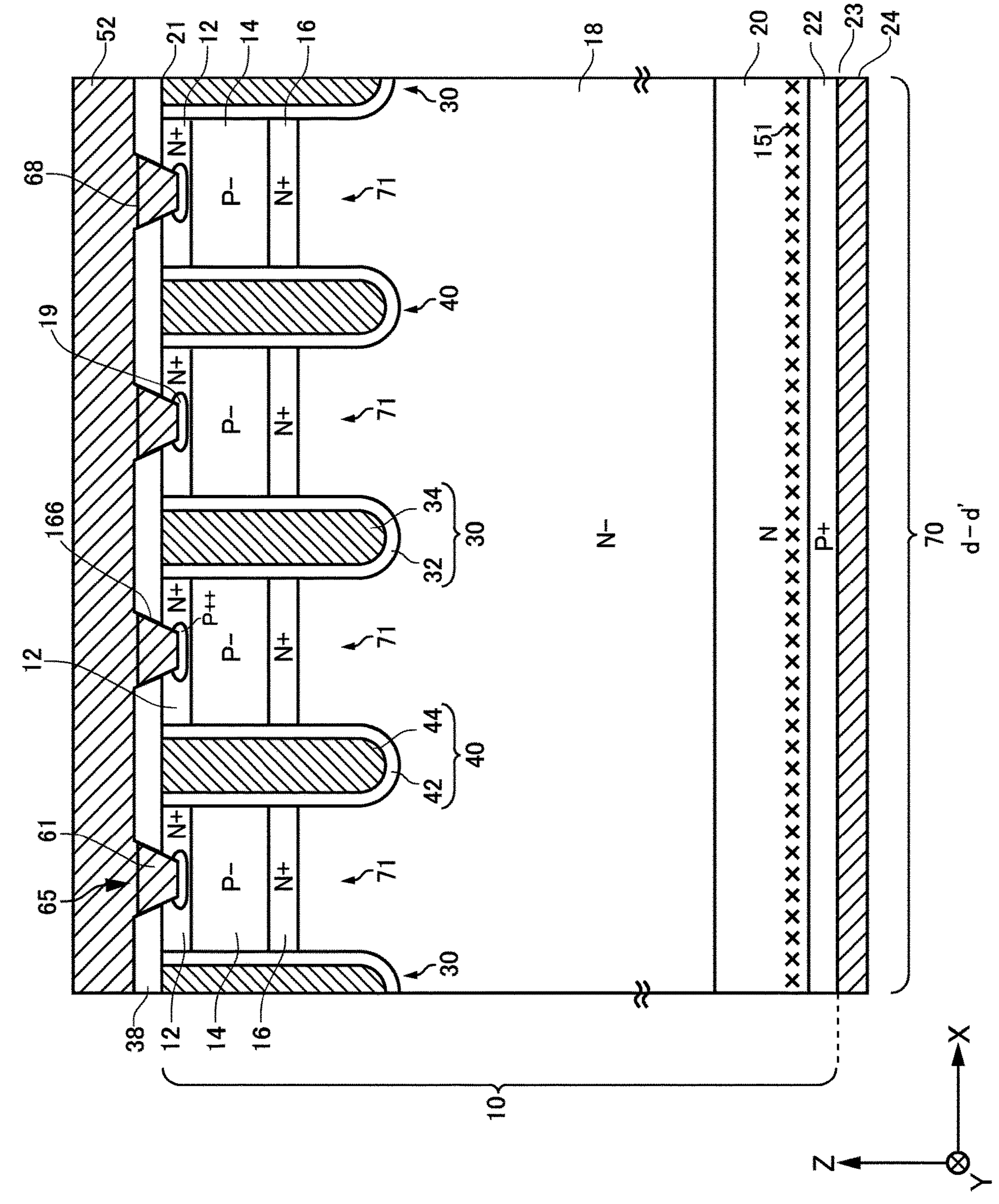
FIG. 4D shows a modified example of the cross section d-d' in FIG. 3A.

FIG. 4D shows a modified example of the cross section d-d' in FIG. 3A. The trench contact portion 65 of the present example differs from that of FIG. 4A in the point of including the plug contact region 19 so as to cover the bottom surface of the trench contact portion 65, and differs from that of FIGS. 4B and 4C in that the lower end of the emitter region 12 is deeper than the lower end of the plug contact region 19.

Figure 4E:
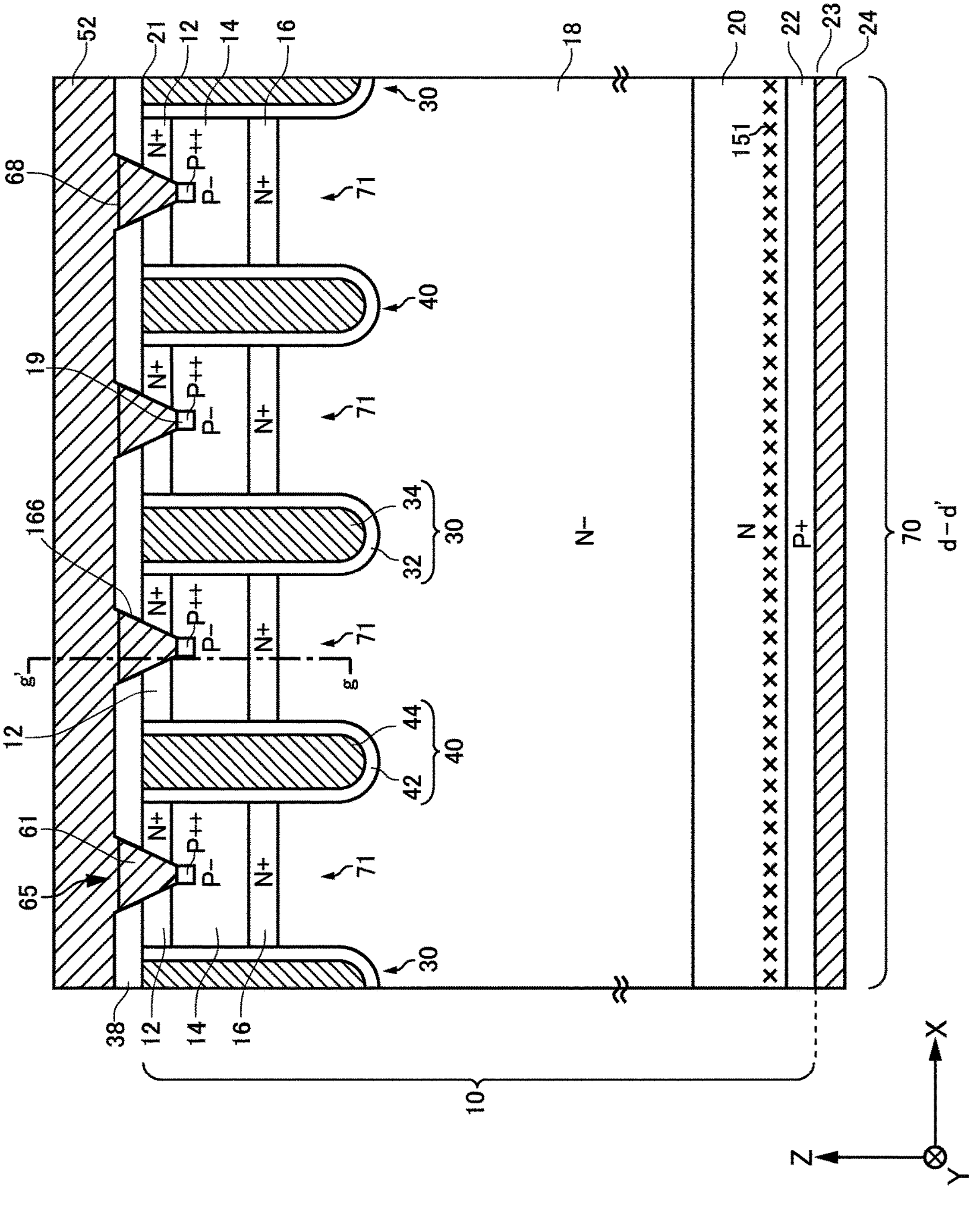
FIG. 4E shows a modified example of the cross section d-d' in FIG. 3A.

FIG. 4E shows a modified example of the cross section d-d' in FIG. 3A. The trench contact portion 65 of the present example penetrates through the emitter region 12 in the depth direction similar to FIGS. 3B and 4B. The plug contact region 19 of the present example differs from that of FIG. 4B in that the plug contact region 19 is provided to cover only the bottom surface of the trench contact portion 65 and is not in contact with the side walls of the trench contact portion 65. Due to a concentration gradient of an N type dopant caused by a diffusion of ions and/or a range variation in an ion implantation process for forming the emitter region 12, the plug contact region 19 may not be formed on the side walls of the trench contact portion 65 in an ion implantation process for forming the plug contact region 19.

Figure 4F:
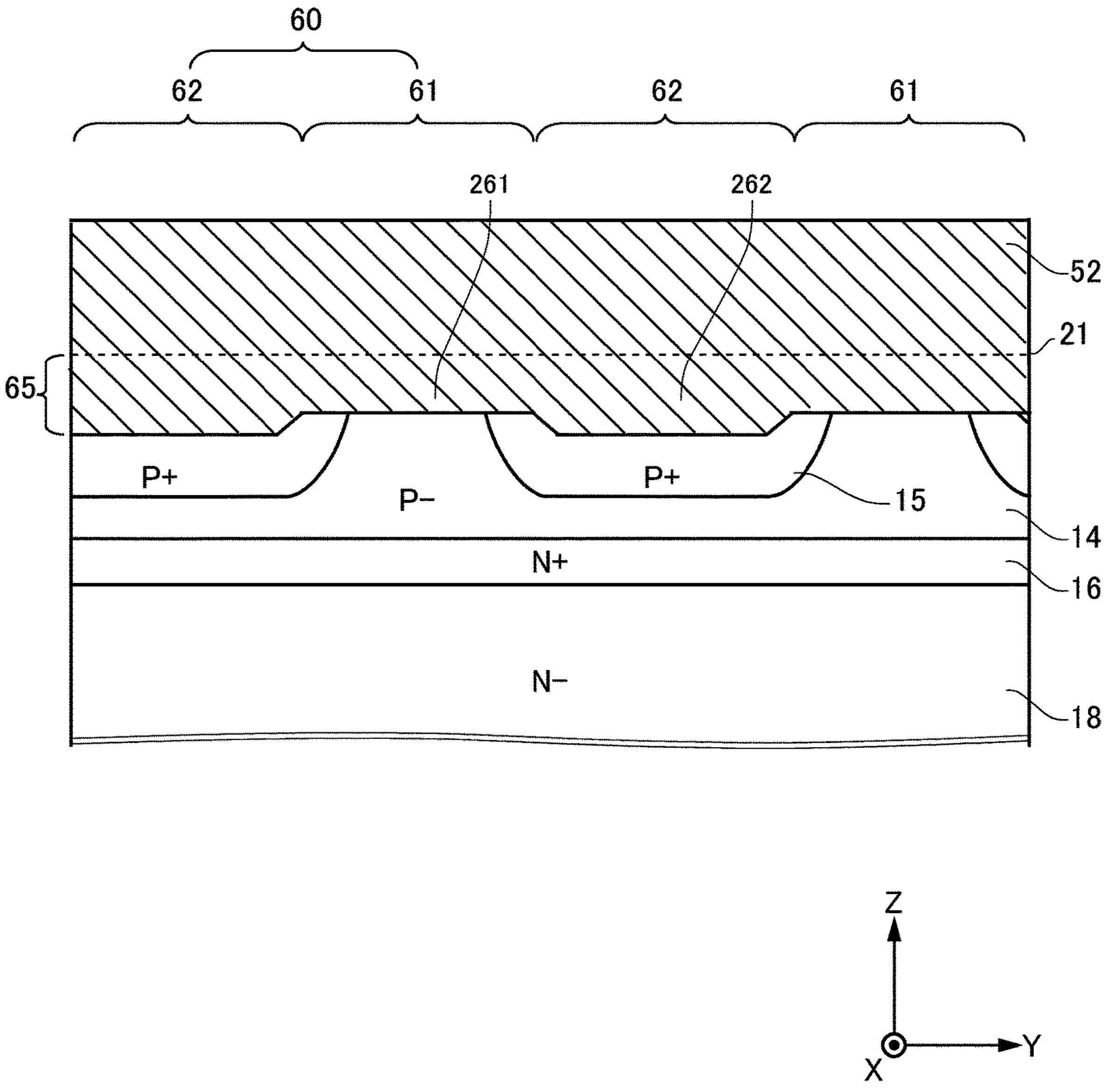
FIG. 4F shows an example of a cross section g-g' in FIG. 4E.

FIG. 4F shows an example of a cross section g-g' in FIG. 4E. FIG. 4F is a cross-sectional view that longitudinally passes through the side wall of the trench contact portion 65 in which the plug contact region 19 is not formed. Since the trench contact portion 65 penetrates through the emitter region 12 in the depth direction, the trench contact portion 65 and the base region 14 may be provided in contact with each other in the first contact hole portion 61.

Figure 4G:
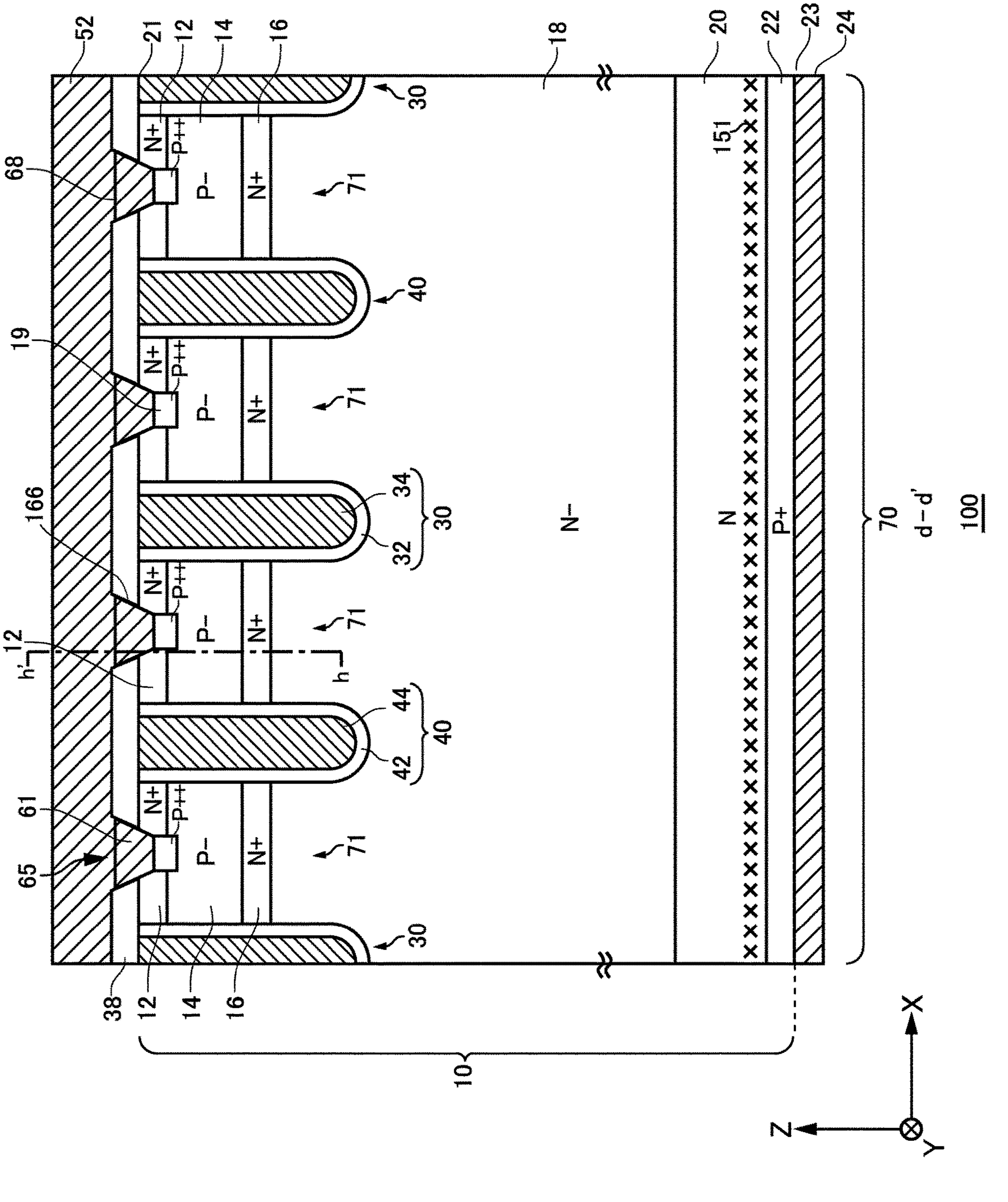
FIG. 4G shows a modified example of the cross section d-d' in FIG. 3A.

FIG. 4G shows a modified example of the cross section d-d' in FIG. 3A. The trench contact portion 65 of the present example differs from that of FIG. 4E in the point of not penetrating through the emitter region 12 in the depth direction. The plug contact region 19 of the present example is provided so as to cover only the bottom surface of the trench contact portion 65 and is not in contact with the side walls of the trench contact portion 65. Due to a concentration gradient of an N type dopant caused by a diffusion of ions and/or a range variation in the ion implantation process for forming the emitter region 12, the plug contact region 19 may not be formed on the side walls of the trench contact portion 65 in the ion implantation process for forming the plug contact region 19. The lower end of the plug contact region 19 of the present example is deeper than the lower end of the emitter region 12.

Figure 4H:
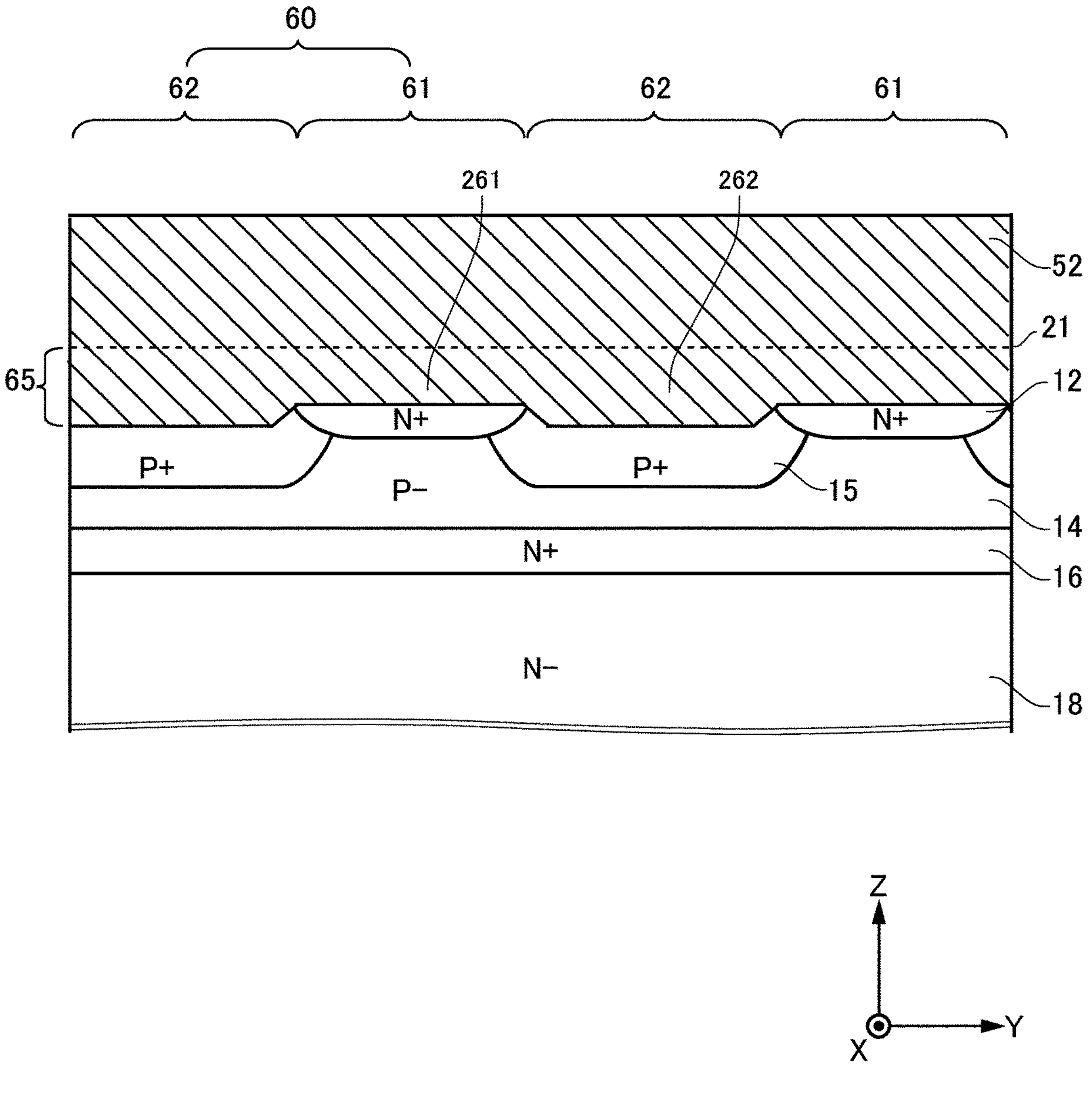
FIG. 4H shows an example of a cross section h-h' in FIG. 4G.

FIG. 4H shows an example of a cross section h-h' in FIG. 4G. FIG. 4H is a cross-sectional view that longitudinally passes through the side wall of the trench contact portion 65 in which the plug contact region 19 is not formed. Since the trench contact portion 65 does not penetrate through the emitter region 12 in the depth direction, the trench contact portion 65 and the emitter region 12 may be provided in contact with each other in the first contact hole portion 61.

Figure 5A:
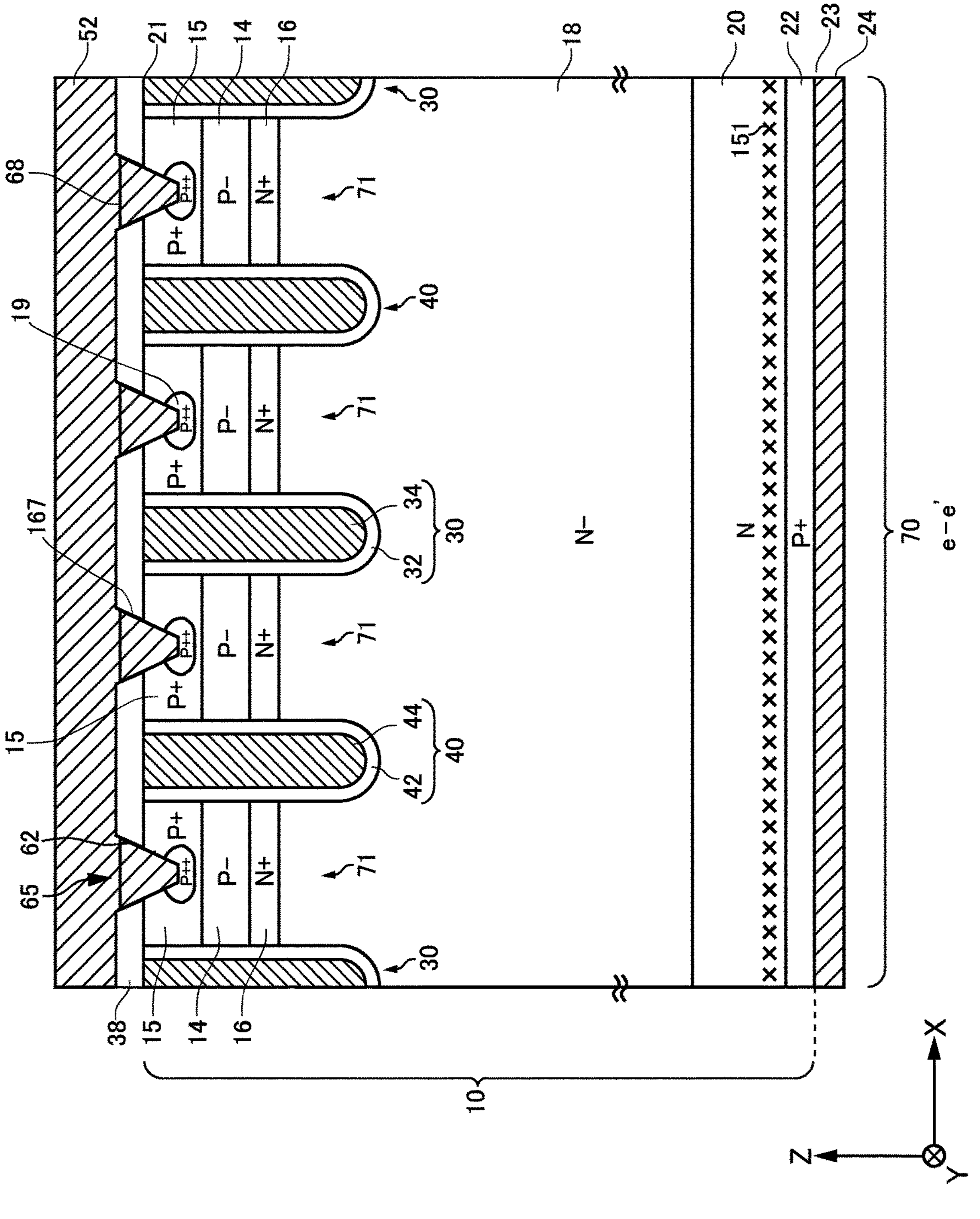
FIG. 5A shows a modified example of the cross section e-e' in FIG. 3A.

FIG. 5A shows a modified example of the cross section e-e' in FIG. 3A. FIG. 5A differs from FIG. 3C in that the plug contact region 19 is provided so as to cover the bottom surface of the trench contact portion 65. The present figure corresponds to an XZ cross-sectional view of a position at which the second contact hole portion 62 is provided in FIG. 3E.

Figure 5B:
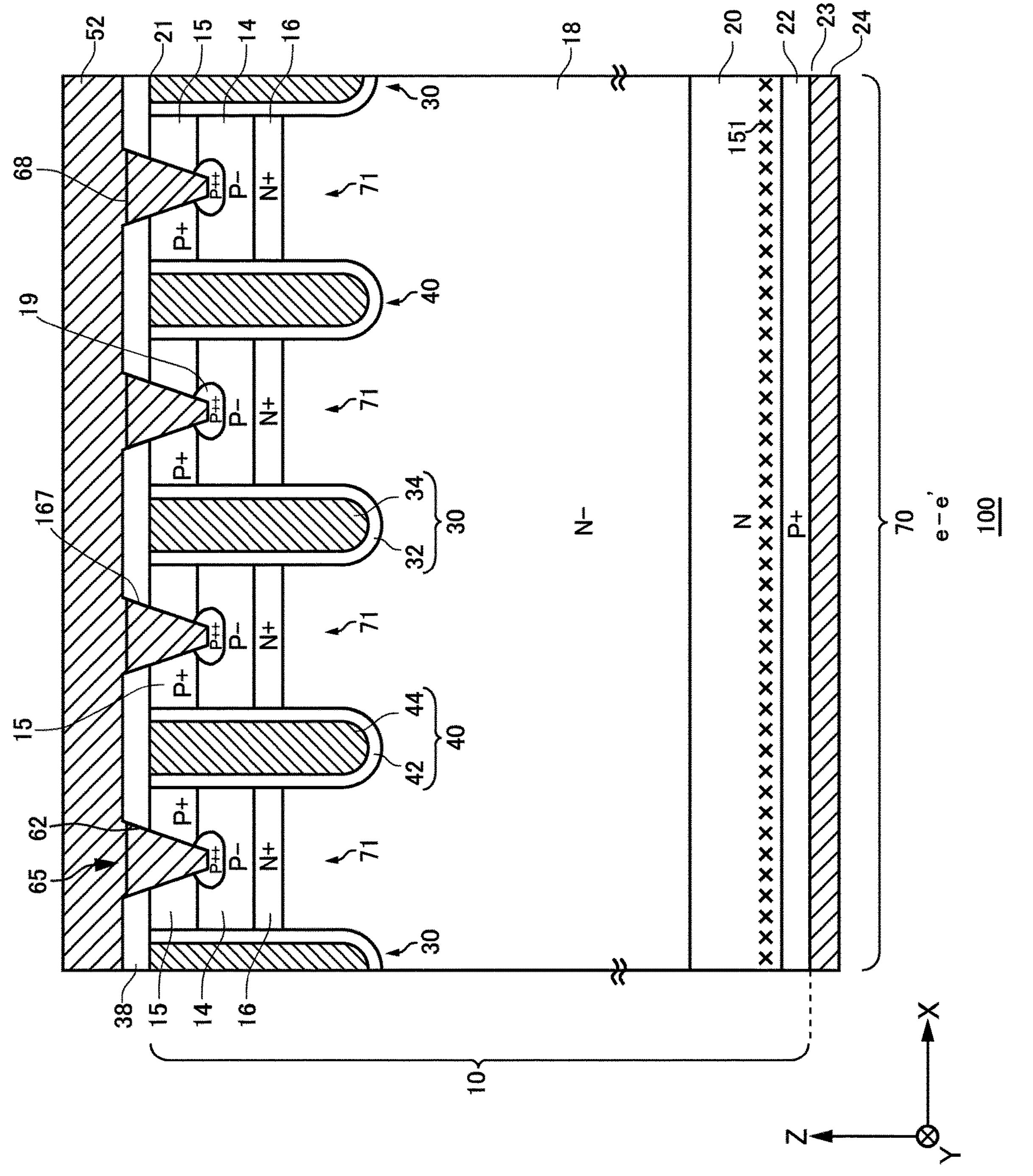
FIG. 5B shows a modified example of the cross section e-e' in FIG. 3A.

FIG. 5B shows a modified example of the cross section e-e' in FIG. 3A. FIG. 5B differs from FIG. 5A in that the lower end of the trench contact portion 65 is deeper than the lower end of the contact region 15. The lower end of the trench contact portion 65 is provided at a position deeper than the upper end of the base region 14. The plug contact region 19 of the present example is in contact with the base region 14.

Figure 5C:
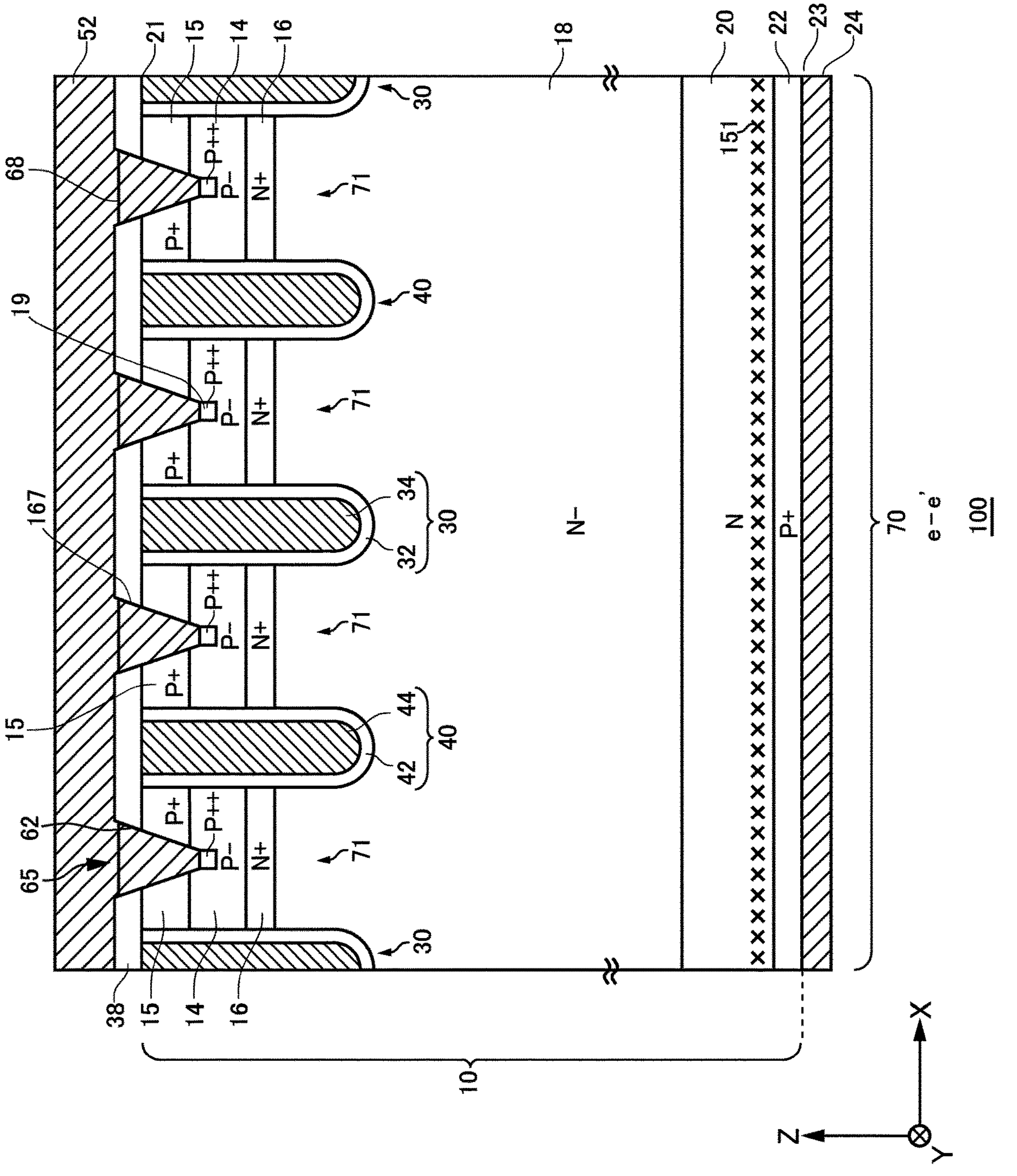
FIG. 5C shows a modified example of the cross section e-e' in FIG. 3A.

FIG. 5C shows a modified example of the cross section e-e' in FIG. 3A. FIG. 5C differs from FIG. 5A in that similar to FIG. 5B, the lower end of the trench contact portion 65 is deeper than the lower end of the contact region 15. The lower end of the trench contact portion 65 is provided at a position deeper than the upper end of the base region 14. The plug contact region 19 of the present example is in contact with the base region 14. The plug contact region 19 of the present example differs from that of FIG. 5B in that the plug contact region 19 is provided so as to cover only the bottom surface of the trench contact portion 65 and is not in contact with the side walls of the trench contact portion 65. That is, in the cross section e-e' shown in FIG. 5C, the side walls of the trench contact portion 65 are in contact with the contact region 15 and the base region 14. When forming the plug contact region 19 by performing ion implantation of a P type dopant in the P− type contact region 15, the plug contact region 19 may be formed only at the bottom portion of the trench contact portion 65.

Figure 5D:
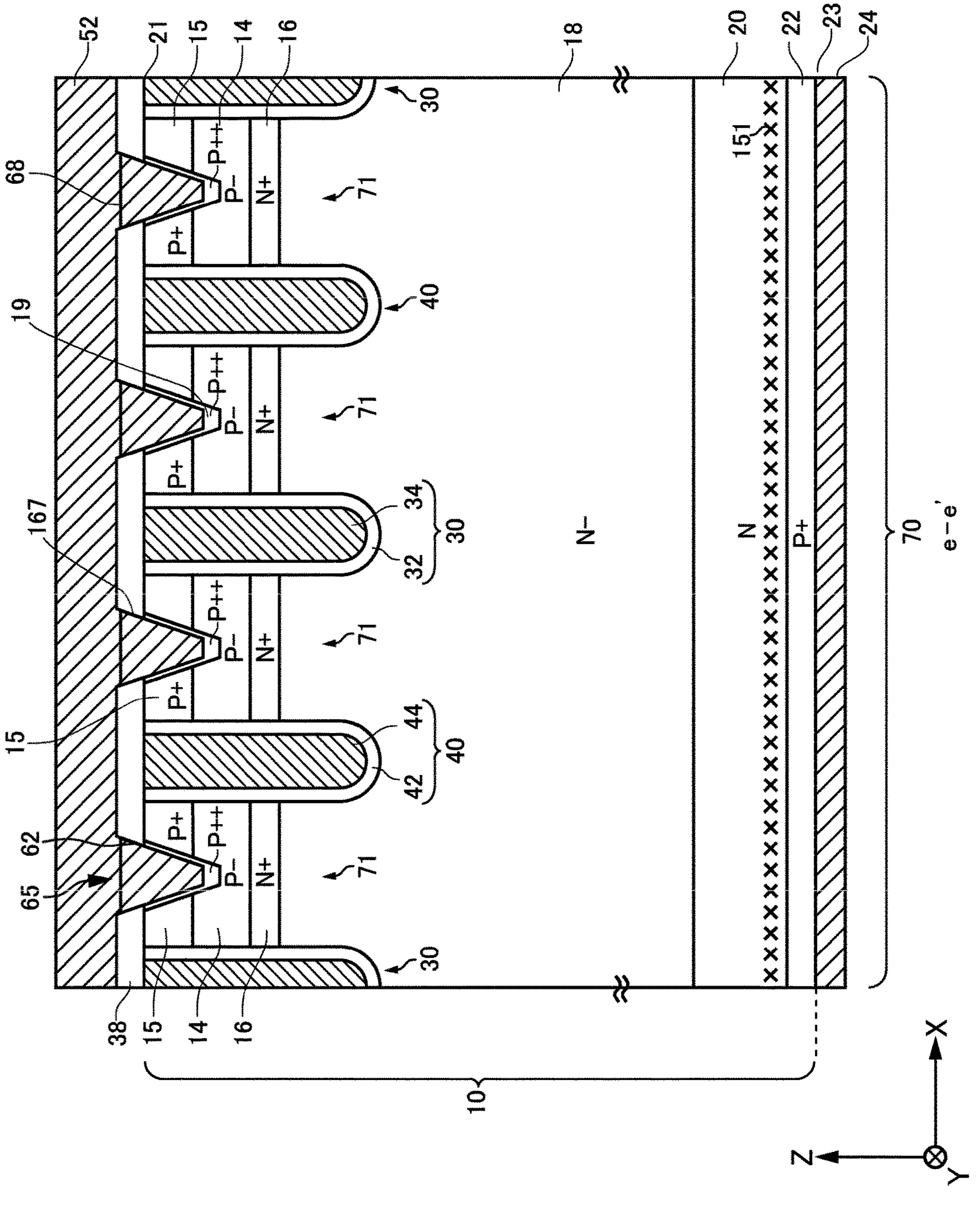
FIG. 5D shows a modified example of the cross section e-e' in FIG. 3A.

FIG. 5D shows a modified example of the cross section e-e' in FIG. 3A. FIG. 5D differs from FIG. 5A in that similar to FIGS. 5B and 5C, the lower end of the trench contact portion 65 is deeper than the lower end of the contact region 15. The lower end of the trench contact portion 65 is provided at a position deeper than the upper end of the base region 14. The plug contact region 19 of the present example is in contact with the base region 14. The plug contact region 19 of the present example differs from that of FIGS. 5B and 5C in the point of being formed on entire surfaces of the bottom surface of the trench contact portion 65 and the side walls of the trench contact portion 65 opposing the semiconductor substrate 10. When forming the plug contact region 19 on the side walls of the trench contact portion 65, the plug contact region 19 may be formed by not providing a mask for ion implantation for forming the plug contact region 19 above the trench contact portion 65, the plug contact region 19 may be formed by increasing a taper angle of the side wall portion of the trench contact portion 65, or the plug contact region 19 may be formed by performing ion implantation with an angle.

Figure 5E:
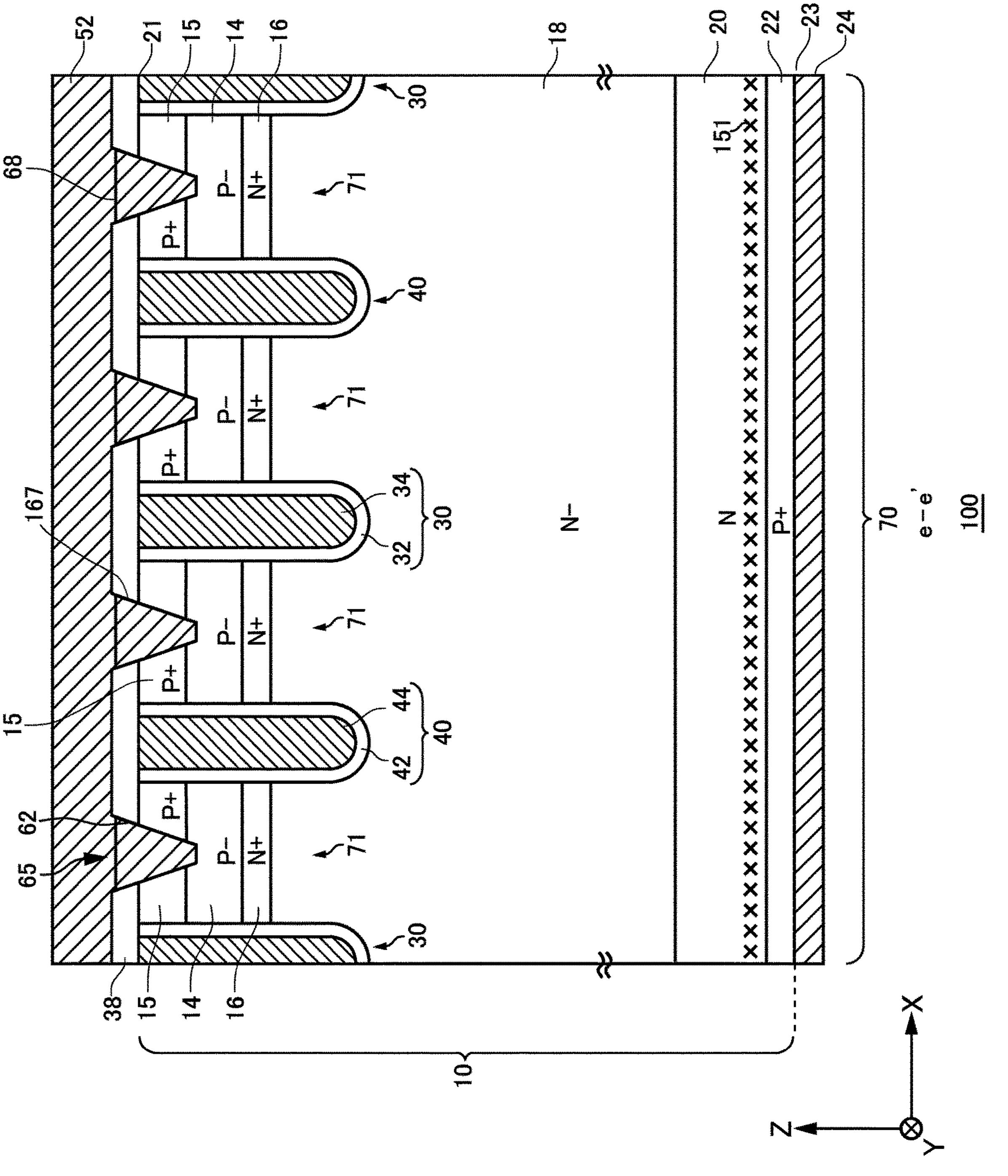
FIG. 5E shows a modified example of the cross section e-e' in FIG. 3A.

FIG. 5E shows a modified example of the cross section e-e' in FIG. 3A. FIG. 5E differs from FIG. 5A in that similar to FIGS. 5B to 5D, the lower end of the trench contact portion 65 is deeper than the lower end of the contact region 15. FIG. 5E differs from FIGS. 5B to 5D in that the plug contact region 19 is not provided.

Figure 6A:
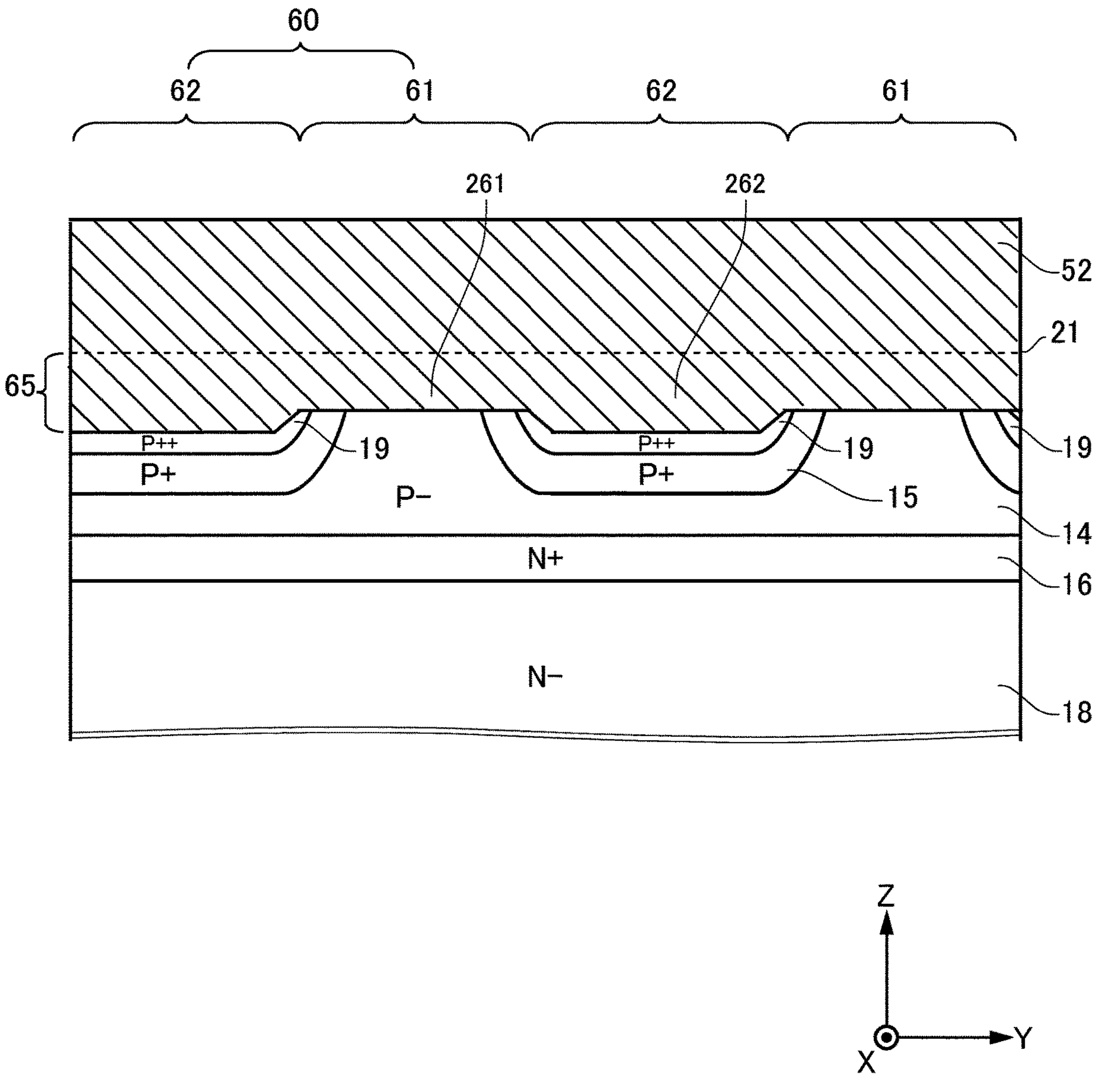
FIG. 6A shows a modified example of the semiconductor device 100.

FIG. 6A shows a modified example of the semiconductor device 100. The present figure shows the YZ plane that passes through the trench contact portion 65. The present example differs from the example shown in FIG. 3E in that although the trench contact portion 65 is provided so as to penetrate through the emitter region 12, the plug contact region 19 is provided selectively below the trench contact portion 65. The present example describes points that differ from the example shown in FIG. 3E in particular, and other points may be the same as those of the example shown in FIG. 3E. That is, FIG. 6A of the present example corresponds to the examples shown in FIGS. 3B and 5A.

The first contact hole portion 61 is provided so as to penetrate through the emitter region 12, and the lower end of the first contact hole portion 61 is deeper than the lower end of the emitter region 12. That is, the emitter region 12 is not provided below the first contact hole portion 61. The lower end of the metal layer filled in the first contact hole portion 61 is in contact with the base region 14.

The plug contact region 19 is not provide on the entire surface below the trench contact portion 65 and is provided in partial regions below the trench contact portion 65. The plug contact region 19 of the present example is provided below the second contact hole portion 62 and is not provided below the first contact hole portion 61. It is to be noted that a part of the plug contact region 19 may be provided below the first contact hole portion 61 by the diffusion. The lower end of the metal layer filled in the first contact hole portion 61 is in contact with the base region 14. It is to be noted that a part of the lower end of the metal layer filled in the first contact hole portion 61 may be in contact with the contact region 15 or the plug contact region 19.

Figure 6B:
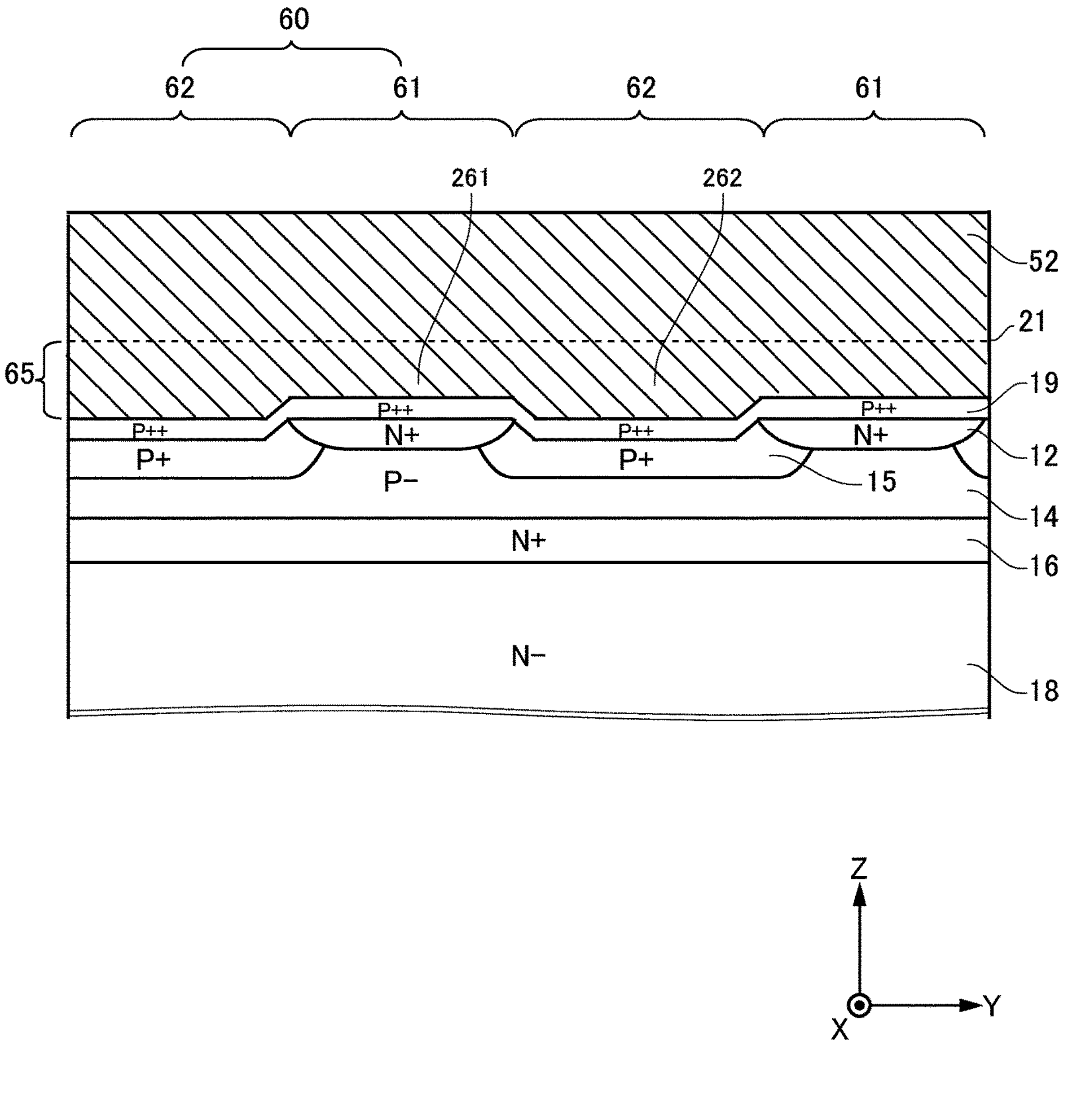
FIG. 6B shows a modified example of the semiconductor device 100.

FIG. 6B shows a modified example of the semiconductor device 100. The present figure shows the YZ plane that passes through the trench contact portion 65. The present example differs from the example shown in FIG. 3E in that although the plug contact region 19 is provided on the entire surface below the trench contact portion 65, the trench contact portion 65 is provided without penetrating through the emitter region 12. The present example describes points that differ from the example shown in FIG. 3E in particular, and other points may be the same. That is, FIG. 6B of the present example corresponds to the examples shown in FIGS. 4D and 5A.

The first contact hole portion 61 is provided without penetrating through the emitter region 12, and the lower end of the first contact hole portion 61 is shallower than the lower end of the emitter region 12. That is, the emitter region 12 is provided below the first contact hole portion 61. The lower end of the metal layer filled in the first contact hole portion 61 is in contact with the plug contact region 19.

Figure 6C:
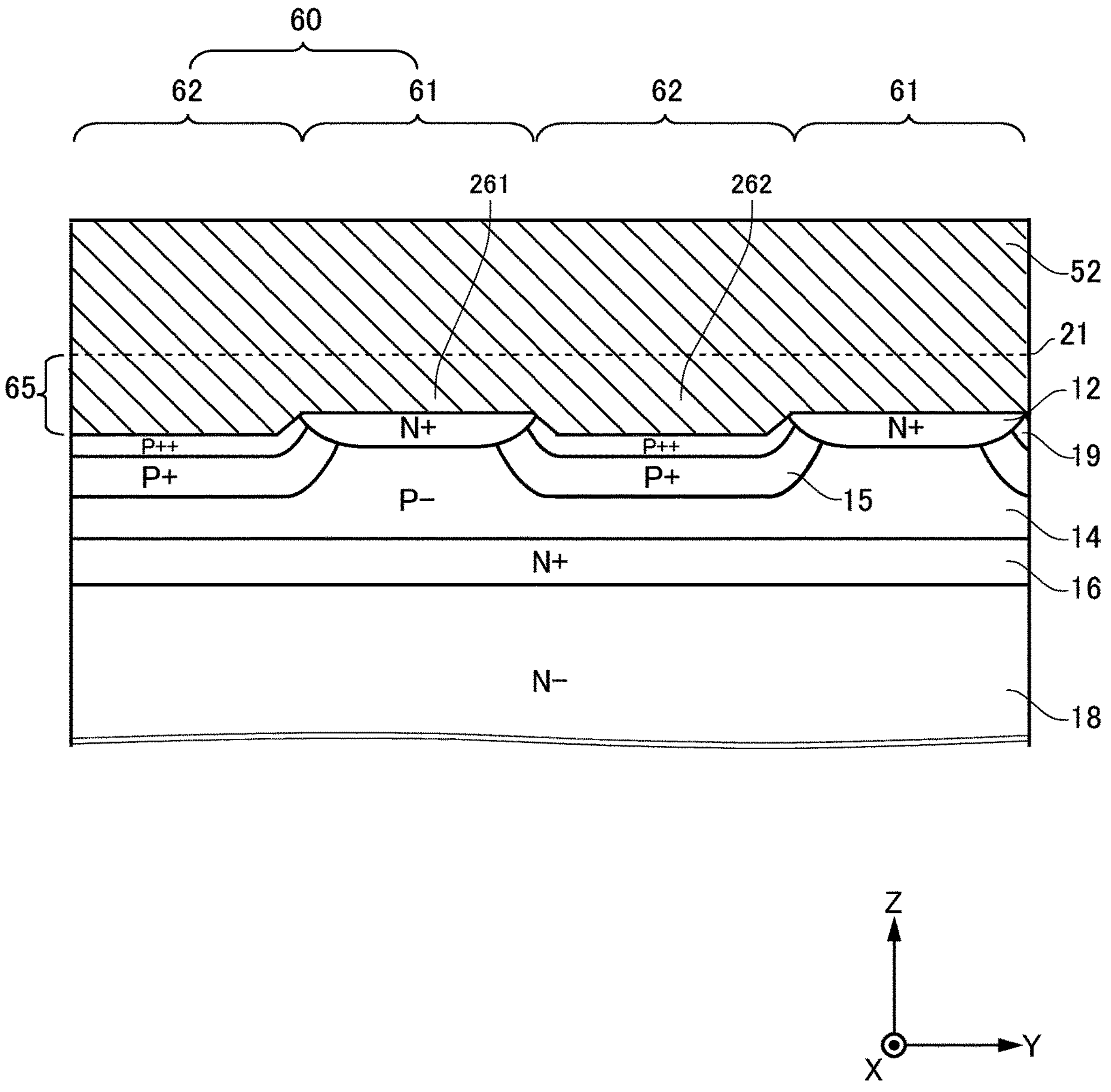
FIG. 6C shows a modified example of the semiconductor device 100.

FIG. 6C shows a modified example of the semiconductor device 100. The present figure shows the YZ plane that passes through the trench contact portion 65. The present example differs from the example shown in FIG. 6B in that although the trench contact portion 65 is provided without penetrating through the emitter region 12, the plug contact region 19 is provided selectively below the trench contact portion 65. The present example describes points that differ from the example shown in FIG. 6B in particular, and other points may be the same. That is, FIG. 6C of the present example corresponds to the examples shown in FIGS. 4A and 5A.

The first contact hole portion 61 is provided without penetrating through the emitter region 12, and the lower end of the first contact hole portion 61 is shallower than the lower end of the emitter region 12. That is, the emitter region 12 is provided below the first contact hole portion 61. In addition, the plug contact region 19 is not provided below the first contact hole portion 61. Accordingly, the lower end of the metal layer filled in the first contact hole portion 61 is in contact with the emitter region 12.

Figure 6D:
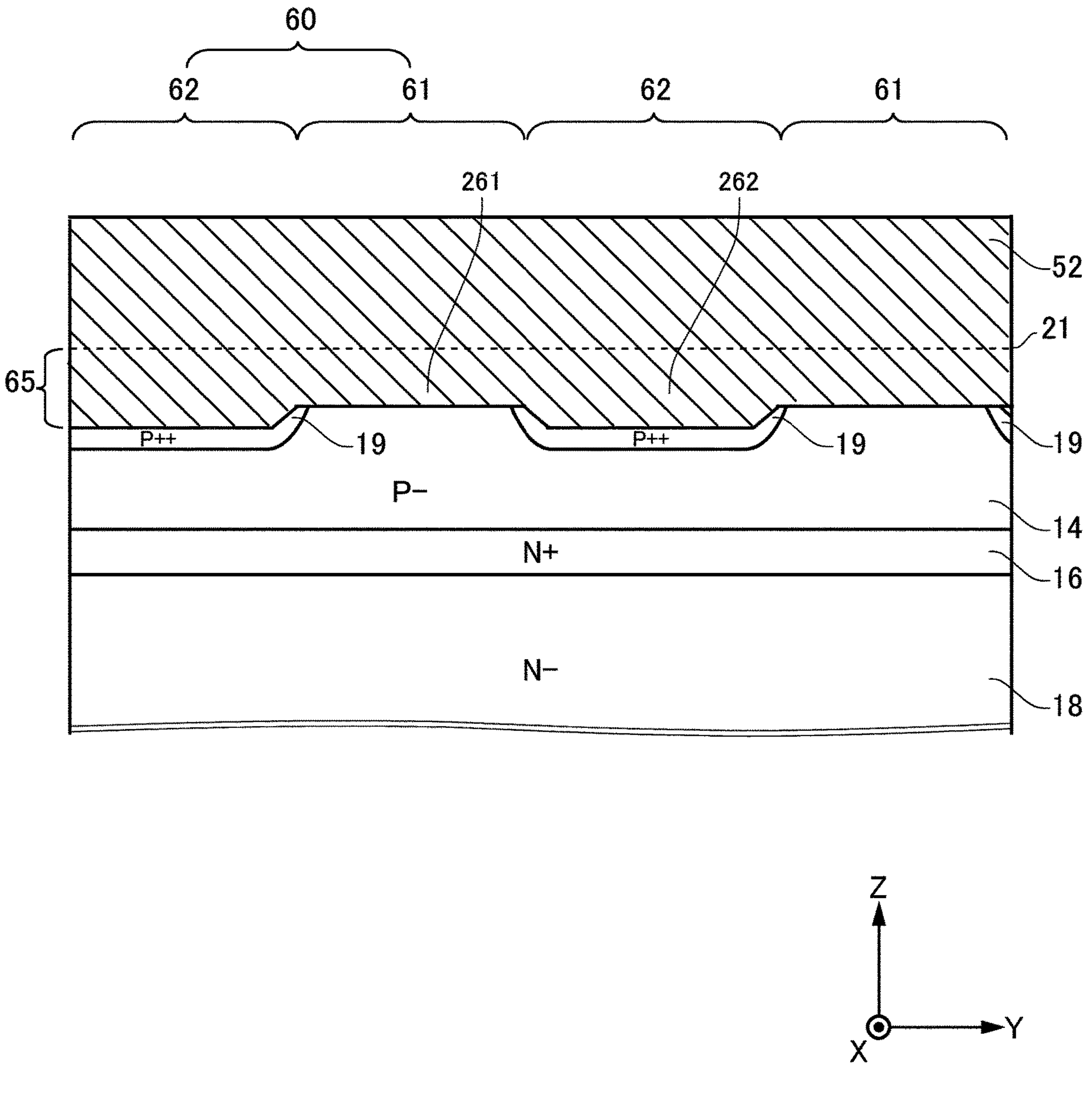
FIG. 6D shows a modified example of the semiconductor device 100.

FIG. 6D shows a modified example of the semiconductor device 100. The present figure shows the YZ plane that passes through the trench contact portion 65. The present example differs from the example shown in FIG. 6C in that although the plug contact region 19 is provided selectively below the trench contact portion 65, the trench contact portion 65 is provided so as to penetrate through the emitter region 12 and the contact region 15. The present example describes points that differ from the example shown in FIG. 6C in particular, and other points may be the same as those of the example shown in FIG. 6C. That is, FIG. 6D of the present example corresponds to the examples shown in FIGS. 3B and 5C.

The first contact hole portion 61 is provided so as to penetrate through the emitter region 12, and the lower end of the first contact hole portion 61 is deeper than the lower end of the emitter region 12. That is, the emitter region 12 is not provided below the first contact hole portion 61. The lower end of the metal layer filled in the first contact hole portion 61 is in contact with the base region 14.

The second contact hole portion 62 is provided so as to penetrate through the contact region 15, and the lower end of the second contact hole portion 62 is deeper than the lower end of the contact region 15. That is, the contact region 15 is not provided below the second contact hole portion 62.

The plug contact region 19 is not provided on the entire surface below the trench contact portion 65 and is provided in partial regions below the trench contact portion 65. The plug contact region 19 of the present example is provided below the second contact hole portion 62 and is not provided below the first contact hole portion 61. It is to be noted that a part of the plug contact region 19 may be provided below the first contact hole portion 61 by the diffusion. The lower end of the metal layer filled in the first contact hole portion 61 is in contact with the base region 14. It is to be noted that a part of the lower end of the metal layer filled in the first contact hole portion 61 may be in contact with the plug contact region 19.

Figure 6E:
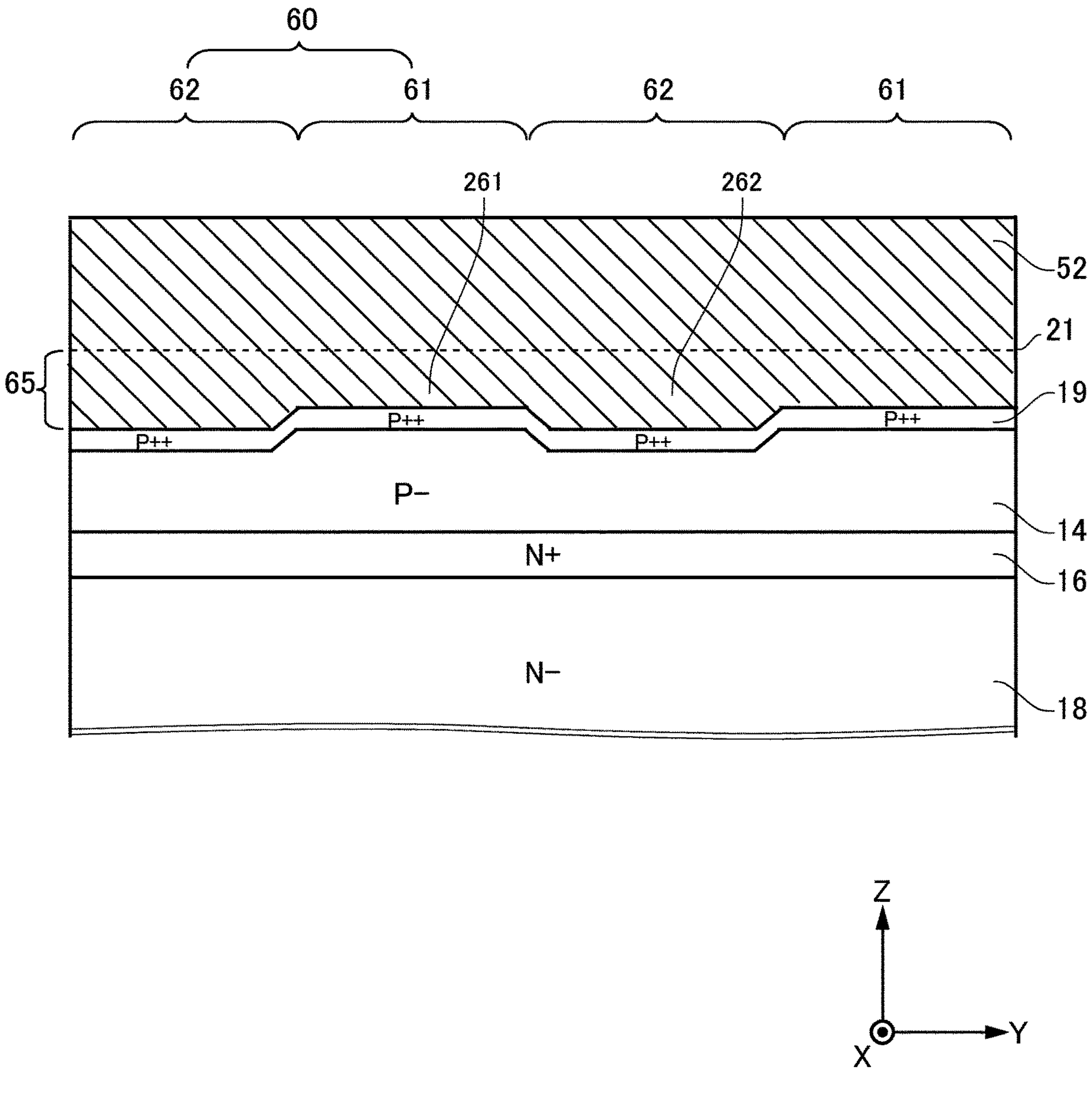
FIG. 6E shows a modified example of the semiconductor device 100.

FIG. 6E shows a modified example of the semiconductor device 100. The present figure shows the YZ plane that passes through the trench contact portion 65. The present example differs from the example shown in FIG. 6D in that although the trench contact portion 65 is provided so as to penetrate through the emitter region 12 and the contact region 15, the plug contact region 19 is provided on the entire surface below the trench contact portion 65. The present example describes points that differ from the example shown in FIG. 6D in particular, and other points may be the same as those of the example shown in FIG. 6D. That is, FIG. 6E of the present example corresponds to the examples shown in FIGS. 4E and 5C.

The plug contact region 19 of the present example is provided on the entire surface below the trench contact portion 65. That is, the plug contact region 19 is provided below both of the first contact hole portion 61 and the second contact hole portion 62.

Figure 6F:
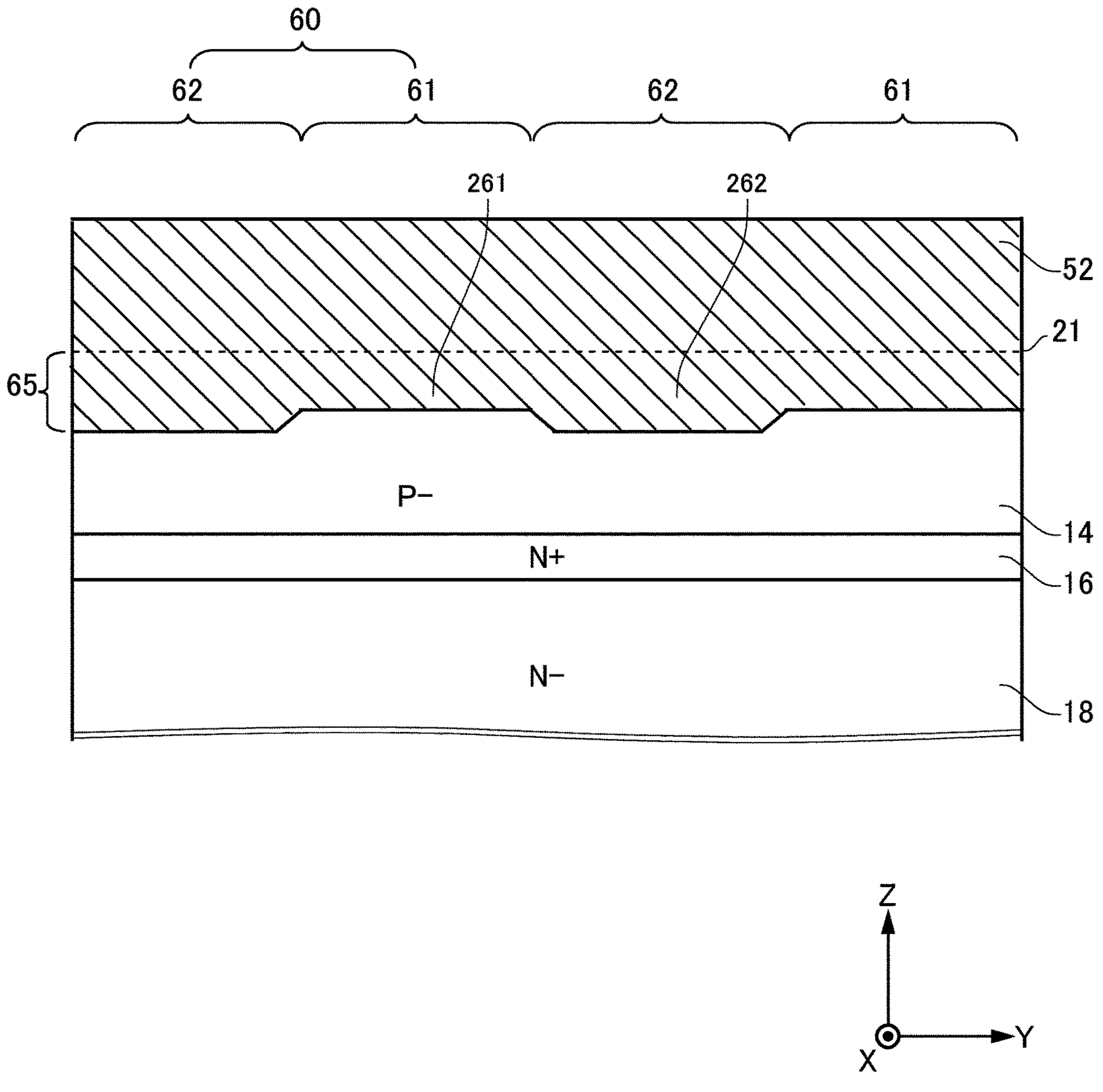
FIG. 6F shows a modified example of the semiconductor device 100.

FIG. 6F shows a modified example of the semiconductor device 100. The present figure shows the YZ plane that passes through the trench contact portion 65. The present example differs from the example shown in FIG. 6E in that although the trench contact portion 65 is provided so as to penetrate through the emitter region 12 and the contact region 15, the plug contact region 19 is not provided. The present example describes points that differ from the example shown in FIG. 6E in particular, and other points may be the same as those of the example shown in FIG. 6E. That is, FIG. 6F of the present example corresponds to the examples shown in FIGS. 3B and 5E.

The plug contact region 19 is not provided below the trench contact portion 65 of the present example. That is, the lower ends of the metal layers filled in the first contact hole portion 61 and the second contact hole portion 62 are in contact with the base region 14.

Figure 6G:
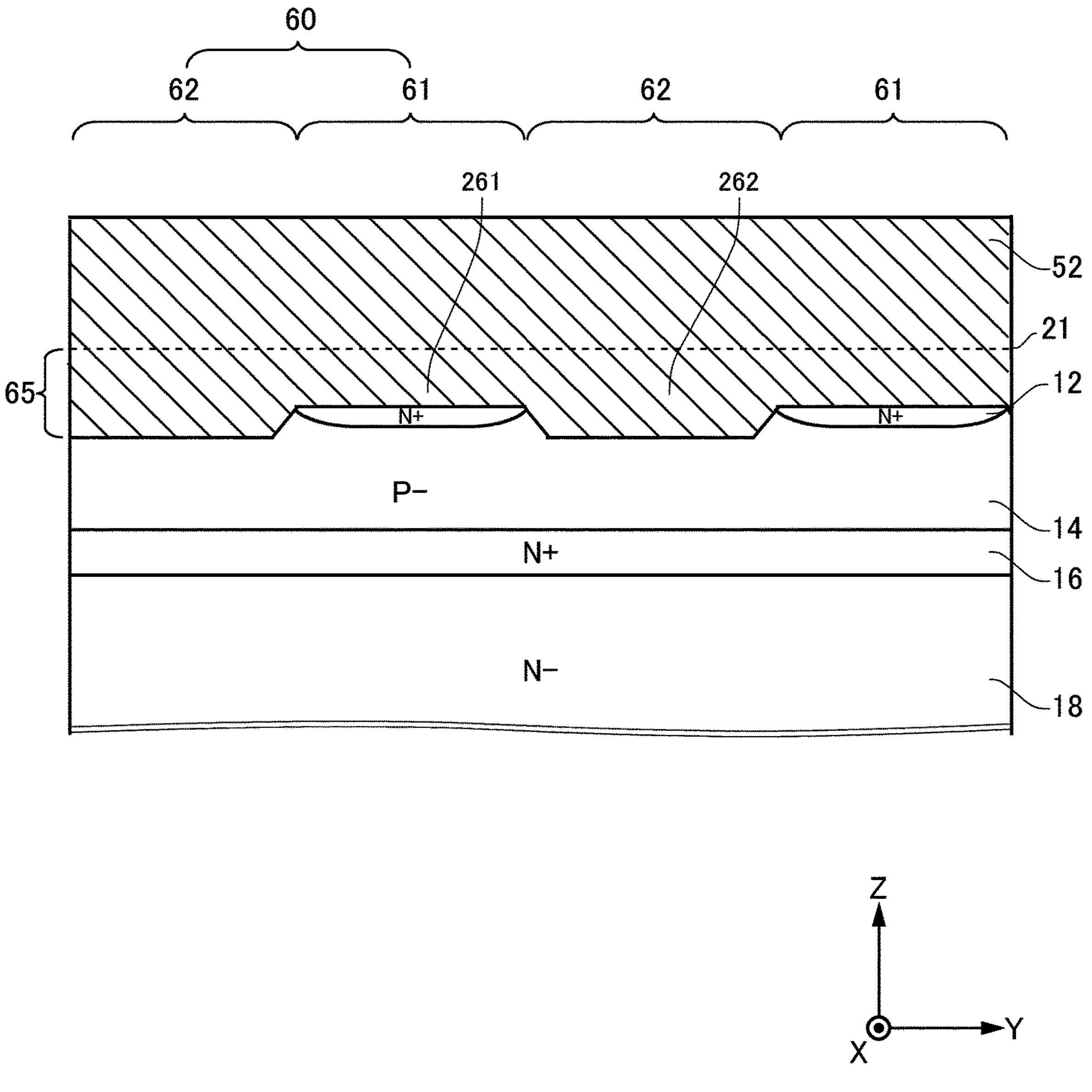
FIG. 6G shows a modified example of the semiconductor device 100.

FIG. 6G shows a modified example of the semiconductor device 100. The present figure shows the YZ plane that passes through the trench contact portion 65. The present example differs from the example shown in FIG. 6F in that although the plug contact region 19 is not provided, the trench contact portion 65 is provided without penetrating through the emitter region 12. The present example describes points that differ from the example shown in FIG. 6F in particular, and other points may be the same as those of the example shown in FIG. 6F. That is, FIG. 6G of the present example corresponds to the examples shown in FIGS. 4A and 5E.

The first contact hole portion 61 is provided without penetrating through the emitter region 12, and the lower end of the first contact hole portion 61 is shallower than the lower end of the emitter region 12. That is, the emitter region 12 is provided below the first contact hole portion 61.

The lower end of the second contact hole portion 62 may be deeper than the lower end of the emitter region 12. By performing mask etching such that the trench contact portion 65 is not integrally formed and only the second contact hole portion 62 becomes deep, the first contact hole portion 61 can be formed so as not to penetrate through the emitter region 12.

In this manner, even when a step is provided between the first contact hole portion 61 and the second contact hole portion 62, the semiconductor device 100 may have various structures regarding a relationship between the emitter region 12 and the contact region 15. Further, in the semiconductor device 100, the plug contact region 19 may be provided at the lower end of the contact hole 60 as appropriate.

Figure 7A:
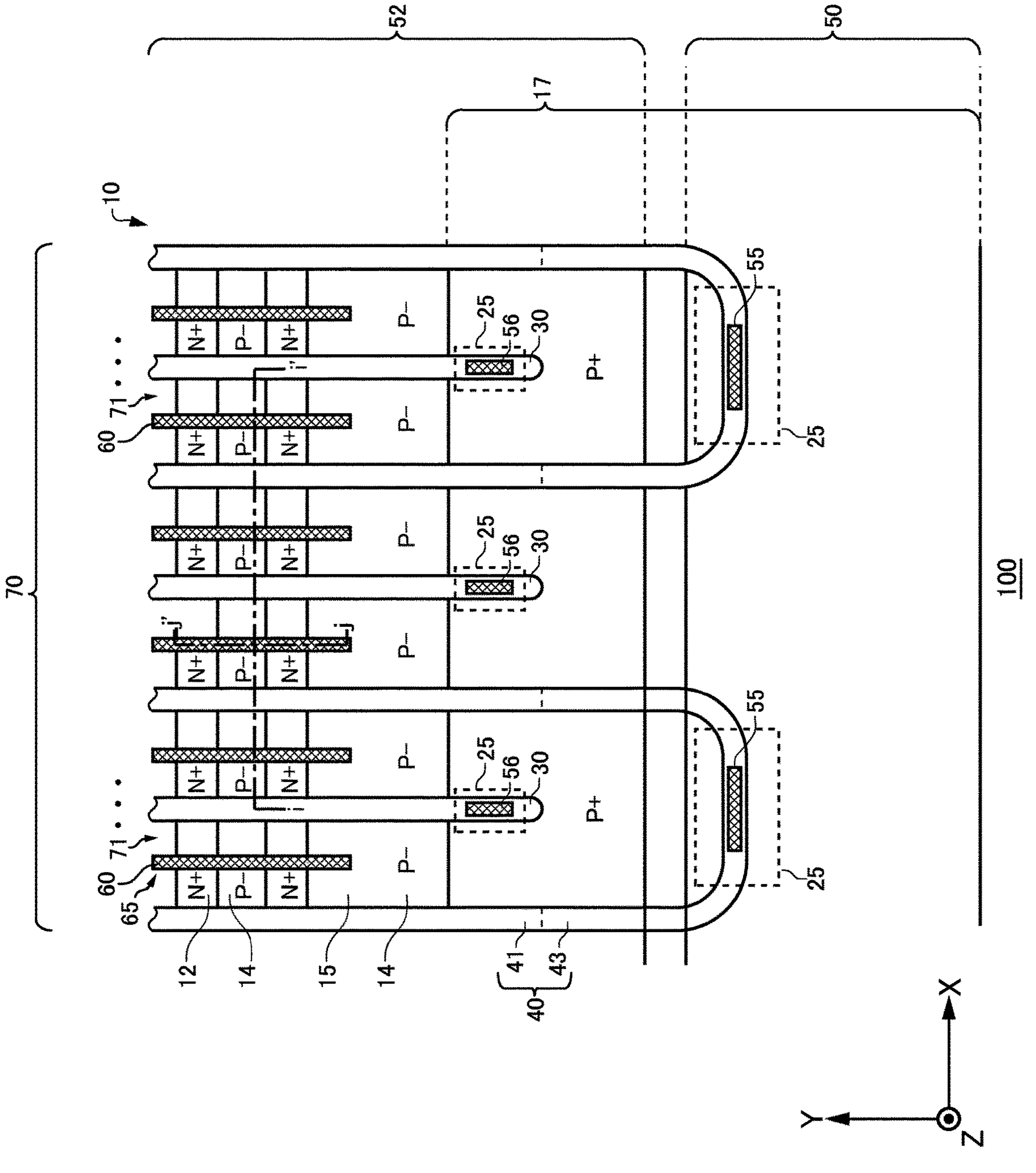
FIG. 7A shows a top view of a modified example of the semiconductor device 100.

FIG. 7A shows a top view of a modified example of the semiconductor device 100. The semiconductor device 100 of the present example differs from that of the example shown in FIG. 3A in the point of not including the contact region 15. That is, on the front surface of the mesa portion 71, the emitter region 12 and the base region 14 are provided alternately in the extending direction. In the semiconductor device 100 of the present example, the second conductivity type region is the base region 14.

Figure 7B:
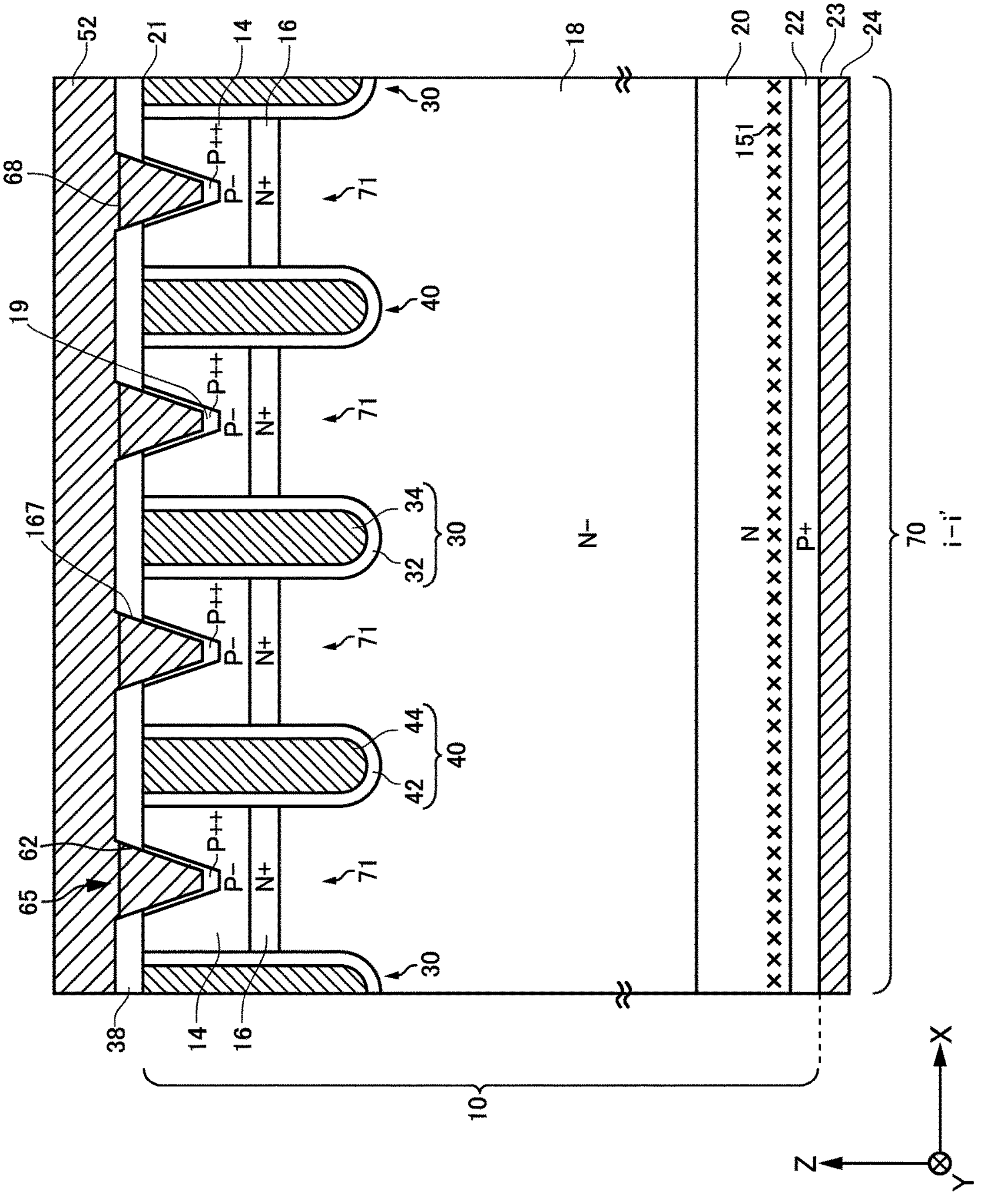
FIG. 7B shows an example of a cross section i-i' in FIG. 7A.

FIG. 7B shows an example of a cross section i-i' in FIG. 7A. The cross section i-i' is the XZ plane that passes through the base regions 14 in the transistor portion 70. The plug contact region 19 of the present example is formed on the entire surfaces of the bottom surface of the trench contact portion 65 and the side walls of the trench contact portion 65 opposing the semiconductor substrate 10.

Figure 7C:
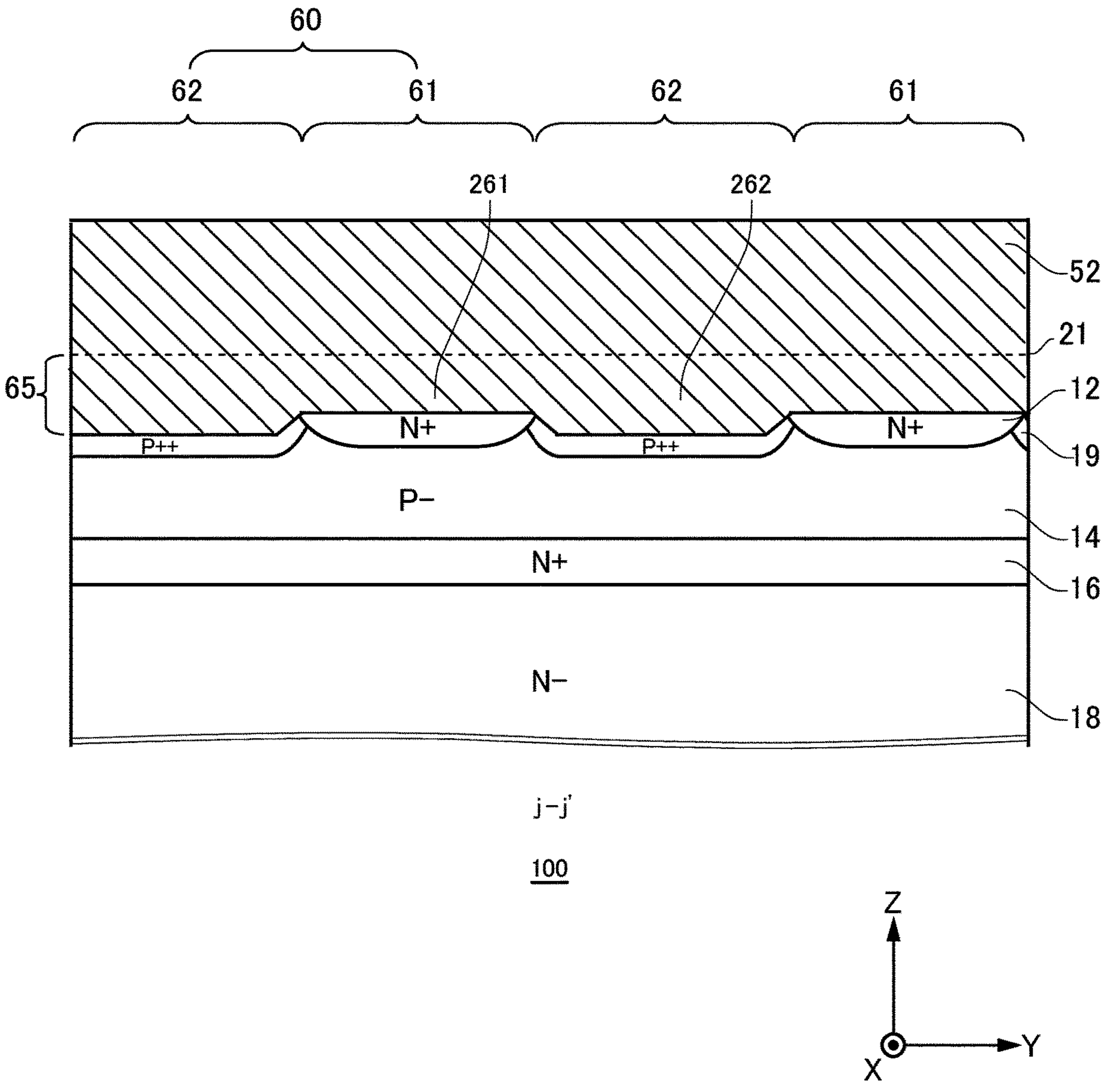
FIG. 7C shows an example of a cross section j-j' in FIG. 7A.

FIG. 7C shows an example of a cross section j-j' in FIG. 7A. The cross section j-j' is the YZ plane that passes through the trench contact portion 65 in the transistor portion 70. The trench contact portion 65 of the present example does not penetrate through the emitter region 12 in the depth direction.

The plug contact region 19 is not provided on the entire surface below the trench contact portion 65 and is provided in partial regions below the trench contact portion 65. The plug contact region 19 of the present example is provided below the second contact hole portion 62 and is not provided below the first contact hole portion 61. It is to be noted that a part of the plug contact region 19 may be provided below the first contact hole portion 61 by the diffusion.

Figure 7D:
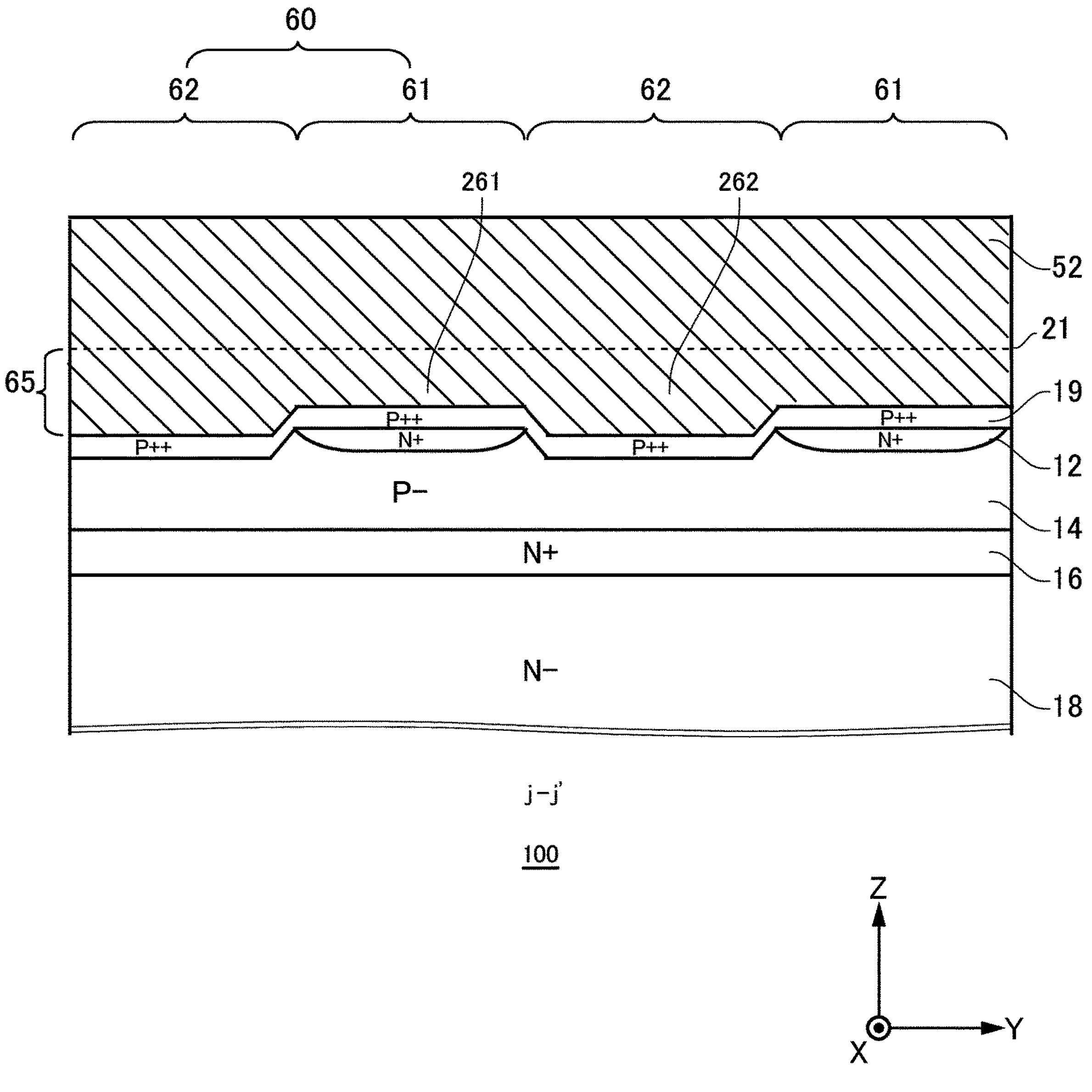
FIG. 7D shows a modified example of the cross section j-j' in FIG. 7A.

FIG. 7D shows a modified example of the cross section j-j' in FIG. 7A. The cross section j-j' is the YZ plane that passes through the trench contact portion 65 in the transistor portion 70. The present example differs from the example shown in FIG. 7C in that although the trench contact portion 65 is provided without penetrating through the emitter region 12, the plug contact region 19 is provided on the entire surface below the trench contact portion 65. The present example describes points that differ from the example shown in FIG. 7C in particular, and other points may be the same as those of the example shown in FIG. 7C.

The plug contact region 19 of the present example is provided on the entire surface below the trench contact portion 65. That is, the plug contact region 19 is provided below both of the first contact hole portion 61 and the second contact hole portion 62.

The lower end of the plug contact region 19 below the second contact hole portion 62 may be provided to be lower than the lower end of the emitter region 12. By providing the plug contact region 19 closer to the drift region 18 than the emitter region 12, the semiconductor device 100 can be operated.

Figure 7E:
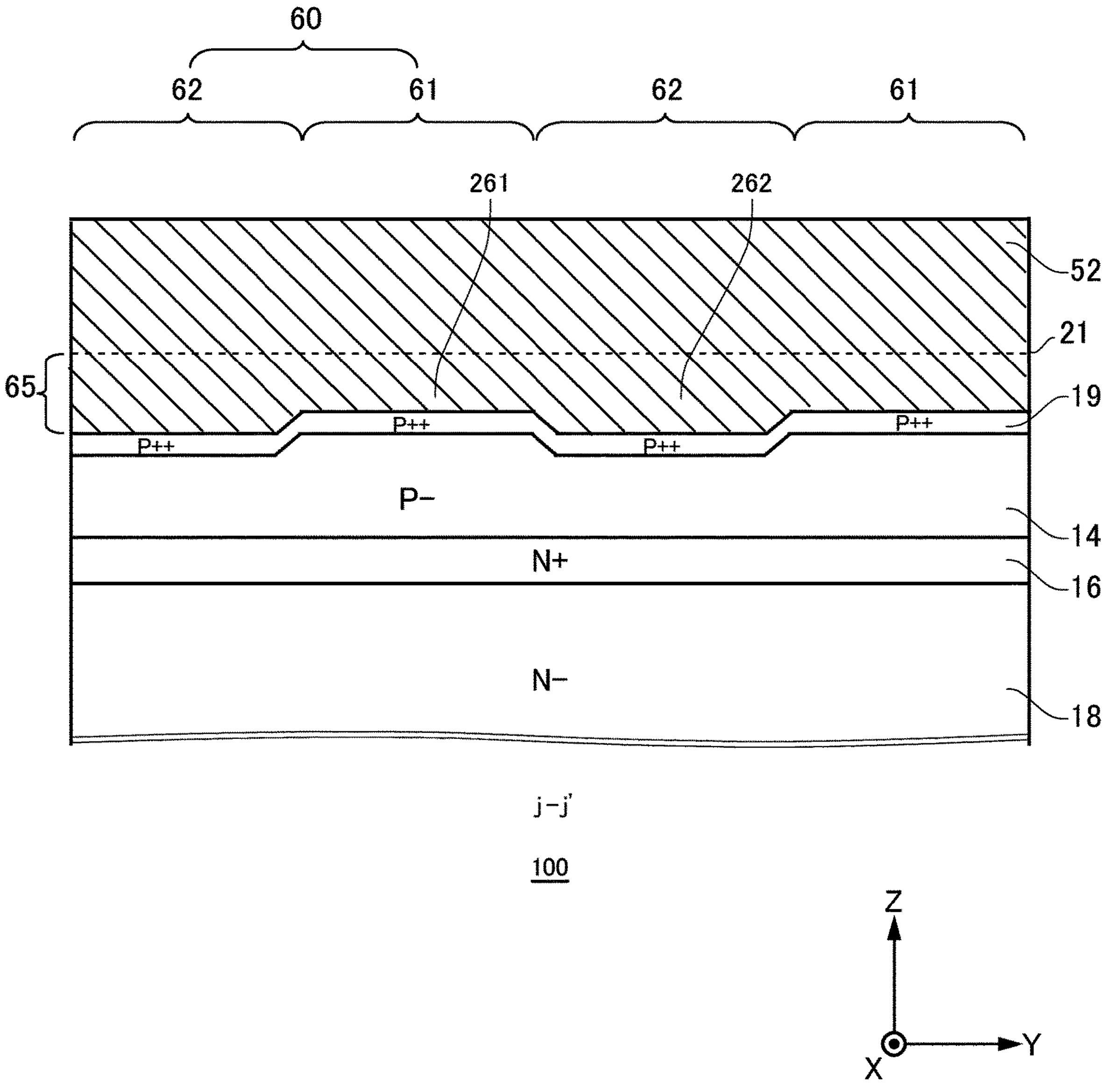
FIG. 7E shows a modified example of the cross section j-j' in FIG. 7A.

FIG. 7E shows a modified example of the cross section j-j' in FIG. 7A. The cross section j-j' is the YZ plane that passes through the trench contact portion 65 in the transistor portion 70. The present example differs from the example shown in FIG. 7D in that although the plug contact region 19 is provided on the entire surface below the trench contact portion 65, the trench contact portion 65 is provided so as to penetrate through the emitter region 12. The present example describes points that differ from the example shown in FIG. 7D in particular, and other points may be the same as those of the example shown in FIG. 7D.

The first contact hole portion 61 is provided so as to penetrate through the emitter region 12, and the lower end of the first contact hole portion 61 is deeper than the lower end of the emitter region 12. That is, the emitter region 12 is not provided below the first contact hole portion 61.

As described with reference to FIGS. 7A to 7E, even when the contact region 15 is not provided, by providing the lower end of the plug contact region 19 to be lower than the lower end of the emitter region 12, the semiconductor device 100 can be operated.

As described above, the semiconductor device 100 may include the second conductivity type region, and the second conductivity type region may at least be either one of the contact region 15 or the base region 14.

Figure 8A:
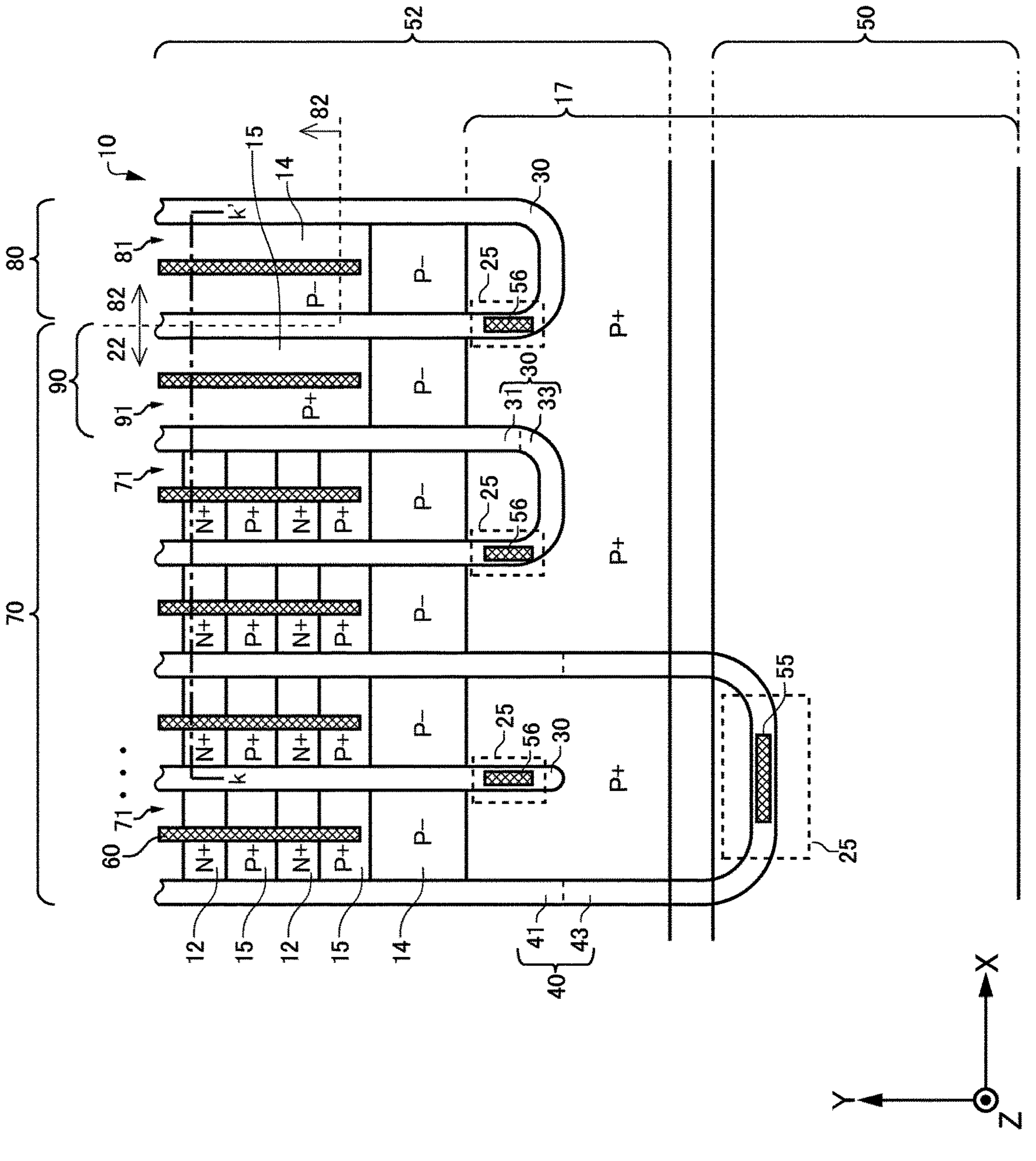
FIG. 8A shows a top view of a modified example of the semiconductor device 100.

FIG. 8A shows a top view of a modified example of the semiconductor device 100. The semiconductor device 100 of the present example includes the transistor portion 70 and a diode portion 80. For example, the semiconductor device 100 is a reverse conducting IGBT (RC-IGBT). The transistor portion 70 of the present example includes a boundary portion 90 that is positioned at a boundary between the transistor portion 70 and the diode portion 80.

The diode portion 80 is a region obtained by projecting the cathode region 82 provided on the back surface side of the semiconductor substrate 10 onto the upper surface of the semiconductor substrate 10. The cathode region 82 is of the first conductivity type. As an example, the cathode region 82 of the present example is of the N+ type. The diode portion 80 includes diodes such as free wheel diodes (FWDs) provided adjacent to the transistor portion 70 on the upper surface of the semiconductor substrate 10.

The boundary portion 90 is a region that is provided in the transistor portion 70 and is in direct contact with the diode portion 80. The boundary portion 90 includes the contact region 15. The boundary portion 90 of the present example does not include the emitter region 12. In one example, the trench portions in the boundary portion 90 are the dummy trench portions 30. The boundary portion 90 of the present example is arranged such that both ends thereof in the X axis direction become the dummy trench portions 30.

The contact hole 60 is provided above the base region 14 in the diode portion 80. The contact hole 60 is provided above the contact region 15 in the boundary portion 90. No contact hole 60 is provided above the well regions 17 provided at both ends in the Y axis direction.

A mesa portion 91 is provided in the boundary portion 90. The mesa portion 91 includes the contact region 15 on the front surface 21 of the semiconductor substrate 10. The mesa portion 91 of the present example includes the base region 14 and the well region 17 on a negative side of the Y axis direction.

A mesa portion 81 is provided in a region sandwiched between the dummy trench portions 30 adjacent to each other in the diode portion 80. The mesa portion 81 includes the base region 14 on the front surface 21 of the semiconductor substrate 10. The mesa portion 81 of the present example includes the base region 14 and the well region 17 on the negative side of the Y axis direction.

The emitter region 12 is provided in the mesa portion 71, but does not need to be provided in the mesa portion 81 and the mesa portion 91. The contact region 15 is provided in the mesa portion 71 and the mesa portion 91, but does not need to be provided in the mesa portion 81.

Figure 8B:
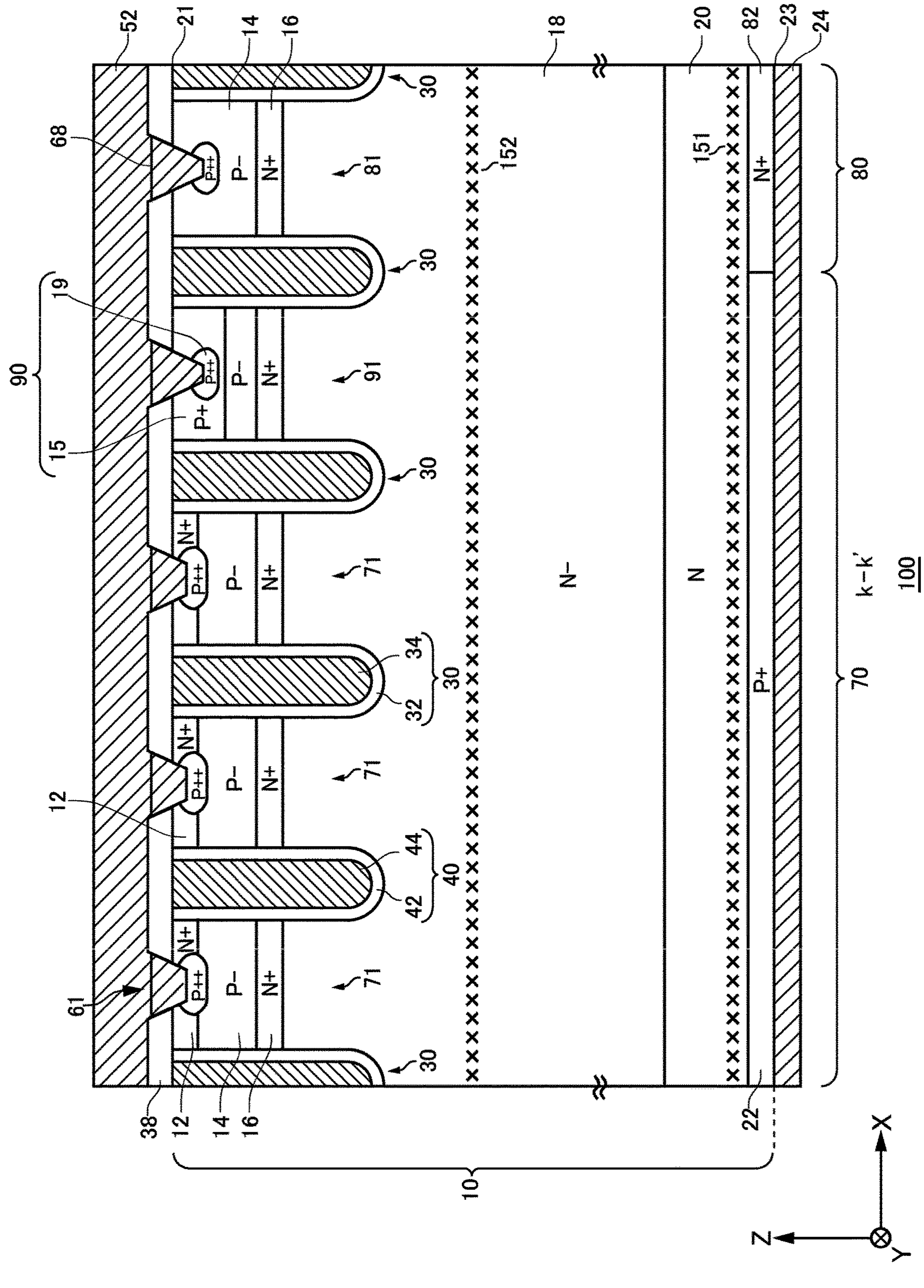
FIG. 8B shows the cross section g-g' of the modified example of the semiconductor device 100.

FIG. 8B shows a cross section k-k' of a modified example of the semiconductor device 100. The semiconductor device 100 of the present example includes the first lifetime control region 151 and a second lifetime control region 152.

The contact region 15 is provided above the base region 14 in the mesa portion 91. The contact region 15 is provided in contact with the dummy trench portion 30 in the mesa portion 91. In another cross section, the contact region 15 may be provided on the front surface 21 of the mesa portion 71.

The accumulation region 16 is provided in the transistor portion 70 and the diode portion 80. The accumulation region 16 of the present example is provided on entire surfaces of the transistor portion 70 and the diode portion 80. It is to be noted that the accumulation region 16 does not need to be provided in the diode portion 80.

The cathode region 82 is provided below the buffer region 20 in the diode portion 80. A boundary between the collector region 22 and the cathode region 82 is a boundary between the transistor portion 70 and the diode portion 80. That is, the collector region 22 is provided below the boundary portion 90 of the present example.

The first lifetime control region 151 is provided in both of the transistor portion 70 and the diode portion 80. Accordingly, in the semiconductor device 100 of the present example, a recovery speed in the diode portion 80 can be raised, and a switching loss can be further improved. The first lifetime control region 151 may be formed by a method similar to that of the first lifetime control region 151 in other examples.

The second lifetime control region 152 is provided closer to the front surface 21 than the center of the semiconductor substrate 10 in the depth direction of the semiconductor substrate 10. The second lifetime control region 152 of the present example is provided in the drift region 18. The second lifetime control region 152 is provided in both of the transistor portion 70 and the diode portion 80. The second lifetime control region 152 may be formed by implanting an impurity from the front surface 21 side, or may be formed by implanting an impurity from the back surface 23 side. The second lifetime control region 152 may be provided in the diode portion 80 and the boundary portion 90 and not be provided in a part of the transistor portion 70.

The second lifetime control region 152 may be formed by any method among the methods for forming the first lifetime control region 151. Elements, dosage amounts, and the like for forming the first lifetime control region 151 and the second lifetime control region 152 may be the same or may be different.

Also in the present example, the first contact hole portion 61 and the second contact hole portion 62 may be provided in the transistor portion 70 as have been provided in the transistor portion 70 of other examples. Since the diode portion 80 of the present example does not include the emitter region 12 and the contact region 15, the first contact hole portion 61 and the second contact hole portion 62 do not need to be provided therein. It is to be noted that when materials having different etching rates are formed in the diode portion 80, the first contact hole portion 61 and the second contact hole portion 62 may be formed. In the present example, the first contact hole portion 61 and the second contact hole portion 62 correspond to those of the examples shown in FIGS. 4C and 5A.

Figure 9A:
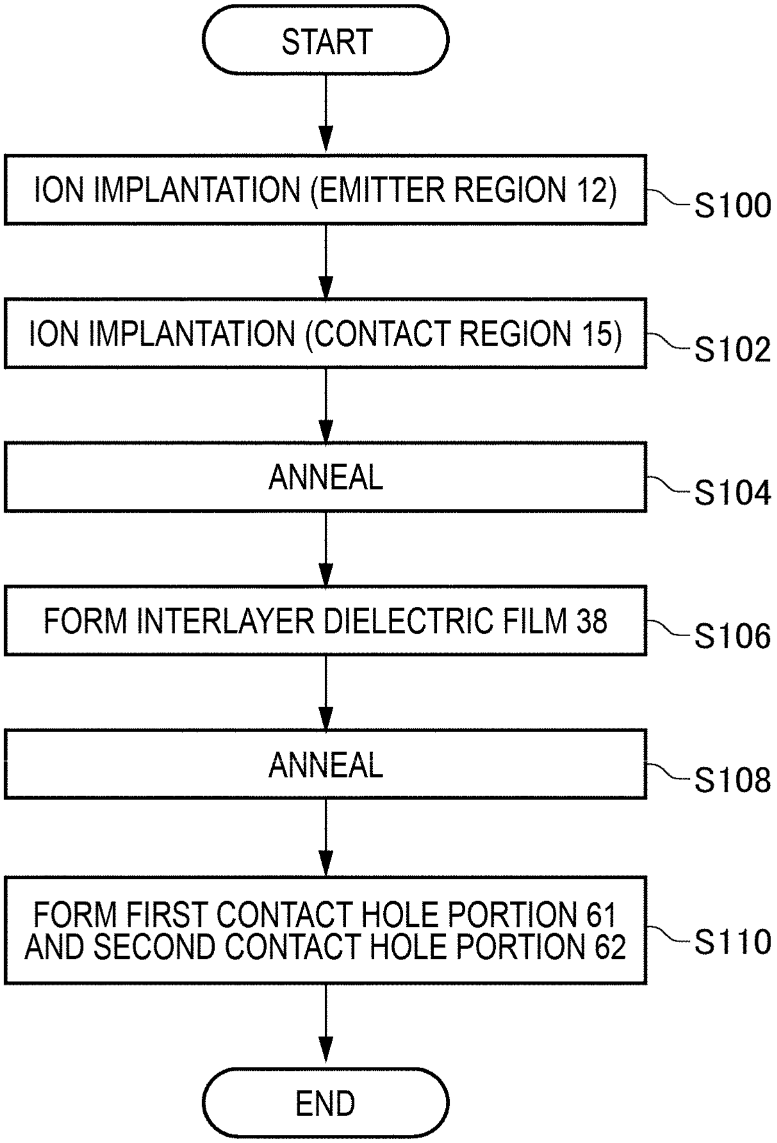
FIG. 9A is a flowchart showing an example of a method of manufacturing the semiconductor device 100.

FIG. 9A is a flowchart showing an example of a method of manufacturing the semiconductor device 100. In Step S100, ion implantation is performed in the semiconductor substrate 10 for forming the emitter region 12. The emitter region 12 may be formed by performing ion implantation using an N type dopant such as arsenic or phosphorus. For example, the doping concentration of the emitter region 12 is 1 E19/cm$^3$ or more and 1 E20/cm$^3$ or less. In Step S100, ion implantation of the dopant may be performed using a resist mask formed in a predetermined pattern, for example. In Step S102, ion implantation is performed in the semiconductor substrate 10 for forming the contact region 15. The contact region 15 may be formed by performing ion implantation using a dopant such as boron. For example, the doping concentration of the contact region 15 is 1 E18/cm$^3$ or more and 1 E19/cm$^3$ or less. In Step S102, ion implantation of the P type dopant may be performed using a resist mask formed in a predetermined pattern, for example. In Step S104, the semiconductor substrate 10 is annealed for forming the emitter region 12 and the contact region 15. An annealing temperature in Step S104 is, for example, 900° C. or more and 1000° C. or less.

In Step S106, the interlayer dielectric film 38 is formed above the semiconductor substrate 10 by deposition using a low-pressure CVD or the like. The interlayer dielectric film 38 may be a BPSG, a PSG, an HTO, or a composite film of these. In Step S108, the interlayer dielectric film 38 is annealed. The annealing temperature in Step S108 is, for example, 900° C. or more and 950° C. or less.

In Step S110, the interlayer dielectric film 38 is etched in a predetermined pattern so as to form the first contact hole portion 61 and the second contact hole portion 62. In the present example, a mask such as a photoresist may be formed above the interlayer dielectric film 38 for forming the contact hole 60 in the interlayer dielectric film 38. In Step S110 of the present example, the etching for forming the first contact hole portion 61 and the etching for forming the second contact hole portion 62 are executed in the same etching process. That is, the first contact hole portion 61 and the second contact hole portion 62 may be formed using the same mask.

In Step S110, etching is continued only for a predetermined time even after the front surface of the semiconductor substrate 10 is exposed by the etching of the interlayer dielectric film 38, so as to etch the exposed front surface of the semiconductor substrate 10 (over-etching). In this case, reactive etching using chlorine gas or the like is used for the etching of the interlayer dielectric film 38, so that a difference in the etching rates between the emitter region 12 and the contact region 15 is likely to appear. Since the etching rate of the contact region 15 is higher than the etching rate of the emitter region 12, the second contact hole portion 62 is likely to be formed deeper than the first contact hole portion 61.

In the present example, for forming the emitter region 12 and the contact region 15, the first contact hole portion 61 and the second contact hole portion 62 are formed after Step S104 of annealing the semiconductor substrate 10. By performing annealing in advance in Step S104 for forming the emitter region 12 and the contact region 15, a difference in the etching rates between the emitter region 12 and the contact region 15 is likely to appear. Accordingly, a step (dip) is likely to be formed between the lower end of the first contact hole portion 61 and the lower end of the second contact hole portion 62.

In Step S110, the trench contact portion 65 may be formed by the over-etching of the interlayer dielectric film 38, or may be formed by further performing additional etching using the interlayer dielectric film 38 as a mask.

Figure 9B:
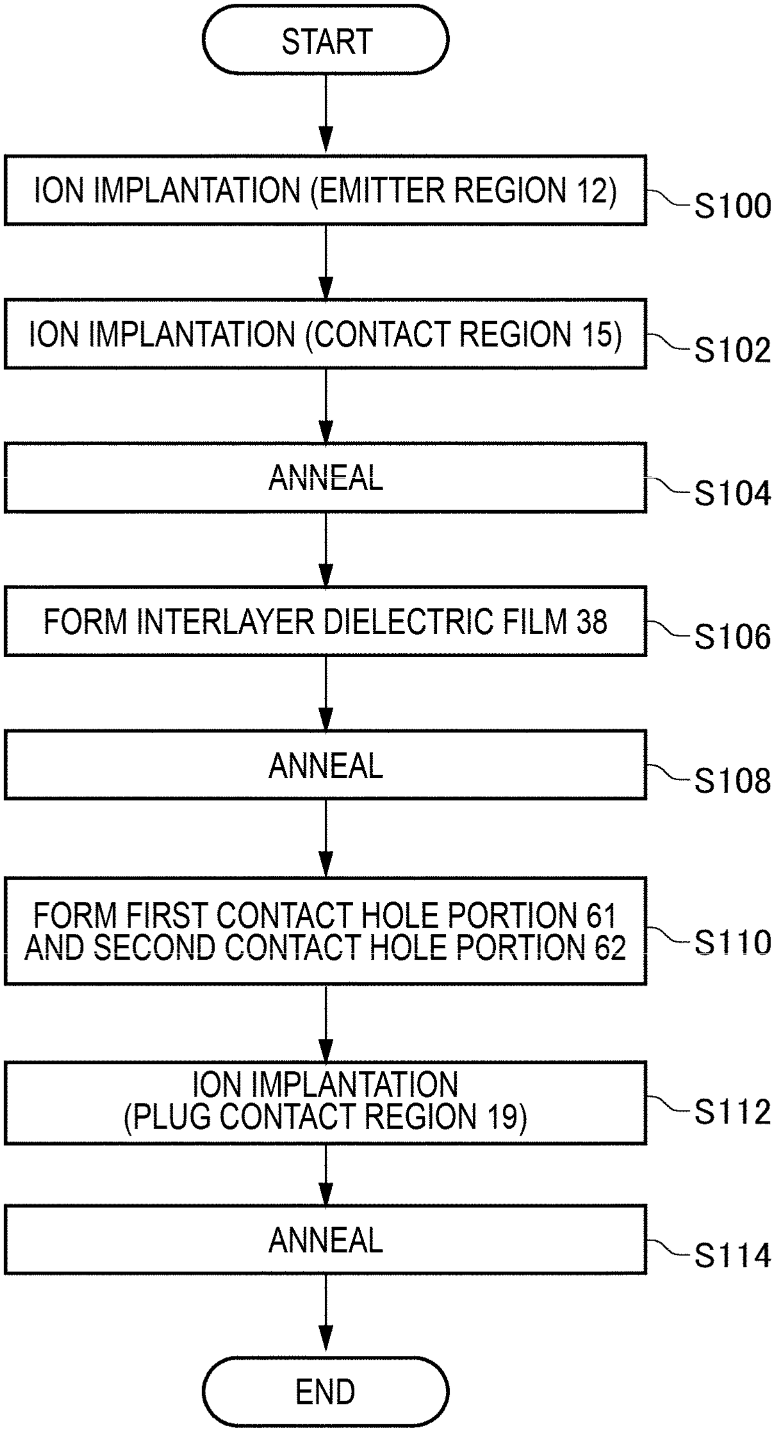
FIG. 9B is a flowchart showing a modified example of the method of manufacturing the semiconductor device 100.

FIG. 9B is a flowchart showing a modified example of the method of manufacturing the semiconductor device 100. The present figure shows a method of manufacturing the semiconductor device 100 including the trench contact portion 65 and the plug contact region 19. The present example describes points different from those of the method of manufacturing shown in FIG. 9A in particular. Steps S100 to S108 may be the same as those of the method of manufacturing shown in FIG. 9A.

In Step S110, the first contact hole portion 61 and the second contact hole portion 62 are formed. In the present example, for forming the trench contact portion 65 in the semiconductor substrate 10, the contact hole 60 is formed past the front surface 21 in the depth direction of the semiconductor substrate 10. In Step S112, ion implantation is executed for forming the plug contact region 19. In Step S112, ion implantation may be performed in the first contact hole portion 61 and the second contact hole portion 62 as the opening portion of the interlayer dielectric film 38 using the interlayer dielectric film 38 as a mask, and further, ion implantation may be performed selectively in the first contact hole portion 61 and the second contact hole portion 62 using a resist mask formed in a predetermined pattern. In Step S114, the semiconductor substrate 10 is annealed for forming the plug contact region 19.

It is to be noted that although the first contact hole portion 61 and the second contact hole portion 62 are formed in the same etching process in the present example, different etching processes may be used to form steps. That is, the first contact hole portion 61 and the second contact hole portion 62 may respectively be formed by etchings that use different masks. In this case, the first contact hole portion 61 and the second contact hole portion 62 may be etched under different etching conditions. It is to be noted that the formation of the plug metal layer 68 may be performed after Step S114.

Although the transistor portion is an IGBT in the present example, the transistor portion may be a MOSFET as described above. By a configuration similar to that of the present example, even in an avalanche breakdown mode in which a high current flows, for example, generated holes as minority carriers can be efficiently collected in the trench contact portion 65, and thus an avalanche withstand capability is improved.

While the embodiments of the present invention have been described, the technical scope of the present invention is not limited to the above described embodiments. It is apparent to persons skilled in the art that various alterations and improvements can be added to the above described embodiments. It is also apparent from the description of the claims that the embodiments to which such alterations or improvements are made can be included in the technical scope of the present invention.

The operations, procedures, steps, and stages of each process performed by an apparatus, system, program, and method shown in the claims, specification, or drawings can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

EXPLANATION OF REFERENCES 10 semiconductor substrate
12 emitter region
14 base region
15 contact region
16 accumulation region
17 well region
18 drift region
19 plug contact region
20 buffer region
21 front surface
22 collector region
23 back surface
24 collector electrode
25 connection portion
30 dummy trench portion
32 dummy dielectric film
34 dummy conductive portion
38 interlayer dielectric film
39 opening portion
40 gate trench portion
41 extending portion
42 gate dielectric film
43 connecting portion
44 gate conductive portion
50 gate metal layer
52 emitter electrode
55 contact hole
56 contact hole
60 contact hole
61 first contact hole portion
62 second contact hole portion
65 trench contact portion
68 plug metal layer
70 transistor portion
71 mesa portion
80 diode portion
81 mesa portion
82 cathode region
90 boundary portion
91 mesa portion
100 semiconductor device
151 first lifetime control region
152 second lifetime control region
161 dip
162 dip
166 edge portion
167 edge portion
261 dip
262 dip.

What is claimed is:

1. A semiconductor device comprising:
- a drift region of a first conductivity type, which is provided in a semiconductor substrate;
- a base region of a second conductivity type, which is provided above the drift region;
- a plurality of emitter regions of the first conductivity type, which is provided above the base region;
- second conductivity type regions of the second conductivity type, which are provided above the drift region;
- a plurality of trench portions extending in a predetermined extending direction on a side of a front surface of the semiconductor substrate;

an interlayer dielectric film which is provided above the semiconductor substrate, the interlayer dielectric film being penetrated by one or more contact holes each being provided so as to extend in the extending direction, each of the one or more contact holes including a plurality of first contact hole portions and a plurality of second contact hole portions, wherein the second conductivity type regions and the plurality of emitter regions are provided alternately in the extending direction, the plurality of first contact hole portions are provided alternately with the plurality of second contact hole portions in the extending direction, a lower end of each of the plurality of first contact hole portions is provided at a different depth from a lower end of each of the plurality of second contact hole portions, each of the plurality of emitter regions is provided below a corresponding one of the plurality of first contact hole portions, each of the second conductivity type regions is provided below a corresponding one of the plurality of second contact hole portions, the second conductivity type regions have a doping concentration, and the base region has a doping concentration; and a plug contact region of the second conductivity type, which is provided below each of the plurality of second contact hole portions and has a doping concentration that is higher than the doping concentration of the base region and has a doping concentration that is higher than the doping concentration of the second conductivity type regions.

2. The semiconductor device according to claim 1, wherein the plurality of first contact hole portions and the plurality of second contact hole portions are provided alternately such that, in the extending direction, each of the plurality of first contact hole portions is provided at a position corresponding to a corresponding one of the plurality of emitter regions and each of the plurality of second contact hole portions is provided at a position corresponding to a corresponding one of the second conductivity type regions.

3. The semiconductor device according to claim 1, wherein a first contact hole portion of the plurality of first contact hole portions and a second contact hole portion of the plurality of second contact hole portions are provided in a same contact hole.

4. The semiconductor device according to claim 1, wherein the lower end of the plurality of first contact hole portions is shallower than the lower end of the plurality of second contact hole portions.

5. The semiconductor device according to claim 1, wherein a difference between the lower end of the plurality of first contact hole portions and the lower end of the plurality of second contact hole portions is 0.03 μm or more.

6. The semiconductor device according to claim 1, wherein the second conductivity type regions are contact regions of the second conductivity type, each of the contact regions being provided below a corresponding second contact hole portion of the plurality of second contact hole portions, and a thickness of each of the contact regions below the corresponding second contact hole portion is 0.3 μm or more and 1.0 μm or less.

7. The semiconductor device according to claim 1, comprising:

a trench contact portion provided between two adjacent trench portions out of the plurality of trench portions on the side of the front surface of the semiconductor substrate, wherein the trench contact portion is formed at least in part in a corresponding contact hole of the one or more contact holes.

8. The semiconductor device according to claim 7, comprising:

a first metal layer filled in the plurality of first contact hole portions and the plurality of second contact hole portions, wherein the base region is provided below the first metal layer.

9. The semiconductor device according to claim 7, comprising:

a first metal layer filled in the plurality of first contact hole portions and the plurality of second contact hole portions, wherein a lower end of the first metal layer filling the plurality of first contact hole portions is in contact with the plurality of emitter regions.

10. The semiconductor device according to claim 7, wherein a ratio α of a difference between the lower end of the plurality of first contact hole portions and the lower end of the plurality of second contact hole portions in a depth direction of the semiconductor substrate to a depth from the front surface of the semiconductor substrate to the lower end of the plurality of first contact hole portions is 0.01 or more and 1.0 or less.

11. The semiconductor device according to claim 7, wherein, the plug contact region of the second conductivity type is provided below the trench contact portion and above the second conductivity type regions, and wherein a width of the plug contact region in an array direction of the plurality of trench portions is larger than a width of a bottom surface of the trench contact portion.

12. The semiconductor device according to claim 11, wherein the plug contact region is provided below the plurality of second contact hole portions and is not provided below the first contact hole portions.

13. The semiconductor device according to claim 11, wherein the second conductivity type regions are contact regions of the second conductivity type, which have a higher doping concentration than the base region, and the contact regions are provided below the plurality of second contact hole portions.

14. The semiconductor device according to claim 13, wherein the contact regions are provided to be lower than the plug contact region.

15. The semiconductor device according to claim 7, wherein the plurality of second conductivity type regions is a plurality of contact regions of the second conductivity type, which have a higher doping concentration than the doping concentration of the base region, and a lower end of the contact regions is shallower than the lower end of the trench contact portion extending through the plurality of second contact hole portions.

16. The semiconductor device according to claim 7, wherein the second conductivity type regions are contact regions of the second conductivity type, each of the second conductivity type regions being provided in a region adjacent one of the plurality of emitter regions or between a pair of the plurality of emitter regions, and a lower end of the contact regions is deeper than the lower end of the plurality of first contact hole portions.

17. The semiconductor device according to claim 7, wherein the plug contact region is provided below the plurality of second contact hole portions, and wherein a lower end of the plurality of emitter regions is deeper than a lower end of the plug contact region.

18. The semiconductor device according to claim 1, wherein a width of the plurality of first contact hole portions in an array direction of the plurality of trench portions is smaller than a width of the plurality of second contact hole portions in the array direction.

19. The semiconductor device according to claim 1, comprising:

a transistor portion and a diode portion.

20. The semiconductor device according to claim 9, wherein the lower end of the trench contact portion extending through the plurality of first contact hole portions is deeper than a lower end of the emitter regions.

21. The semiconductor device according to claim 1, wherein the plug contact region is provided between the lower end of each of the plurality of second contact hole portions and the base region, the lower end of each of the plurality of first contact hole portions is shallower than a lower end of a corresponding one of the plurality of emitter regions, and the plurality of emitter regions are not provided between the lower end of the plurality of second contact hole portions and the base region.

22. The semiconductor device according to claim 1, wherein the lower end of the plurality of first contact hole portions has a depth from the front surface of the semiconductor substrate, a lower end of the plurality of emitter regions has a depth from the front surface of the semiconductor substrate, the plug contact region is provided at a depth from the front surface of the semiconductor substrate that is between the depth of the lower end of the plurality of first contact hole portions and the depth of the lower end of the plurality of emitter regions, and the lower end of the plurality of first contact hole portions is shallower than the lower end of plurality of the emitter regions.

23. The semiconductor device according to claim 1, wherein a lower end of the plurality of emitter regions is shallower than a lower end of the plug contact region.

24. The semiconductor device according to claim 1, wherein the lower end of the plurality of second contact hole portions are deeper than a lower end of the plurality of emitter regions.

* * * * *